United States Patent
Kato et al.

(10) Patent No.: US 9,150,670 B2
(45) Date of Patent: *Oct. 6, 2015

(54) NEAR-INFRARED ABSORPTIVE DYE-CONTAINING CURABLE COMPOSITION, INK COMPOSITION AND METHOD OF PRODUCING NEAR-INFRARED ABSORPTIVE FILTER

(75) Inventors: Shunya Kato, Minami-ashigara (JP); Yoshihiro Jimbo, Fujinomiya (JP)

(73) Assignee: FUJIFILM Corporation, Tokyo (JP)

(*) Notice: Subject to any disclaimer, the term of this patent is extended or adjusted under 35 U.S.C. 154(b) by 342 days.
This patent is subject to a terminal disclaimer.

(21) Appl. No.: 12/888,639

(22) Filed: Sep. 23, 2010

(65) Prior Publication Data

US 2011/0070407 A1 Mar. 24, 2011

(30) Foreign Application Priority Data

Sep. 24, 2009 (JP) ................ 2009-219678

(51) Int. Cl.
*C08F 2/46* (2006.01)
*C08F 2/50* (2006.01)
(Continued)

(52) U.S. Cl.
CPC ... *C08F 2/46* (2013.01); *C08F 2/50* (2013.01); *C09B 23/0058* (2013.01);
(Continued)

(58) Field of Classification Search
CPC ..... C08F 2/46; C08F 2/50; Y10T 248/24612; C08K 5/55; G03F 7/0007; G03F 7/029; G03F 7/031; G03F 7/105; C09B 23/0058; C09B 57/004
USPC .......... 428/172; 548/110; 524/701; 427/487, 427/385.5, 256; 430/320; 522/1–189
See application file for complete search history.

(56) References Cited

U.S. PATENT DOCUMENTS

2007/0238802 A1* 10/2007 Harada et al. ............. 522/75
2008/0081912 A1* 4/2008 Harada et al. ............. 546/276.7

FOREIGN PATENT DOCUMENTS

JP 7-164729 A 6/1995
JP 8-143853 A 6/1996
(Continued)

OTHER PUBLICATIONS

Fischer et al. "Near-Infrared Dyes and Fluorophores Based on Diketopyrrolopyrroles", Angew. Chem. Int. Ed. 2007, 46, p. 3750-3753. 2007 Wiley-VCH Verlag GmbH & Co. KGaA, Weinheim.*
(Continued)

*Primary Examiner* — Michael Pepitone
*Assistant Examiner* — Jessica Roswell
(74) *Attorney, Agent, or Firm* — Buchanan, Ingersoll & Rooney PC

(57) ABSTRACT

A curable composition, containing a near-infrared absorptive dye represented by formula (1):

Formula (1)

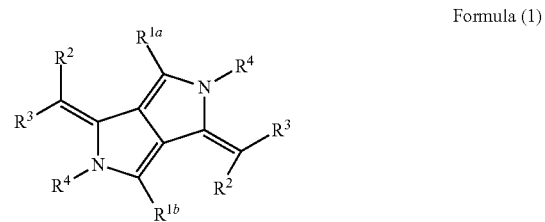

wherein $R^{1a}$ and $R^{1b}$ may be the same or different, and each independently represent an alkyl group, an aryl group, or a heteroaryl group; $R^2$ and $R^3$ each independently represent a hydrogen atom or a substituent, and at least one of $R^2$ and $R^3$ is an electron withdrawing group; $R^2$ and $R^3$ may be bonded to each other to form a ring; and $R^4$ represents a hydrogen atom, an alkyl group, an aryl group, a heteroaryl group, a substituted boron, or a metal atom, and $R^4$ may be covalently bonded or coordinately bonded to at least one among $R^{1a}$, $R^{1b}$ and $R^3$.

26 Claims, 2 Drawing Sheets

(51) Int. Cl.

| | | |
|---|---|---|
| *G03F 7/00* | (2006.01) | |
| *G03F 7/029* | (2006.01) | |
| *G03F 7/031* | (2006.01) | |
| *G03F 7/105* | (2006.01) | |
| *C09B 23/01* | (2006.01) | |
| *C08K 5/55* | (2006.01) | |
| *C09B 57/00* | (2006.01) | |

(52) U.S. Cl.
CPC ........... *C09B 57/004* (2013.01); *G03F 7/0007* (2013.01); *G03F 7/029* (2013.01); *G03F 7/031* (2013.01); *G03F 7/105* (2013.01); *C08K 5/55* (2013.01); *Y10T 428/24612* (2015.01)

(56) References Cited

FOREIGN PATENT DOCUMENTS

| JP | 10-39127 | A | 2/1998 | | |
| JP | 11-279465 | A | 10/1999 | | |
| JP | 2001-294785 | A | 10/2001 | | |
| JP | 2002-146254 | A | 5/2002 | | |
| JP | 2008-291072 | A | 12/2008 | | |
| JP | 2009-096189 | A | 5/2009 | | |
| JP | 2010-018688 | | * 1/2010 | ............... | C09K 3/00 |
| JP | 2010-059102 | | * 3/2010 | ......... | C07D 207/456 |
| JP | 2010-106248 | | * 5/2010 | ............... | C09K 3/00 |
| JP | 2010-111750 | | * 5/2010 | ............... | C09K 3/00 |

OTHER PUBLICATIONS

Yoshimoto, machine English translation of JP 2006-28455; pub. Feb. 2006.*
Machine English translation of JP 2010-018688 (pub Jan. 2010).*
Machine English translation of JP 2010-059102 (pub Mar. 2010).*
Machine English translation of JP 2010-106248 (pub May 2010).*
Machine English translation of JP 2010-111750 (pub May 2010).*
Office Action issued in corresponding Japanese Patent Application No. 2009-219678 dated Aug. 13, 2013 with English translation.

* cited by examiner

NEAR-INFRARED ABSORPTIVE DYE-CONTAINING CURABLE COMPOSITION, INK COMPOSITION AND METHOD OF PRODUCING NEAR-INFRARED ABSORPTIVE FILTER

This non-provisional application claims priority under 35 U.S.C. § 119 (a) to Patent Application No. 2009-219678 filed in Japan on Sept.24, 2009, the contents of which are entirely incorporated by reference.

FIELD OF THE INVENTION

The present invention relates to a curable composition, an ink composition, an ink-jet ink, and a resist solution, which are near-infrared absorptive and have high non-visibility. Further, the present invention relates to a method of producing a near-infrared absorptive filter using the ink-jet ink and the resist solution.

BACKGROUND OF THE INVENTION

Near-infrared absorptive dyes are used for various purposes in wide fields. The dyes are used in, for example, infrared-cutting films for plasma display panels (PDPs) and solid-state image sensing devices such as CCDs, optical filters in heat-shielding films, or photothermal materials in write once optical disks (CD-Rs) or flash-meltable and fixable materials.

Moreover, the near-infrared absorptive dyes are used as information displaying materials for security inks or invisible bar code inks. The security inks are utilized to print encrypted data (such as a bar code, a two-dimensional code, or OCR characters) on paper moneys, vouchers, valuable securities, or the like, in order to prevent forgery. The inks are further used as hidden inks, which do not damage the design of a printed material.

When a near-infrared absorptive dye is employed for information display applications, it is very important for the dye to have very strong absorption in the near-infrared region and good non-visibility which indicates that it is not visible to naked eye. It has been suggested to form an infrared absorptive image by using an ink containing inorganic ion(s) (copper, iron and ytterbium, etc.), or an organic dye such as phthalocyanine dye, dithiol compound dye, squarylium dye, chroconium dye, and nickel complex dye, etc. (see, JP-A-8-143853 ("JP-A" means unexamined published Japanese patent application), JP-A-7-164729, JP-A-11-279465, JP-A-2008-291072 and JP-A-2002-146254). Although the infrared absorption property of the image created by using these inks is sufficient, it cannot be said that these inks have sufficient non-visibility. When trying to accelerate the non-visibility, the infrared absorption property becomes insufficient, and as a result, an ink having poor discrimination ability as it is mixed with a visible image is obtained. In particular, with respect to the near-infrared absorptive dyes having maximum absorption in an infrared range close to a visible range (i.e., 700 nm to 900 nm), tendency of showing insufficient non-visibility is very obvious.

As another application example of the near-infrared absorptive dye, there is a near-infrared absorptive filter for CCDs. The solid-state imaging sensing device such as CMOSs and CCDs, which are installed in a camera, has high sensitivity even for the rays of the infrared range (700 nm to 1100 nm) so that accurate color resolution cannot be obtained. To avoid such inaccurate color resolution, a reflection-type infrared absorptive filter and an absorption-type infrared absorptive filter using an inorganic ion or an organic dye are generally set in an optical system of a camera. However, since these filters are applied over the entire surface of a lens, turning ON and OFF of an infrared cut for each pixel is practically impossible. Thus it cannot be used, for example, for an application in which both an image by visual light and an image by infrared light are simultaneously taken.

SUMMARY OF THE INVENTION

The present invention resides in a curable composition comprising a near-infrared absorptive dye represented by formula (1):

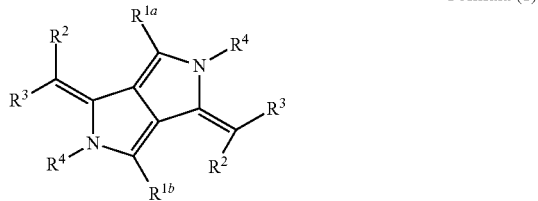

Formula (1)

wherein $R^{1a}$ and $R^{1b}$ may be the same or different, and each independently represent an alkyl group, an aryl group, or a heteroaryl group; $R^2$ and $R^3$ each independently represent a hydrogen atom or a substituent, and at least one of $R^2$ and $R^3$ is an electron withdrawing group; $R^2$ and $R^3$ may be bonded to each other to form a ring; and $R^4$ represents a hydrogen atom, an alkyl group, an aryl group, a heteroaryl group, a substituted boron, or a metal atom, and $R^4$ may be covalently bonded or coordinately bonded to at least one among $R^{1a}$, $R^{1b}$ and $R^3$.

Further, the present invention resides in a curable ink composition, comprising the curable composition as described above.

Further, the present invention resides in an ink jet ink, comprising the curable ink composition as, described above.

Further, the present invention resides in a resist solution, comprising the curable composition as described above.

Further, the present invention resides in a method of producing a cured coating film of the curable composition as described above, comprising irradiating the coating film of the curable composition with active radiation and/or heating the coating film of the curable composition.

Further, the present invention resides in a method of forming an image, comprising the steps of forming a coating film of the ink jet ink as described above on a substrate and curing the coating film thereafter.

Further, the present invention resides in a method of producing a near-infrared absorptive filter, comprising the steps of forming a layer by coating the resist solution as described above on a substrate, exposing the layer of the curable composition formed on the substrate via a mask, and forming a pattern image by development.

Further, the present invention resides in a method of producing a near-infrared absorptive filter, which comprises discharging liquid droplets of the ink jet ink as described above onto recessed portions comparted with partition walls formed on a substrate so as to form a pixel of the near-infrared absorptive filter.

Further, the present invention resides in a solid-state imaging sensing device, comprising the near-infrared absorptive filter that is produced according to the method of producing a near-infrared absorptive filter as described above.

DETAILED DESCRIPTION OF THE INVENTION

Figure 1:
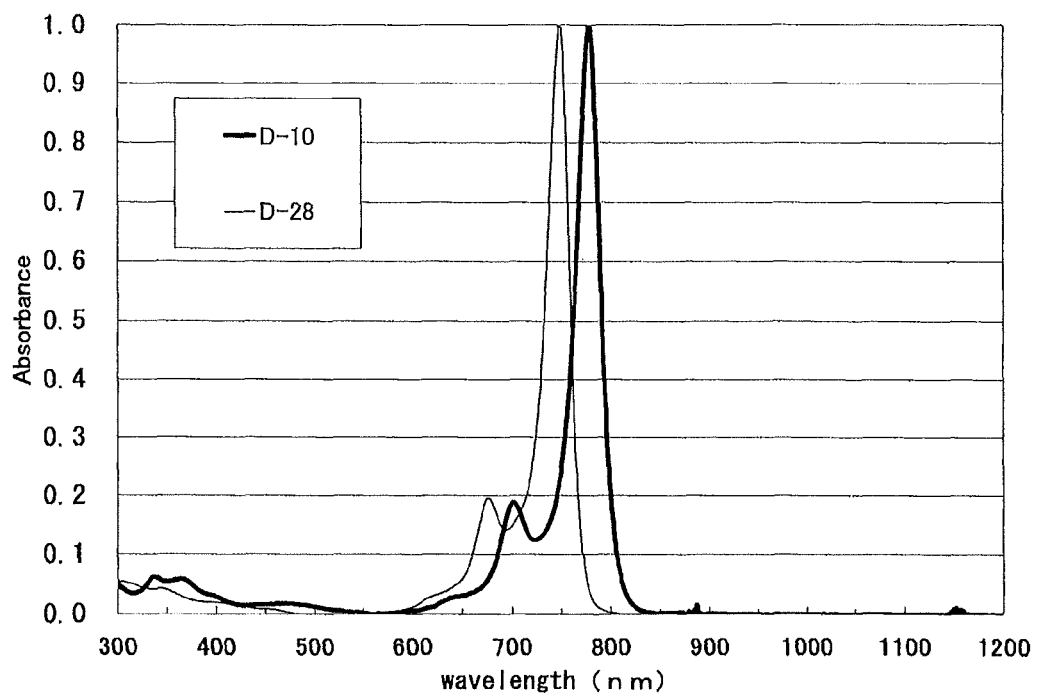
FIG. 1 is a graph showing solution absorption spectra of Exemplified dyes D-10 and D-28.

According to the present invention, there are provided the following means:

<1> A curable composition, comprising a near-infrared absorptive dye represented by formula (1):

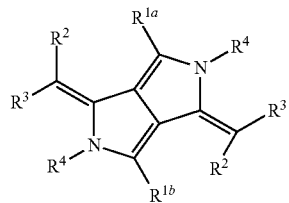

Formula (1)

wherein $R^{1a}$ and $R^{1b}$ may be the same or different, and each independently represent an alkyl group, an aryl group, or a heteroaryl group; $R^2$ and $R^3$ each independently represent a hydrogen atom or a substituent, and at least one of $R^2$ and $R^3$ is an electron withdrawing group; $R^2$ and $R^3$ may be bonded to each other to form a ring; and $R^4$ represents a hydrogen atom, an alkyl group, an aryl group, a heteroaryl group, a substituted boron, or a metal atom, and $R^4$ may be covalently bonded or coordinately bonded to at least one among $R^{1a}$, $R^{1b}$ and $R^3$.

<2> The curable composition as described in the above item <1>, wherein $R^4$ in formula (1) is a substituted boron.

<3> The curable composition as described in the above item <1> or <2>, wherein the near-infrared absorptive dye represented by formula (1) is a dye represented by any one of formulae (2) to (4):

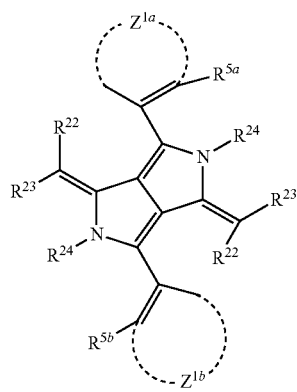

Formula (2)

wherein $Z^{1a}$ and $Z^{1b}$ each independently represent an atomic group that forms an aryl ring or a heteroaryl ring; $R^{5a}$ and $R^{5b}$ each independently represent an aryl group having 6 to 20 carbon atoms, a heteroaryl group having 4 to 20 carbon atoms, an alkyl group having 1 to 20 carbon atoms, an alkoxy group having 1 to 20 carbon atoms, an alkoxycarbonyl group having 1 to 20 carbon atoms, a carboxyl group, a carbamoyl group having 1 to 20 carbon atoms, a halogen atom, or a cyano group; $R^{5a}$ or $R^{5b}$ may be bonded to $Z^{1a}$ or $Z^{1b}$ to form a condensed ring; $R^{22}$ and $R^{23}$ each independently represent a cyano group, an acyl group having 1 to 6 carbon atoms, an alkoxycarbonyl group having 1 to 6 carbon atoms, an alkylsulfinyl or arylsufinyl group having 1 to 10 carbon atoms, or a nitrogen-containing heteroaryl group having 3 to 20 carbon atoms, or $R^{22}$ and $R^{23}$ may be bonded to each other to form a cyclic acidic nucleus; $R^{24}$ represents a hydrogen atom, an alkyl group having 1 to 20 carbon atoms, an aryl group having 6 to 20 carbon atoms, a heteroaryl group having 4 to 20 carbon atoms, a metal atom, or a substituted boron having at least one substituent selected from a halogen atom, an alkyl group having 1 to 10 carbon atoms, an aryl group having 6 to 20 carbon atoms, and a heteroaryl group having 4 to 20 carbon atoms; and $R^{24}$ may be covalently bonded or coordinately bonded to $R^{23}$;

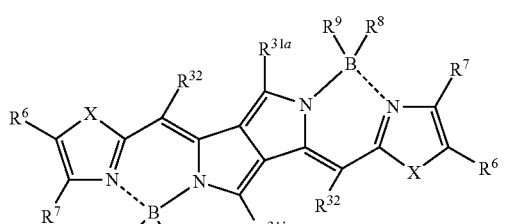

Formula (3)

wherein $R^{31a}$ and $R^{31b}$ each independently represent an alkyl group having 1 to 20 carbon atoms, an aryl group having 6 to 20 carbon atoms, or a heteroaryl group having 3 to 20 carbon atoms; $R^{32}$ represents a cyano group, an acyl group having 1 to 6 carbon atoms, an alkoxycarbonyl group having 1 to 6 carbon atoms, an alkylsulfinyl or arylsulfinyl group having 1 to 10 carbon atoms, or a nitrogen-containing heteroaryl group having 3 to 10 carbon atoms; $R^6$ and $R^7$ each independently represent a hydrogen atom, an alkyl group having 1 to 10 carbon atoms, an aryl group having 6 to 10 carbon atoms, or a heteroaryl group having 4 to 10 carbon atoms; $R^6$ and $R^7$ may be bonded to each other to form a ring, and the formed ring is an alicycle having 5 to 10 carbon atoms, an aryl ring having 6 to 10 carbon atoms, or a heteroaryl ring having 3 to 10 carbon atoms; $R^8$ and $R^9$ each independently represent an alkyl group having 1 to 10 carbon atoms, an alkoxy group having 1 to 10 carbon atoms, an aryl group having 6 to 20 carbon atoms, or a heteroaryl group having 3 to 10 carbon atoms; X represents an oxygen atom, a sulfur atom, —NR—, —CRR'—, or —CH=CH— wherein R and R' each independently represent a hydrogen atom, an alkyl group having 1 to 10 carbon atoms, or an aryl group having 6 to 10 carbon atoms; and

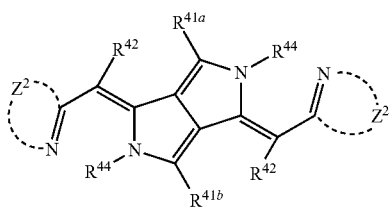

Formula (4)

wherein $R^{41a}$ and $R^{41b}$ represent groups different from each other and each represent an alkyl group having 1 to 20 carbon atoms, an aryl group having 6 to 20 carbon atoms, or a heteroaryl group having 3 to 20 carbon atoms; $R^{42}$ represent a cyano group, an acyl group having 1 to 6 carbon atoms, an alkoxycarbonyl group having 1 to 6 carbon atoms, an alkylsulfinyl or arylsulfinyl group having 1 to 10 carbon atoms, or a nitrogen-containing heteroaryl group having 3 to 10 carbon atoms; $Z^2$ represents a group of atoms which is combined with —C=N— to form a nitrogen-containing, 5- or 6-membered heteroring, and the nitrogen-containing heteroring may be a pyrazole ring, a thiazole ring, an oxazole ring, an imidazole ring, an oxadiazole ring, a thiadiazole ring, a triazole ring, a pyridine ring, a pyridazine ring, a pyrimidine ring, or a pyrazine ring, a benzo-condensed ring or a naphtho-condensed ring thereof, or a composite made from these condensed rings; $R^{44}$ represents a hydrogen atom, an alkyl group having 1 to 20 carbon atoms, an aryl group having 6 to 20 carbon atoms, a heteroaryl group having 4 to 20 carbon atoms, a metal atom, or a substituted boron having at least one substituent selected from a halogen atom, an alkyl group having 1 to 10 carbon atoms, an aryl group having 6 to 20 carbon atoms, and a heteroaryl group having 4 to 20 carbon atoms; $R^{44}$ may be covalently bonded or coordinately bonded to the nitrogen-containing heteroring which $Z^2$ forms; and the above dye may further be substituted.

<4> The curable composition as described in any one of the above items <1> to <3>, wherein the near-infrared absorptive dye represented by any one of formulae (1) to (4) has a maximum absorption wavelength for rays in a range of 700 nm to 1000 nm.

<5> The curable composition as described in any one of the above items <1> to <4>, comprising the near-infrared absorptive dye represented by any one of formulae (1) to (4) in a fine-particle-dispersion state.

<6> The curable composition as described in any one of the above items <1> to <5>, further comprising a polymerizable monomer and/or a polymerizable binder.

<7> A curable ink composition, comprising the curable composition as described in the above item <6>.

<8> An ink-jet ink, comprising the curable ink composition as described in the above item <7>.

<9> A resist solution, comprising the curable composition as described in the above item <6>.

<10> A method of producing a cured coating film of the curable composition as described in any one of the above items <1> to <6>, comprising irradiating the coating film of the curable composition with active radiation and/or heating the coating film of the curable composition.

<11> A method of forming an image, comprising the steps of forming a coating film of the ink-jet ink described in the above item <9> on a substrate and curing the coating film thereafter.

<12> A method of producing a near-infrared absorptive filter, comprising the steps of forming a layer by coating the resist solution described in the above item <8> on a substrate, exposing the layer of the curable composition formed on the substrate via a mask, and forming a pattern image by development.

<13> A method of producing a near-infrared absorptive filter, which comprises discharging liquid droplets of the ink-jet ink as described in the above item <8> onto recessed portions comparted with partition walls formed on a substrate so as to form a pixel of the near-infrared absorptive filter.

<14> A solid-state imaging sensing device, comprising the near-infrared absorptive filter that is produced according to the method of producing a near-infrared absorptive filter described in the above item <13>.

The curable composition of the present invention, the ink-jet ink containing the curable composition, and the resist solution containing the curable composition are described below in detail. The constitutional requirements described below may be embodied on the basis of the representative embodiments of the present invention. However the present invention is not limited to such embodiments. In the present specification, "to" denotes a range including numerical values described before and after it as a minimum value and a maximum value.

<Near-infrared Absorptive Dye>

The near-infrared absorptive dye for use in the present invention is described below.

The curable composition of the present invention comprises a near-infrared absorptive dye represented by formula (1).

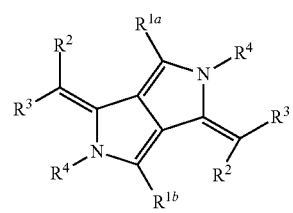

Formula (1)

In formula (1), $R^{1a}$ and $R^{1b}$ may be the same or different, and each independently represent an alkyl group, an aryl group, or a heteroaryl group; $R^2$ and $R^3$ each independently represent a hydrogen atom or a substituent, and at least one of $R^2$ and $R^3$ is an electron withdrawing group; $R^2$ and $R^3$ may be bonded to each other to form a ring; and $R^4$ represents a hydrogen atom, an alkyl group, an aryl group, a heteroaryl group, a substituted boron, or a metal atom, and $R^4$ may be covalently bonded or coordinately bonded to at least one among $R^{1a}$, $R^{1b}$ and $R^3$.

In formula (1), the alkyl group represented by each of $R^{1a}$ and $R^{1b}$ is an alkyl group having preferably 1 to 30 carbon atoms, more preferably 1 to 20 carbon atoms, and in particular preferably 1 to 10 carbon atoms. Examples thereof include methyl, ethyl, iso-propyl, tert-butyl, n-octyl, n-decyl, n-hexadecyl, 2-methylbutyl, 2-ethylcyclohexyl, cyclopentyl, and cyclohexyl.

The aryl group represented by each of $R^{1a}$ and $R^{1b}$ is an aryl group having preferably 6 to 30 carbon atoms, more preferably 6 to 20 carbon atoms, and in particular preferably 6 to 12 carbon atoms. Examples thereof include phenyl, o-methylphenyl, p-methylphenyl, biphenyl, naphthyl, anthranyl, phenanthryl, 4-(2-ethylhexyloxy)phenyl, 4-(2-methylbutyloxy)phenyl, 4-(2-octyldodecyloxy)phenyl and 4-hydroxyphenyl.

The heteroaryl group represented by $R^{1a}$ and $R^{1b}$ is a heteroaryl group having preferably 1 to 30 carbon atoms (more preferably 1 to 12 carbon atoms) and having, as hetero atom(s), a nitrogen atom, an oxygen atom and/or a sulfur atom. Examples thereof include imidazolyl, pyridyl, quinolyl, furyl, thienyl, benzoxazolyl, benzimidazolyl, benzothiazolyl, naphthothiazolyl, m-carbazolyl, and azepinyl.

$R^{1a}$ and $R^{1b}$ each are particularly preferably 4-(2-ethylhexyloxy)phenyl, 4-(2-methylbutyloxy)phenyl, or 4-(2-octyldodecyloxy)phenyl.

In formula (1), $R^{1a}$ and $R^{1b}$ may be the same as or different from each other.

$R^2$ and $R^3$ each independently represent a hydrogen atom or a substituent T provided that at least one of $R^2$ and $R^3$ is an electron withdrawing group. $R^2$ and $R^3$ may be bonded to each other to form a ring. Examples of the substituent T include an alkyl group (having preferably 1 to 30 carbon atoms, more preferably 1 to 20 carbon atoms, and particularly preferably 1 to 10 carbon atoms, such as methyl, ethyl, isopropyl, tert-butyl, n-octyl, n-decyl, n-hexadecyl, 2-methylbutyl, 2-ethylcyclohexyl, cyclopentyl and cyclohexyl), an alkenyl group (having preferably 2 to 30 carbon atoms, more preferably 2 to 20 carbon atoms, and particularly preferably 2 to 10 carbon atoms, such as vinyl, allyl, 2-butenyl, and 3-pentenyl), an alkynyl group (having preferably 2 to 30 carbon atoms, more preferably 2 to 20 carbon atoms, and particularly preferably 2 to 10 carbon atoms, such as propargyl and 3-pentynyl), an aryl group (having preferably 6 to 30 carbon atoms, more preferably 6 to 20 carbon atoms, and particularly preferably 6 to 12 carbon atoms, such as phenyl, p-methylphenyl, biphenyl, naphthyl, anthranyl, and phenanthryl), an amino group (having preferably 0 to 30 carbon atoms, more preferably 0 to 20 carbon atoms, and particularly preferably 0 to 10 carbon atoms, including alkylamino, arylamino, and heterocyclic amino group, such as amino, methylamino, dimethylamino, diethylamino, dibenzylamino, diphenylamino, and ditolylamino), an alkoxy group (having preferably 1 to 30 carbon atoms, more preferably 1 to 20 carbon atoms, and particularly preferably 1 to 10 carbon atoms, such as methoxy, ethoxy, butoxy, and 2-ethylhexyloxy), an aryloxy group (having preferably 6 to 30 carbon atoms, more preferably 6 to 20 carbon atoms, and particularly preferably 6 to 12 carbon atoms, such as phenyloxy, 1-naphthyloxy, and 2-naphthyloxy), an aromatic heterocyclic oxy group (having preferably 1 to 30 carbon atoms, more preferably 1 to 20 carbon atoms, and particularly preferably 1 to 12 carbon atoms, such as pyridyloxy, pyrazyloxy, pyrimidyloxy, quinolyloxy), an acyl group (having preferably 1 to 30 carbon atoms, more preferably 1 to 20 carbon atoms, and particularly preferably 1 to 12 carbon atoms, such as acetyl, benzoyl, formyl, and pivaloyl), an alkoxycarbonyl group (having preferably 2 to 30 carbon atoms, more preferably 2 to 20 carbon atoms, and particularly preferably 2 to 12 carbon atoms, such as methoxycarbonyl and ethoxycarbonyl), an aryloxycarbonyl group (having preferably 7 to 30 carbon atoms, more preferably 7 to 20 carbon atoms, and particularly preferably 7 to 12 carbon atoms, such as phenyloxycarbonyl), an acyloxy group (having preferably 2 to 30 carbon atoms, more preferably 2 to 20 carbon atoms, and particularly preferably 2 to 10 carbon atoms, such as acetoxy and benzoyloxy), an acylamino group (having preferably 2 to 30 carbon atoms, more preferably 2 to 20 carbon atoms, and particularly preferably 2 to 10 carbon atoms, such as acetylamino and benzoylamino), an alkoxycarbonylamino group (having preferably 2 to 30 carbon atoms, more preferably 2 to 20 carbon atoms, and particularly preferably 2 to 12 carbon atoms, such as methoxycarbonylamino), an aryloxycarbonylamino group (having preferably 7 to 30 carbon atoms, more preferably 7 to 20 carbon atoms, and particularly preferably 7 to 12 carbon atoms, such as phenyloxycarbonylamino), a sulfonylamino group (having preferably 1 to 30 carbon atoms, more preferably 1 to 20 carbon atoms, and particularly preferably 1 to 12 carbon atoms, such as methanesulfonylamino and benzenesulfonylamino), a sulfamoyl group (having preferably 0 to 30 carbon atoms, more preferably 0 to 20 carbon atoms, and particularly preferably 0 to 12 carbon atoms, such as sulfamoyl, methylsulfamoyl, dimethylsulfamoyl, and phenylsulfamoyl), a carbamoyl group (having preferably 1 to 30 carbon atoms, more preferably 1 to 20 carbon atoms, and particularly preferably 1 to 12 carbon atoms, such as carbamoyl, methylcarbamoyl, diethylcarbamoyl, and phenylcarbamoyl), an alkylthio group (having preferably 1 to 30 carbon atoms, more preferably 1 to 20 carbon atoms, and particularly preferably 1 to 12 carbon atoms, such as methylthio and ethylthio), an arylthio group (having preferably 6 to 30 carbon atoms, more preferably 6 to 20 carbon atoms, and particularly preferably 6 to 12 carbon atoms, such as phenylthio), an aromatic heterocyclic thio group (having preferably 1 to 30 carbon atoms, more preferably 1 to 20 carbon atoms, and particularly preferably 1 to 12 carbon atoms, such as pyridylthio, 2-benzimizolylthio, 2-benzoxazolylthio, 2-benzothiazolylthio), a sulfonyl group (having preferably 1 to 30 carbon atoms, more preferably 1 to 20 carbon atoms, and particularly preferably 1 to 12 carbon atoms, such as mesyl and tosyl), a sulfinyl group (having preferably 1 to 30 carbon atoms, more preferably 1 to 20 carbon atoms, and particularly preferably 1 to 12 carbon atoms, such as methanesulfinyl and benzenesulfinyl), a ureido group (having preferably 1 to 30 carbon atoms, more preferably 1 to 20 carbon atoms, and particularly preferably 1 to 12 carbon atoms, such as ureido, methylureido, and phenylureido), a phosphoric acid amide group (having preferably 1 to 30 carbon atoms, more preferably 1 to 20 carbon atoms, and particularly preferably 1 to 12 carbon atoms, such as diethylphosphoric acid amide and phenylphosphoric acid amide), a hydroxyl group, a mercapto group, a halogen atom (such as a fluorine atom, a chlorine atom, a bromine atom, and an iodine atom), a cyano group, a sulfo group, a carboxyl group, a nitro group, a hydroxamic acid group, a sulfino group, a hydrazino group, an imino group, a heterocyclic group (having preferably 1 to 30 carbon atoms, and more preferably 1 to 12 carbon atoms where examples of the hetero atom are a nitrogen atom, an oxygen atom and a sulfur atom and, to be more specific, such as imidazolyl, pyridyl, quinolyl, furyl, thienyl, piperidyl, morpholino, benzoxazolyl, benzimidazolyl, benzothiazolyl, carbazolyl, and azepinyl group), and a silyl group (having preferably 3 to 40 carbon atoms, more preferably 3 to 30 carbon atoms, and particularly preferably 3 to 24 carbon atoms, such as trimethylsilyl and triphenylsilyl). These substituents may be further substituted.

At least one of $R^2$ and $R^3$ is an electron-withdrawing group. A substituent having positive Hammett's σp value (i.e., sigma para value) generally functions as an electron-withdrawing group. Examples of the electron-withdrawing group include a cyano group, an acyl group, an alkyloxycarbonyl group, an aryloxycarbonyl group, a sulfamoyl group, a sulfinyl group, and a heterocyclic group. These electron-withdrawing groups may be further substituted.

The expression "Hammett substituent constant σ value" used herein will be described. Hammett's rule is a rule of thumb advocated by L. P. Hammett in 1935 for quantitatively considering the effect of substituents on the reaction or equilibrium of benzene derivatives, and the appropriateness thereof is now widely recognized. The substituent constant determined in the Hammett's rule involves $\sigma_p$ value and $\sigma_m$ value. These values can be found in a multiplicity of general publications, and are detailed in, for example, "Lange's Handbook of Chemistry" 12th edition by J. A. Dean, 1979 (McGraw-Hill), "Kagaku no Ryoiki" special issue, No. 122, pp. 96 to 103, 1979 (Nankodo) and Chem. Rev., vol. 91, pp. 165 to 195, 1991. In the present invention, a substituent having Hammett's substituent constant σp value of at least 0.2 or more can be exemplified as an electron-withdrawing group. The $\sigma_p$ value is preferably 0.25 or more, more preferably 0.3 or more, and in particular preferably 0.35 or more. The upper limit thereof is not particularly limited, and is preferably 0.80.

Examples thereof include a cyano group (0.66), a carboxyl group (—COOH: 0.45), an alkoxycarbonyl group (e.g., —COOMe: 0.45), an aryloxycarbonyl group (e.g., —COOPh: 0.44), a carbamoyl group (—CONH$_2$: 0.36), an alkylcarbonyl group (e.g., —COMe: 0.50), an arylcarbonyl group (e.g., —COPh: 0.43), an alkylsulfonyl group (e.g., —SO$_2$Me: 0.72), and an arylsulfonyl group (e.g., —SO$_2$Ph: 0.68). Particularly preferred is a cyano group.

In the present specification, Me represents a methyl group and Ph represents a phenyl group. The values in parentheses are the $\sigma_p$ values of typical substituents, as extracted from Chem. Rev., 1991, vol. 91, pp. 165 to 195.

When the compound represented by formula (1) is a compound where $R^2$ and $R^3$ in formula (1) are combined to form a ring, the ring formed is preferably a 5- to 7-membered ring (preferably 5- or 6-membered ring) which is usually used as an acidic nucleus in a merocyanine dye, and specific examples thereof include the followings:

(a) a 1,3-dicarbonyl nucleus, such as 1,3-indanedione nucleus, 1,3-cyclohexanedione, 5,5-dimethyl-1,3-cyclohexanedione, and 1,3-dioxane-4,6-dione, (b) a pyrazolinone nucleus, such as 1-phenyl-2-pyrazolin-5-one, 3-methyl-1-phenyl-2-pyrazolin-5-one, and 1-(2-benzothiazoyl)-3-methyl-2-pyrazolin-5-one, (c) an isoxazolinone nucleus, such as 3-phenyl-2-isoxazolin-5-one, and 3-methyl-2-isoxazolin-5-one, (d) an oxyindole nucleus, such as 1-alkyl-2,3-dihydro-2-oxyindole, (e) a 2,4,6-triketohexahydropyrimidine nucleus, such as barbituric acid, 2-thiobarbituric acid and a derivative thereof, examples of the derivative include a 1-alkyl form such as 1-methyl and 1-ethyl, a 1,3-dialkyl form such as 1,3-dimethyl, 1,3-diethyl and 1,3-dibutyl, a 1,3-diaryl form such as 1,3-diphenyl, 1,3-di(p-chlorophenyl) and 1,3-di(p-ethoxycarbonylphenyl), a 1-alkyl-1-aryl form such as 1-ethyl-3-phenyl, and a 1,3-diheterocyclic substitution form such as 1,3-di(2-pyridyl), (f) a 2-thio-2,4-thiazolidinedione nucleus, such as rhodanine and a derivative thereof; examples of the derivative include a 3-alkylrhodanine such as 3-methylrhodanine, 3-ethylrhodanine and 3-allylrhodanine, a 3-arylrhodanine such as 3-phenylrhodanine, and a 3-heterocyclic ring-substituted rhodanine such as 3-(2-pyridyl)rhodanine, (g) a 2-thio-2,4-oxazolidinedione (2-thio-2,4-(3H,5H)-oxazoledione) nucleus, such as 3-ethyl-2-thio-2,4-oxazolidinedione, (h) a thianaphthenone nucleus, such as 3(2H)-thianaphthenone-1,1-dioxide, (i) a 2-thio-2,5-thiazolidinedione nucleus, such as 3-ethyl-2-thio-2,5-thiazolidinedione, (j) a 2,4-thiazolidinedione nucleus, such as 2,4-thiazolidinedione, 3-ethyl-2,4-thiazolidinedione and 3-phenyl-2,4-thiazolidinedione, (k) a thiazolin-4-one nucleus, such as 4-thiazolinone and 2-ethyl-4-thiazolinone, (l) a 4-thiazolinone nucleus, such as 2-ethylmercapto-5-thiazolin-4-one and 2-alkylphenylamino-5-thiazolin-4-one, (m) a 2,4-imidazolidinedione (hydantoin) nucleus, such as 2,4-imidazolidinedione and 3-ethyl-2,4-imidazolidinedione, (n) a 2-thio-2,4-imidazolidinedione (2-thiohydantoin) nucleus, such as 2-thio-2,4-imidazolidinedione and 3-ethyl-2-thio-2,4-imidazolidinedione, (o) an imidazolin-5-one nucleus, such as 2-propylmercapto-2-imidazolin-5-one, (p) a 3,5-pyrazolidinedione nucleus, such as 1,2-diphenyl-3,5-pyrazolidinedione and 1,2-dimethyl-3,5-pyrazolidinedione, (q) a benzothiophen-3-one nucleus, such as benzothiophen-3-one, oxobenzothiophen-3-one and dioxobenzothiophen-3-one, and (r) an indanone nucleus, such as 1-indanone, 3-phenyl-1-indanone, 3-methyl-1-indanone, 3,3-diphenyl-1-indanone and 3,3-dimethyl-1-indanone.

When $R^2$ and $R^3$ are bonded to form a ring, the σp value of $R^2$ and $R^3$ cannot be specified. However, in the present invention, the σp values of $R^2$ and $R^3$ are defined with assuming that partial structures of the ring are substituted as $R^2$ and $R^3$. For example, when $R^2$ and $R^3$ form a 1,3-indandione ring, it is supposed that benzoyl groups are substituted as $R^2$ and $R^3$.

The ring formed by $R^2$ and $R^3$ is preferably a 1,3-dicarbonyl nucleus, a pyrazolinone nucleus, a 2,4,6-triketohexahydropyrimidine nucleus (including a thioketone form), a 2-thio-2,4-thiazolidinedione nucleus, a 2-thio-2,4-oxazolidinedione nucleus, a 2-thio-2,5-thiazolidinedione nucleus, a 2,4-thiazolidinedione nucleus, a 2,4-imidazolidinedione nucleus, a 2-thio-2,4-imidazolidinedione nucleus, a 2-imidazolin-5-one nucleus, a 3,5-pyrazolidinedione nucleus, a benzothiophen-3-one nucleus or an indanone nucleus; and more preferably a 1,3-dicarbonyl nucleus, a 2,4,6-triketohexahydropyrimidine nucleus (including a thioketone form), a 3,5-pyrazolidinedione nucleus, a benzothiophen-3-one nucleus or an indanone nucleus.

$R^3$ is in particular preferably a heteroring. The heteroring is in particular preferably a pyrazole ring, a thiazole ring, an oxazole ring, an imidazole ring, an oxadiazole ring, a thiadiazole ring, a triazole ring, a pyridine ring, a pyridazine ring, a pyrimidine ring, or a pyrazine ring; a benzo-condensed ring or a naphtho-condensed ring thereof; or a composite made from these condensed rings.

Two groups represented by $R^2$ in formula (1) may be the same as or different from each other, and two groups represented by $R^3$ may be the same as or different from each other.

The alkyl group, the aryl group and the heteroaryl group represented by $R^4$ have the same meanings as those described as $R^{1a}$ and $R^{1b}$, respectively. Preferred ranges thereof are also the same. The substituent in the substituted boron represented by $R^4$ has the same meaning as the substituent T described about $R^2$ and $R^3$. Preferred examples thereof include an alkyl group, an aryl group, and a heteroaryl group. The metal atom represented by $R^4$ is preferably a transition metal, magnesium, aluminum, calcium, barium, zinc or tin, more preferably aluminum, zinc, tin, vanadium, iron, cobalt, nickel, copper, palladium, iridium or platinum, and in particular preferably aluminum, zinc, vanadium, iron, copper, palladium, iridium or platinum.

$R^4$ is in particular preferably substituted boron. As for the substituted boron, difluoro boron, diphenyl boron, dibutyl boron, dinaphthyl boron, and catechol boron can be preferably mentioned. Among these, diphenyl boron is particularly preferred.

$R^4$ may be covalently bonded or coordinately bonded to at least one among $R^{1a}$, $R^{1b}$ and $R^3$. $R^4$ is, in particular preferably, coordinately bonded to the corresponding $R^3$.

In formula (1), two groups represented by $R^4$ may be the same as or different from each other.

The near-infrared absorptive dye represented by formula (1) is preferably a near-infrared absorptive dye represented by any one of the following formulae (2), (3) and (4):

Formula (2)

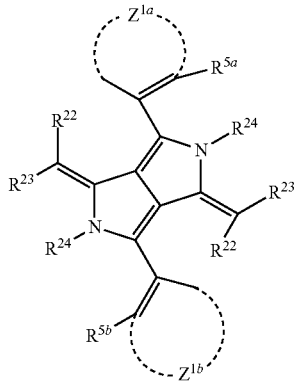

In formula (2), $Z^{1a}$ and $Z^{1b}$ each independently represent an atomic group that fowls an aryl ring or a heteroaryl ring. $R^{5a}$ and $R^{5b}$ each independently represent an aryl group having 6 to 20 carbon atoms, a heteroaryl group having 4 to 20 carbon atoms, an alkyl group having 1 to 20 carbon atoms, an alkoxy group having 1 to 20 carbon atoms, an alkoxycarbonyl group having 1 to 20 carbon atoms, a carboxyl group, a carbamoyl group having 1 to 20 carbon atoms, a halogen atom, or a cyano group. $R^{5a}$ or $R^{5b}$ may be bonded to $Z^{1a}$ or $Z^{1b}$ to form a condensed ring. $R^{22}$ and $R^{23}$ each independently represent a cyano group, an acyl group having 1 to 6 carbon atoms, an alkoxycarbonyl group having 1 to 6 carbon atoms, an alkylsulfinyl or arylsufinyl group having 1 to 10 carbon atoms, or a nitrogen-containing heteroaryl group having 3 to 20 carbon atoms, or $R^{22}$ and $R^{23}$ are bonded to each other to form a cyclic acidic nucleus. $R^{24}$ represents a hydrogen atom, an alkyl group having 1 to 20 carbon atoms, an aryl group having 6 to 20 carbon atoms, a heteroaryl group having 4 to 20 carbon atoms, a metal atom, or a substituted boron having at least one substituent selected from a halogen atom, an alkyl group having 1 to 10 carbon atoms, an aryl group having 6 to 20 carbon atoms, and a heteroaryl group having 4 to 20 carbon atoms. $R^{24}$ may be covalently bonded or coordinately bonded to $R^{23}$. The above near-infrared absorptive dye may further be substituted.

Formula (3)

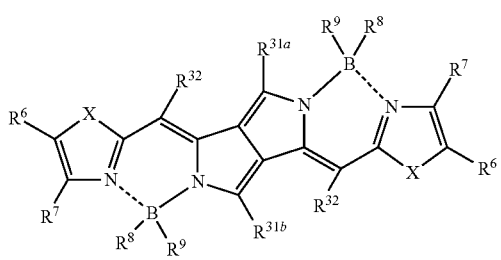

In formula (3), $R^{31a}$ and $R^{31b}$ each independently represent an alkyl group having 1 to 20 carbon atoms, an aryl group having 6 to 20 carbon atoms, or a heteroaryl group having 3 to 20 carbon atoms. $R^{32}$ represents a cyano group, an acyl group having 1 to 6 carbon atoms, an alkoxycarbonyl group having 1 to 6 carbon atoms, an alkylsulfinyl or arylsulfinyl group having 1 to 10 carbon atoms, or a nitrogen-containing heteroaryl group having 3 to 10 carbon atoms. $R^6$ and $R^7$ each independently represent a hydrogen atom, an alkyl group having 1 to 10 carbon atoms, an aryl group having 6 to 10 carbon atoms, or a heteroaryl group having 4 to 10 carbon atoms. $R^6$ and $R^7$ may be bonded to each other to form a ring. The formed ring is an alicycle having 5 to 10 carbon atoms, an aryl ring having 6 to 10 carbon atoms, or a heteroaryl ring having 3 to 10 carbon atoms. $R^8$ and $R^9$ each independently represent an alkyl group having 1 to 10 carbon atoms, an alkoxy group having 1 to 10 carbon atoms, an aryl group having 6 to 20 carbon atoms, or a heteroaryl group having 3 to 10 carbon atoms. X represents an oxygen atom, a sulfur atom, —NR—, —CRR'—, or —CH=CH— wherein R and R' each independently represent a hydrogen atom, an alkyl group having 1 to 10 carbon atoms, or an aryl group having 6 to 10 carbon atoms.

Formula (4)

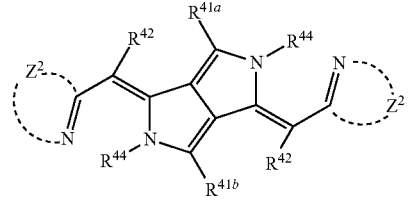

In formula (4), $R^{41a}$ and $R^{41b}$ represent groups different from each other and each represent an alkyl group having 1 to 20 carbon atoms, an aryl group having 6 to 20 carbon atoms, or a heteroaryl group having 3 to 20 carbon atoms. $R^{42}$ represent a cyano group, an acyl group having 1 to 6 carbon atoms, an alkoxycarbonyl group having 1 to 6 carbon atoms, an alkylsulfinyl or arylsulfinyl group having 1 to 10 carbon atoms, or a nitrogen-containing heteroaryl group having 3 to 10 carbon atoms. $Z^2$ represents a group of atoms which is combined with —C=N— to form a nitrogen-containing, 5- or 6-membered heteroring. The nitrogen-containing heteroring may be a pyrazole ring, a thiazole ring, an oxazole ring, an imidazole ring, an oxadiazole ring, a thiadiazole ring, a triazole ring, a pyridine ring, a pyridazine ring, a pyrimidine ring, or a pyrazine ring; a benzo-condensed ring or a naphtho-condensed ring thereof; or a composite made from these condensed rings. $R^{44}$ represents a hydrogen atom, an alkyl group having 1 to 20 carbon atoms, an aryl group having 6 to 20 carbon atoms, a heteroaryl group having 4 to 20 carbon atoms, a metal atom, or a substituted boron having at least one substituent selected from a halogen atom, an alkyl group having 1 to 10 carbon atoms, an aryl group having 6 to 20 carbon atoms, and a heteroaryl group having 4 to 20 carbon atoms. $R^{44}$ may be covalently bonded or coordinately bonded to the nitrogen-containing heteroring which $Z^2$ forms. The above near-infrared absorptive dye may further be substituted.

The compound represented by formula (2) will be described hereinafter.

In formula (2), $Z^{1a}$ and $Z^{1b}$ each independently represent an atomic group that forms an aryl ring or a heteroaryl ring. The formed aryl ring or heteroaryl ring has the same meaning as the aryl group or heteroaryl group described about the substituent as each of $R^2$ and $R^3$ in formula (1). A preferred range of the formed aryl ring or heteroaryl ring is also the same. $Z^{1a}$ and $Z^{1b}$ are preferably the same as each other.

$R^{5a}$ and $R^{5b}$ each independently represent an aryl group having 6 to 20 carbon atoms, a heteroaryl group having 4 to 20 carbon atoms, an alkyl group having 1 to 20 carbon atoms, an alkoxy group having 1 to 20 carbon atoms, an alkoxycarbonyl group having 1 to 20 carbon atoms, a carboxyl group, a carbamoyl group having 1 to 20 carbon atoms, a halogen atom, or a cyano group. Specific examples thereof are the same as those described about $R^2$ and $R^3$ in formula (1). Preferred ranges thereof are also the same. $R^{5a}$ and $R^{5b}$ are preferably the same as each other.

$R^{5a}$ or $R^{5b}$ may be bonded to $Z^{1a}$ or $Z^{1b}$ to form a condensed ring. Examples of the condensed ring include a naphthyl ring and a quinoline ring.

By introducing the group represented by $R^{5a}$ or $R^{5b}$ into the aryl ring or heteroaryl ring that $Z^{1a}$ or $Z^{1b}$ forms, the invisibility can be largely improved.

$R^{22}$ and $R^{23}$ each independently represent a cyano group, an acyl group having 1 to 6 carbon atoms, an alkoxycarbonyl group having 1 to 6 carbon atoms, an alkylsufinyl or arylsufinyl group having 1 to 10 carbon atoms, or a nitrogen-containing heteroaryl group having 3 to 20 carbon atoms, or $R^{22}$ is bonded to $R^{23}$ to form a cyclic acidic nucleus. Specific examples thereof are the same as those described about $R^2$ and $R^3$ in formula (1). Preferred ranges thereof are the same. $R^{24}$ has the same meaning as $R^4$ in formula (1). A preferred range thereof is also the same. $R^{24}$ may be covalently bonded or coordinately bonded to $R^{23}$.

The compound represented by formula (2) may further have a substituent. The substituent has the same meaning as the substituent T as each of $R^2$ and $R^3$. Preferred ranges thereof are the same.

In formula (2), a preferred combination of $Z^{1a}$, $Z^{1b}$ and the like is as follows: $Z^{1a}$ and $Z^{1b}$ each independently form a benzene ring or a pyridine ring; $R^{5a}$ and $R^{5b}$ are each independently an alkyl group, an alkoxy group, a halogen atom, or a cyano group; $R^{22}$ and $R^{23}$ are each independently a heterocyclic group, a cyano group, an acyl group, or an alkoxycarbonyl group, or $R^{22}$ is bonded to $R^{23}$ to form a cyclic acidic nucleus; and $R^{24}$ is a hydrogen atom, a substituted boron, a transition metal atom, magnesium, aluminum, calcium, barium, zinc, or tin. A particularly preferred combination thereof is as follows: $Z^{1a}$ and $Z^{1b}$ each form a benzene ring; $R^{5a}$ and $R^{5b}$ are each an alkyl group, a halogen atom, or a cyano group; $R^{22}$ and $R^{23}$ are each independently a combination of a nitrogen-containing heterocyclic group with a cyano group or alkoxycarbonyl group, or $R^{22}$ is bonded to $R^{23}$ to form a cyclic acidic nucleus; and $R^{24}$ is a hydrogen atom, a substituted boron, aluminum, zinc, vanadium, iron, copper, palladium, iridium or platinum.

The compound represented by formula (3) will be described hereinafter.

In formula (3), $R^{31a}$ and $R^{31b}$ each independently represent an alkyl group having 1 to 20 carbon atoms, an aryl group having 6 to 20 carbon atoms, or a heteroaryl group having 3 to 20 carbon, atoms. Specific examples thereof are the same as those described about $R^{1a}$ and $R^{1b}$ in formula (1). Preferred ranges thereof are also the same. $R^{31a}$ and $R^{31b}$ are preferably the same as each other.

$R^{32}$ is a cyano group, an alkoxycarbonyl group having 1 to 6 carbon atoms, an alkylsulfinyl or arylsulfinyl group having 1 to 10 carbon atoms, or a nitrogen-containing heteroaryl group having 3 to 10 carbon atoms. Specific examples thereof are the same as those described about $R^2$ in formula (1). A preferred range thereof is also the same.

$R^6$ and $R^7$ are each independently a hydrogen atom, an alkyl group having 1 to 10 carbon atoms, an aryl group having 6 to 10 carbon atoms, or a heteroaryl group having 4 to 10 carbon atoms. Specific examples thereof are the same as those described about the substituents as $R^2$ and $R^3$ in formula (1). Preferred ranges thereof are also the same. $R^6$ and $R^7$ may be bonded to each other to form a ring. The formed ring is an alicycle having 5 to 10 carbon atoms, an aryl ring having 6 to 10 carbon atoms, or a heteroaryl ring having 3 to 10 carbon atoms. Preferred examples thereof include a benzene ring, a naphthalene ring or a pyridine ring.

By introducing a 5-membered, nitrogen-containing heteroring substituted by $R^6$ and $R^7$, and further modifying the compound to a boron complex, a near-infrared absorptive dye having a high fastness and a high invisibility, which are compatible with each other, can be realized.

$R^8$ and $R^9$ are each independently an alkyl group having 1 to 10 carbon atoms, an alkoxy group having 1 to 10 carbon atoms, an aryl group having 6 to 20 carbon atoms, or a heteroaryl group having 3 to 10 carbon atoms. Specific examples thereof are the same as those described about the substituents as $R^2$ and $R^3$ in formula (1). Preferred ranges thereof are also the same.

X represents an oxygen atom, a sulfur atom, —NR—, —CRR'—, or —CH=CH— wherein R and R' each independently represent a hydrogen atom, an alkyl group having 1 to 10 carbon atoms, or an aryl group having 6 to 10 carbon atoms, and are each preferably a hydrogen atom, an alkyl group having 1 to 6 carbon atoms, or a phenyl group.

In formula (3), a preferred combination of $R^{31a}$, $R^{31b}$ and the like is as follows: $R^{31a}$ and $R^{31b}$ are each independently an alkyl group having 1 to 10 carbon atoms, a benzene ring, or a pyridine ring; $R^{32}$ is a cyano group or an alkoxycarbonyl group; $R^6$ is bonded to $R^7$ to form a benzene ring, a pyridine ring, a pyrazine ring, or a pyrimidine ring; $R^8$ and $R^9$ are each independently an alkyl group having 1 to 6 carbon atoms, a phenyl group or a naphthyl group; and X is an oxygen atom, a sulfur atom, —NR—, —CRR', or —CH=CH— wherein R and R' are each independently a hydrogen atom, an alkyl group having 1 to 6 carbon atoms, or a phenyl group. A particularly preferred combination thereof is as follows: $R^{31a}$ and $R^{31b}$ are each an alkyl group having 1 to 10 carbon atoms, or a benzene ring; $R^{32}$ is a cyano group; $R^6$ is bonded to $R^7$ to form a benzene ring, or a pyridine ring; $R^8$ and $R^9$ are each independently an alkyl group having 1 to 6 carbon atoms, a phenyl group or a naphthyl group; and X is oxygen or sulfur.

The compound represented by formula (4) will be described hereinafter.

In formula (4), $R^{41a}$ and $R^{41b}$ each represent an alkyl group having 1 to 20 carbon atoms, an aryl group having 6 to 20 carbon atoms, or a heteroaryl group having 3 to 20 carbon atoms. Specific examples thereof are the same as those described about $R^{1a}$ and $R^{1b}$ in formula (1). Preferred ranges thereof are also the same. However, $R^{41a}$ and $R^{41b}$ represent a substituent different from each other.

$R^{42}$ is a cyano group, an alkoxycarbonyl group having 1 to 6 carbon atoms, an alkylsulfinyl or arylsulfinyl group having 1 to 10 carbon atoms, or a nitrogen-containing heteroaryl group having 3 to 10 carbon atoms. Specific examples thereof are the same as those described about $R^2$ in formula (1). A preferred range thereof is also the same.

$Z^2$ represents an atomic group which is combined with —C=N— to form a nitrogen-containing, 5- or 6-membered heteroring. The nitrogen-containing heteroring may be a pyrazole ring, a thiazole ring, an oxazole ring, an imidazole ring, an oxadiazole ring, a thiadiazole ring, a triazole ring, a pyridine ring, a pyridazine ring, a pyrimidine ring, or a pyrazine ring; a benzo-condensed ring or a naphtho-condensed ring thereof; or a composite made from these condensed rings.

$R^{44}$ represents a hydrogen atom, an alkyl group having 1 to 20 carbon atoms, an aryl group having 6 to 20 carbon atoms, a heteroaryl group having 4 to 20 carbon atoms, a metal atom, or a substituted boron having at least one substituent selected from a halogen atom, an alkyl group having 1 to 10 carbon atoms, an aryl group having 6 to 20 carbon atoms, and a heteroaryl group having 4 to 20 carbon atoms. $R^{44}$ may be covalently bonded or coordinately bonded to the nitrogen-containing heteroring which $Z^2$ forms.

$R^{41a}$ and $R^{41b}$, which are different from each other, are introduced, and the nitrogen-containing, 5- or 6-membered heteroring, which is made from $Z^2$ and —C=N—, is introduced, whereby a high fastness, a high invisibility, an excellent dispersibility and a high solubility in organic solvent can be obtained.

In formula (4), a preferred combination of $R^{41a}$, $R^{41b}$ and the like are as follows: $R^{41a}$ and $R^{41b}$ are each independently an alkyl group having 1 to 10 carbon atoms, a benzene ring, or a pyridine ring; $R^{42}$ is a cyano group, an alkyl group, alkylsulfinyl group, arylsulfinyl group, or alkoxycarbonyl group, each having 1 to 10 carbon atoms; $Z^2$ is combined with —C=N— to form a thiazole ring, an oxazole ring, an imidazole ring, a thiadiazole ring, a triazole ring, a pyridine ring, a pyrimidine ring or a pyrazine ring, or a benzo-condensed ring or a naphtho-condensed ring thereof; and $R^{44}$ is a hydrogen atom, a substituted boron, a transition metal atom, magnesium, aluminum, calcium, barium, zinc, or tin. A particularly preferred combination thereof is as follows: $R^{41a}$ and $R^{41b}$ are each independently an alkyl group having 1 to 10 carbon atoms, or a benzene ring; $R^{42}$ is a cyano group; $Z^2$ is combined with —C=N— to form a thiazole ring, an oxazole ring, an imidazole ring, a triazole ring, a pyridine ring or a pyrimidine ring, or a benzo-condensed ring or a naphtho-condensed ring thereof; and $R^{44}$ is a hydrogen atom, a substituted boron (its substituent is an alkyl group having 1 to 10 carbon atoms, a benzene ring, a pyridine ring, or a thiophene ring), aluminum, zinc, vanadium, iron, copper, palladium, iridium, or platinum.

Hereinafter, illustrated are specific examples of the near-infrared absorptive dye used in the curable composition of the present invention. In the present invention, the dye compound is not limited to the specific examples. In the present specification, Me, Et, Bu, and Ph represent a methyl group, an ethyl group, a butyl group, and a phenyl group, respectively. In the chemical formula D-1 or D-17 and the like out of the chemical formulae illustrated below, the hydrogen atom corresponding to the substituent $R^4$ in formula (1) is combined with the nitrogen atom in the heteroring constituting the substituent $R^3$ to form a coordinate bond. In these chemical formulae, the above coordinate bond is omitted (see scheme 1 illustrated below). Further, in the chemical formula D-36, two counter anions are omitted.

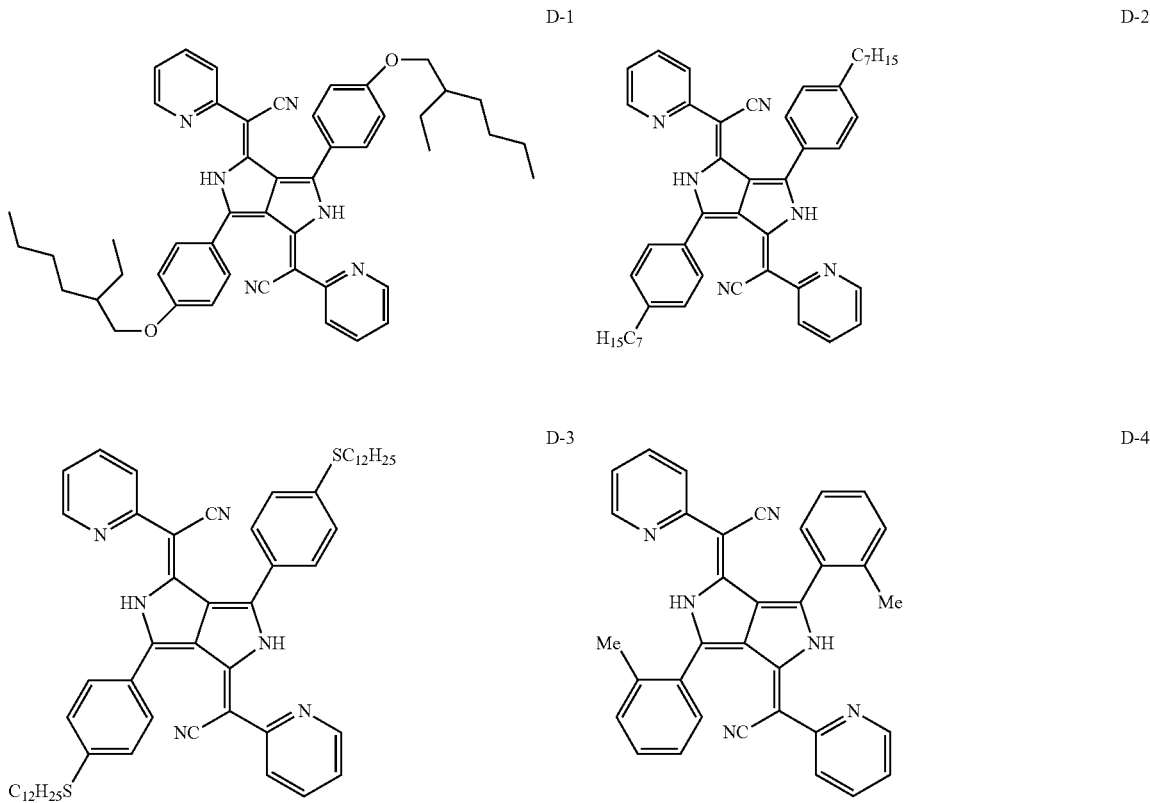

-continued
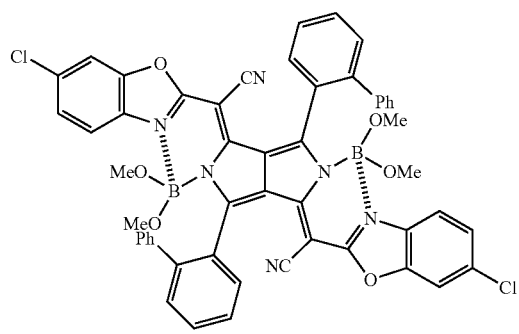
D-5
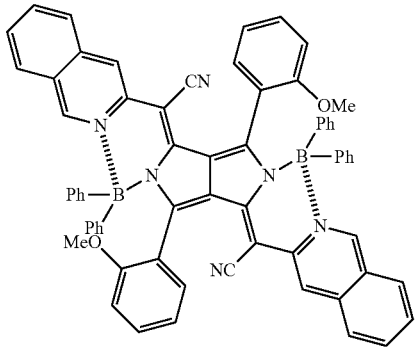
D-6
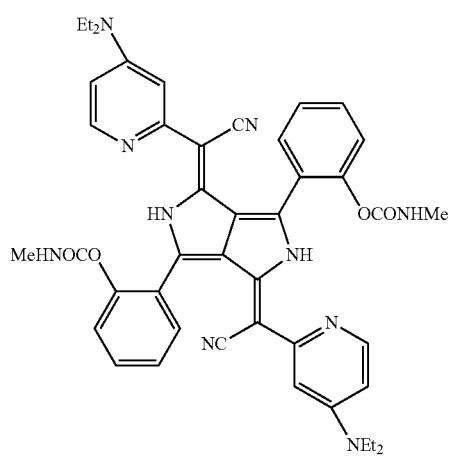
D-7
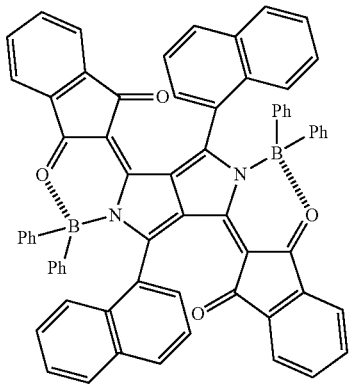
D-8
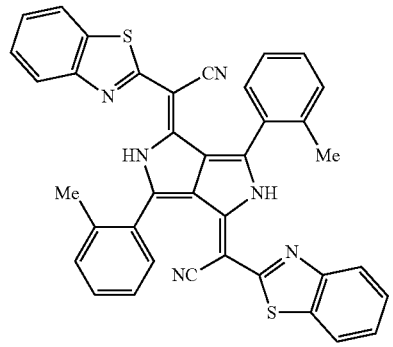
D-9
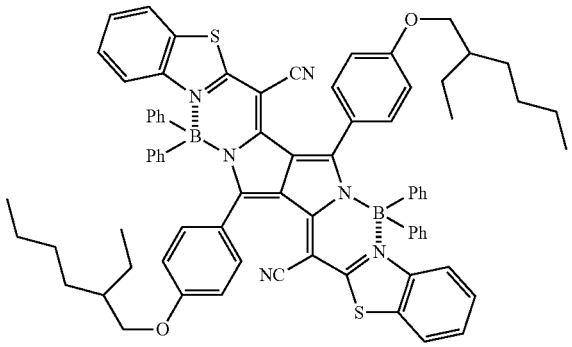
D-10
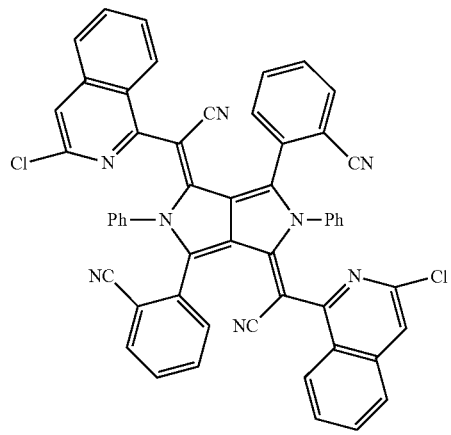
D-11
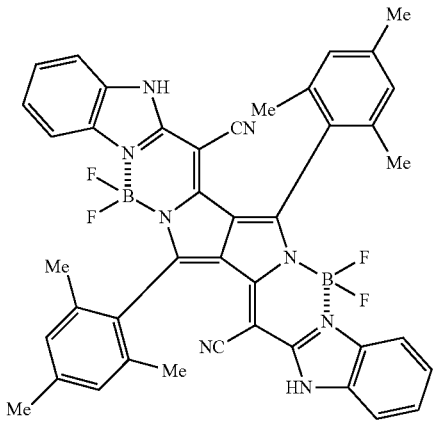
D-12

-continued
D-13
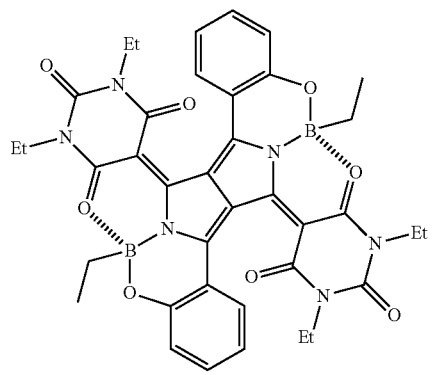
D-14
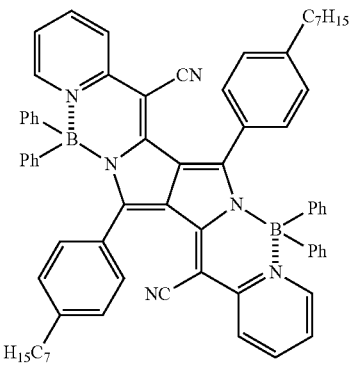
D-15
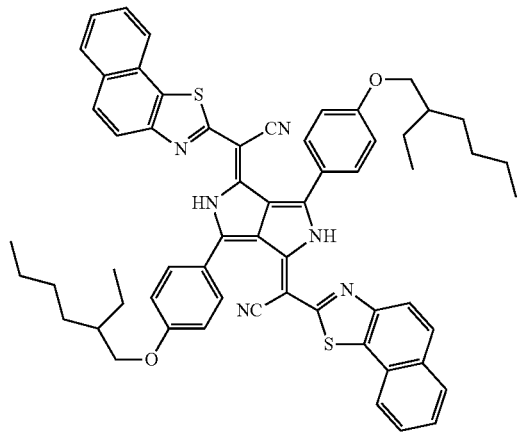
D-16
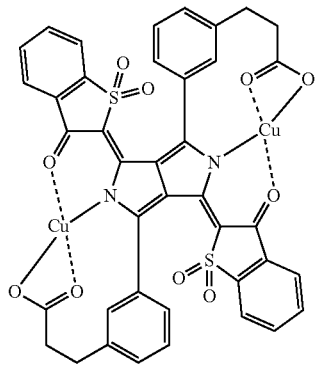
D-17
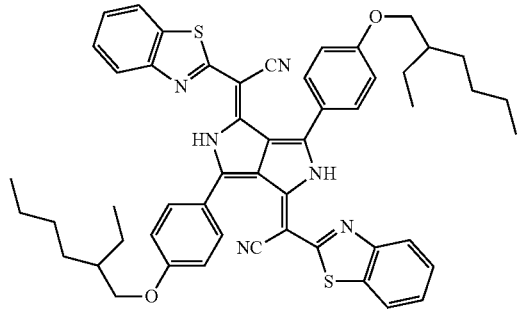
D-18
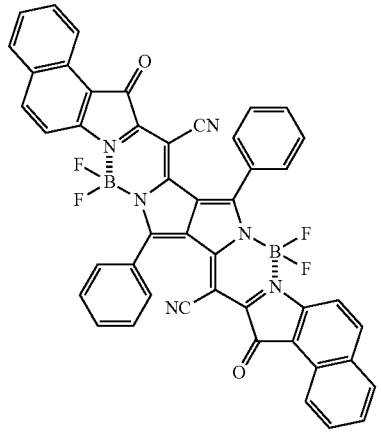
D-19
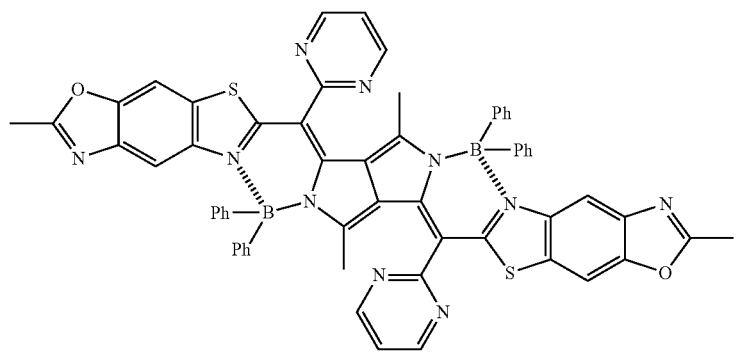

-continued
D-20
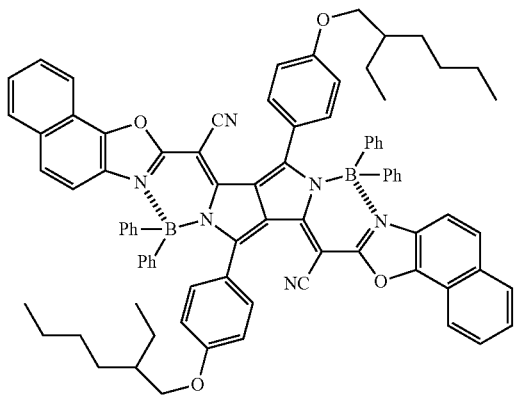
D-21
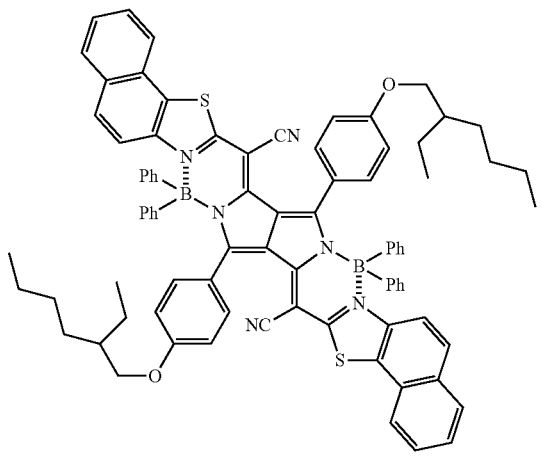
D-22
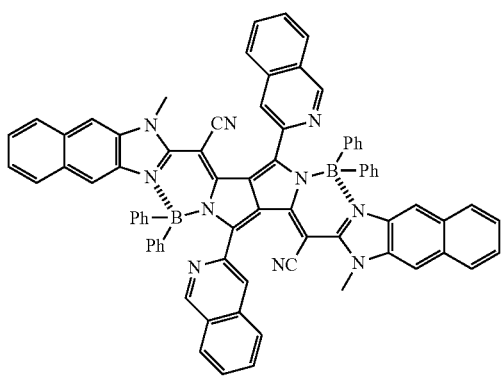
D-23
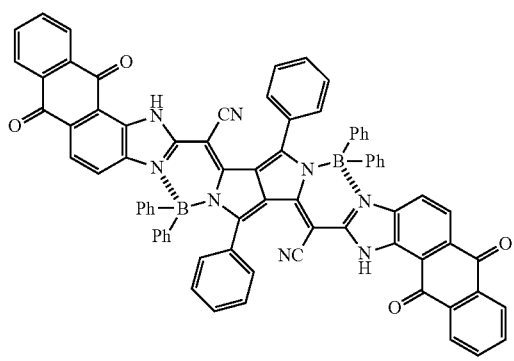
D-24
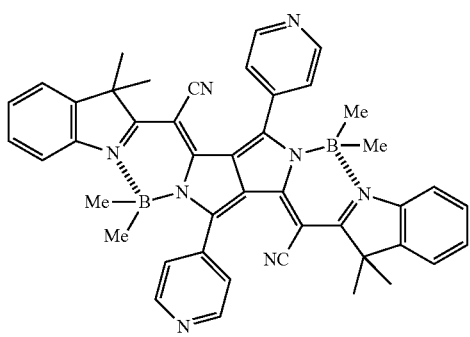
D-25
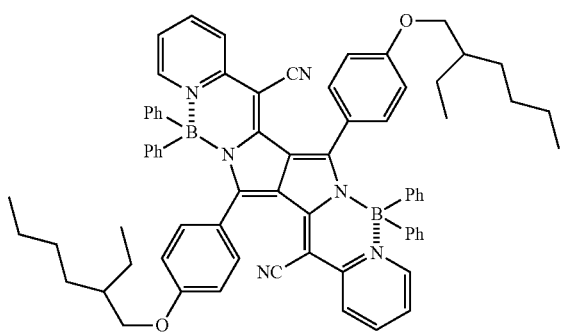
D-26
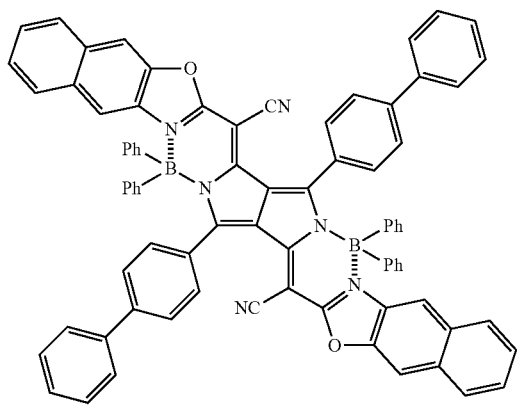
D-27
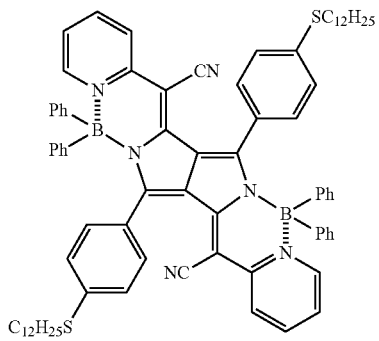

-continued
D-28
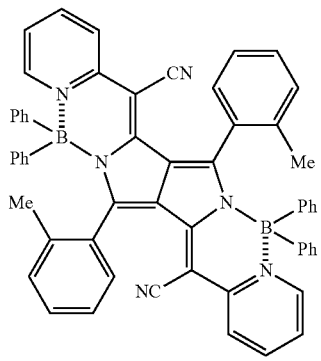
D-29
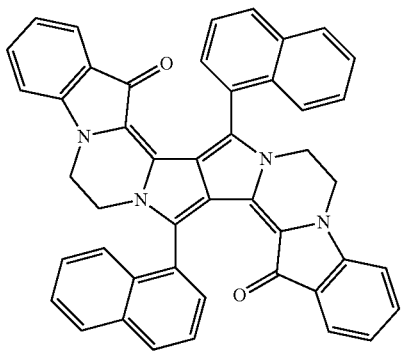
D-30
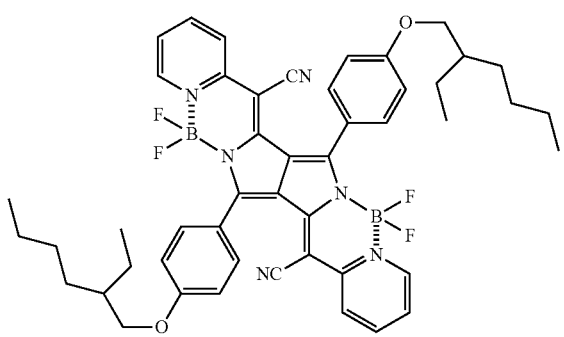
D-31
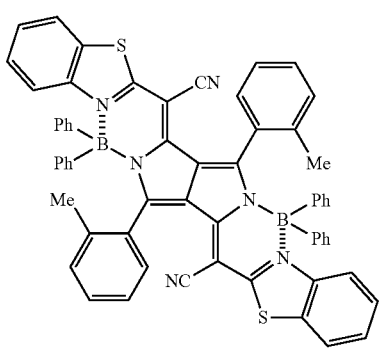
D-32
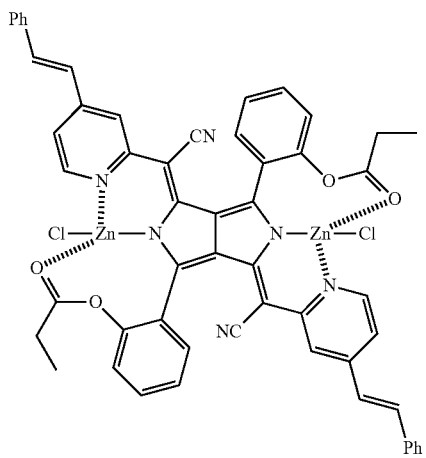
D-33
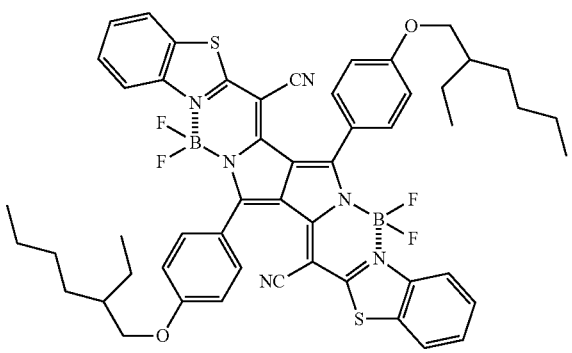
D-34
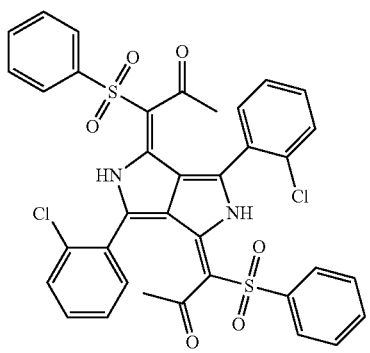
D-35
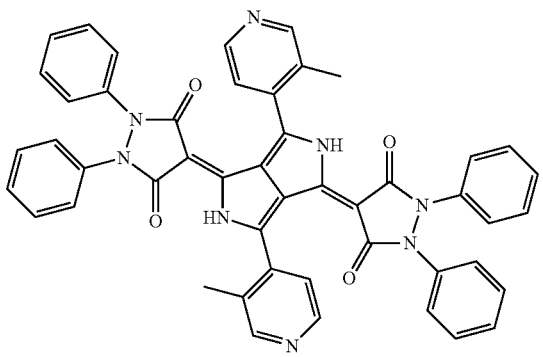

-continued
D-36
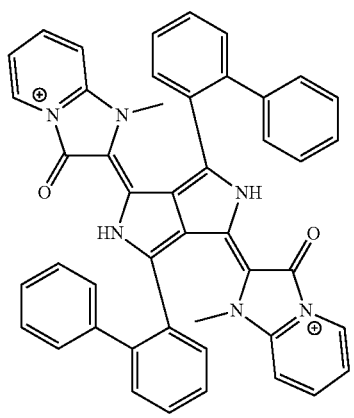
D-37
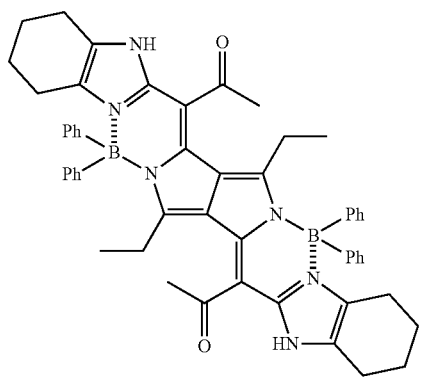
D-38
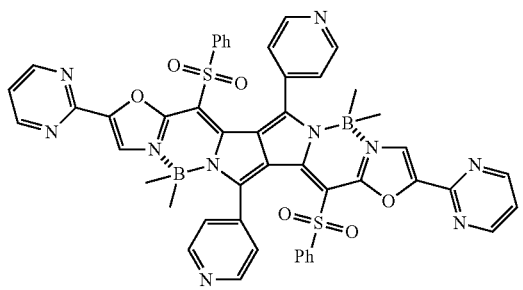
D-39
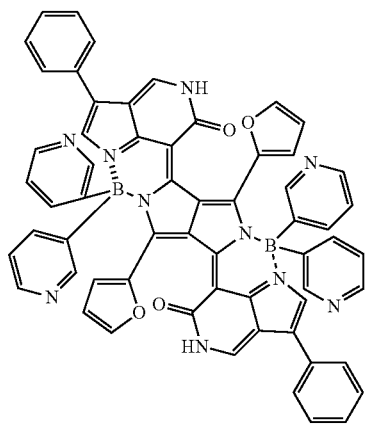
D-40
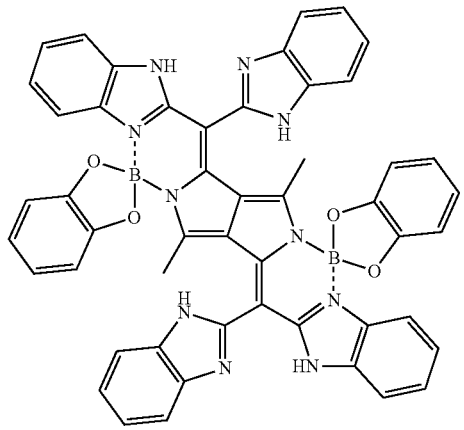
D-41
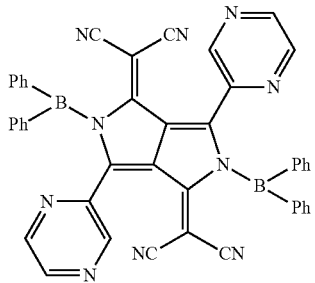
D-42
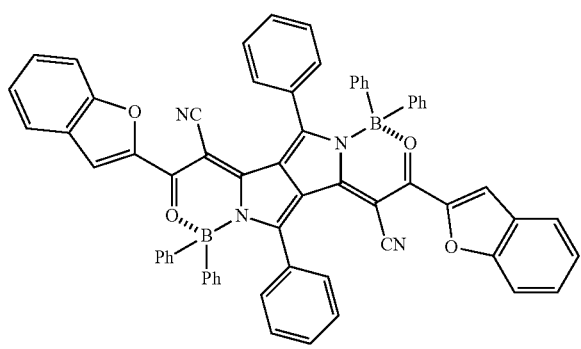

-continued
D-43
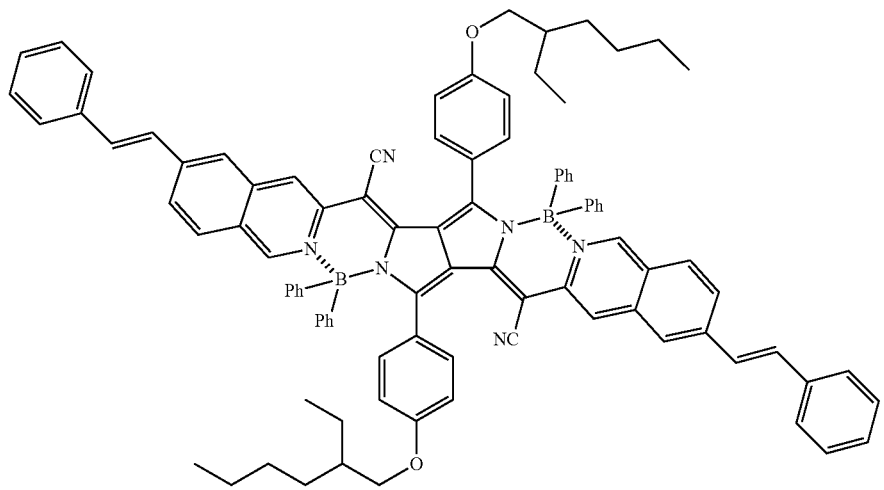
D-44
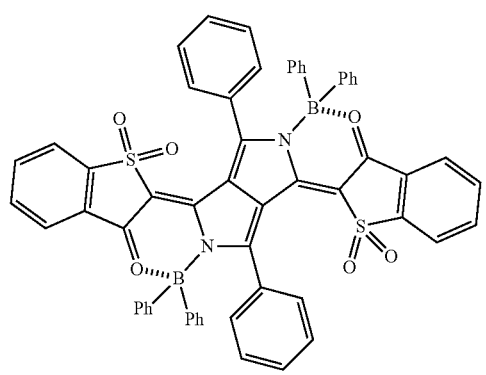
D-45
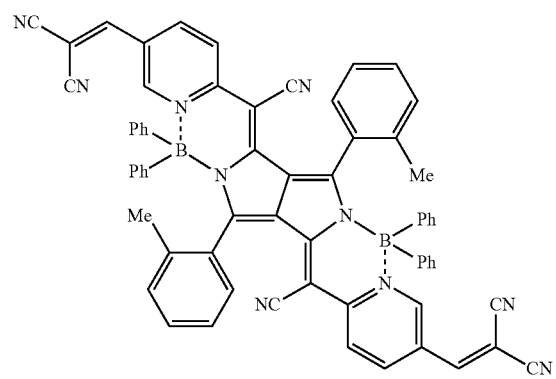
D-46
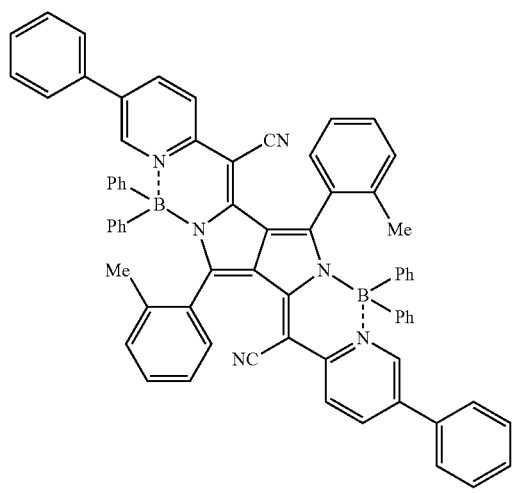
D-47
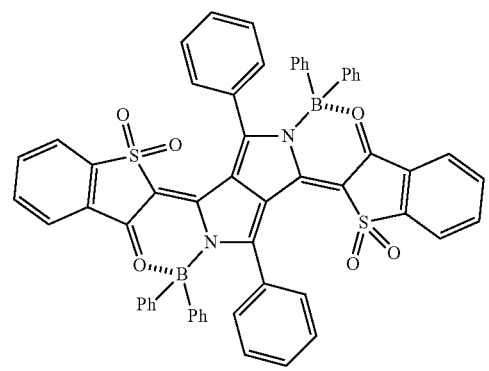

-continued
D-101
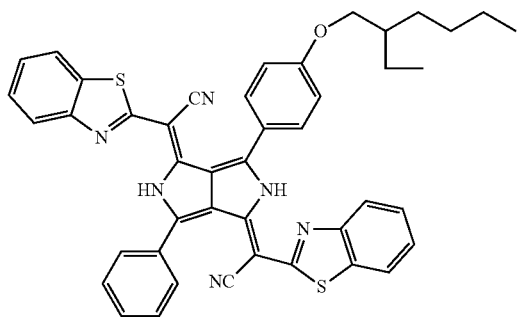
D-102
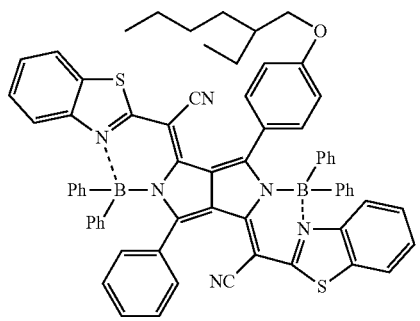
D-103
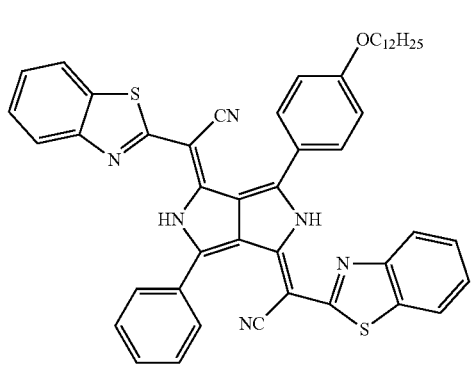
D-104
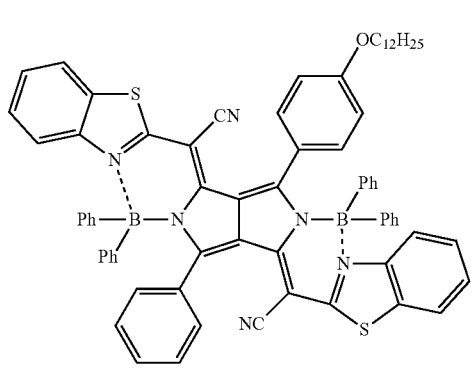
D-105
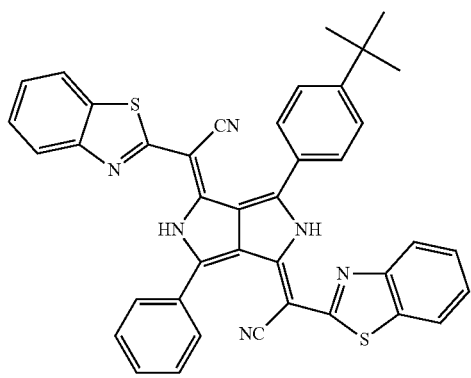
D-106
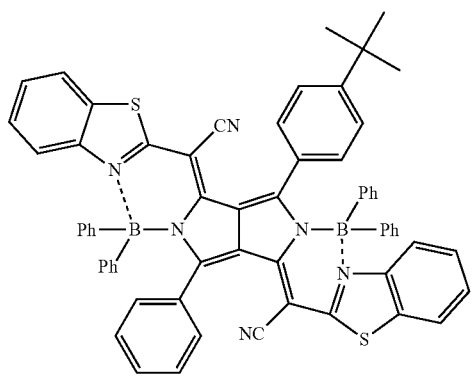
D-107
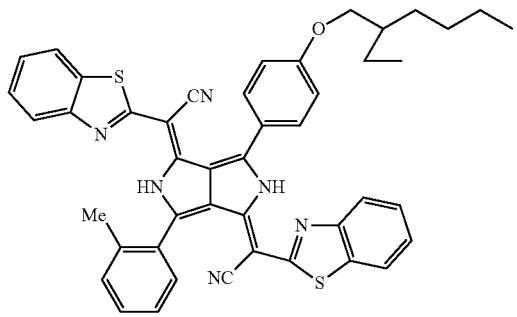
D-108
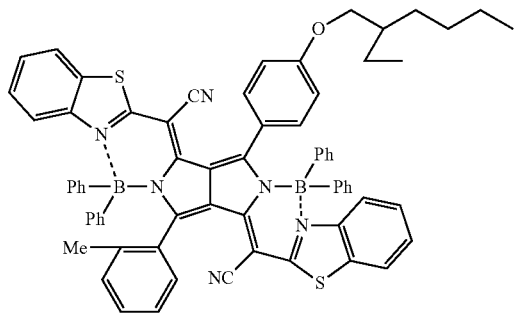

-continued
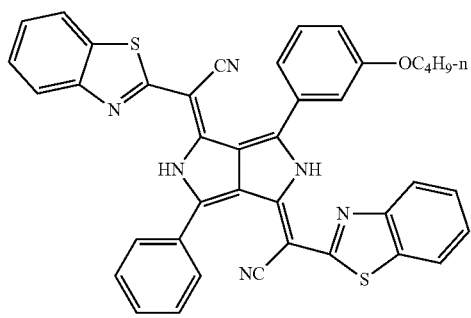
D-109
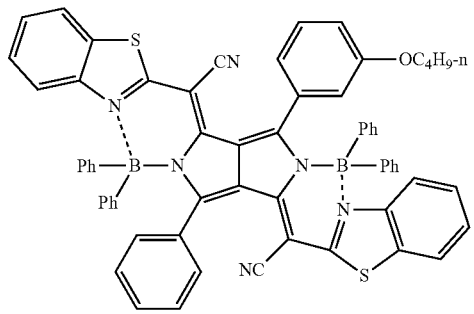
D-110
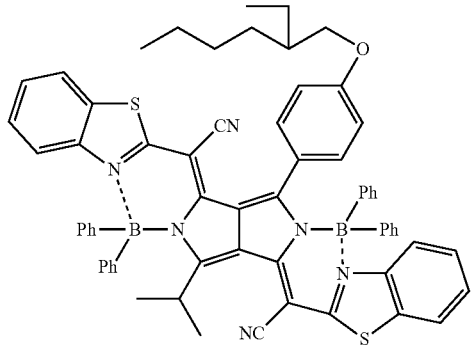
D-111
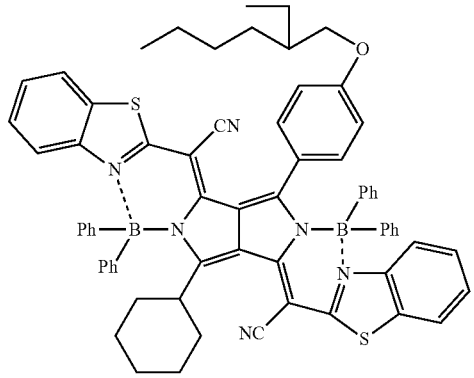
D-112
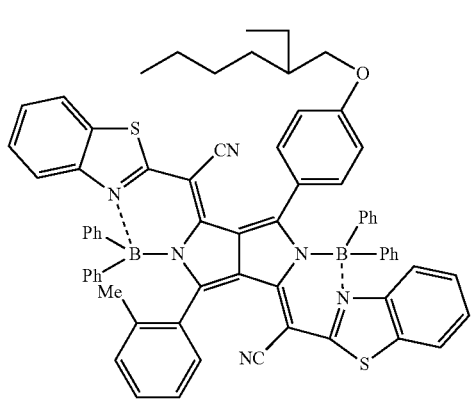
D-113
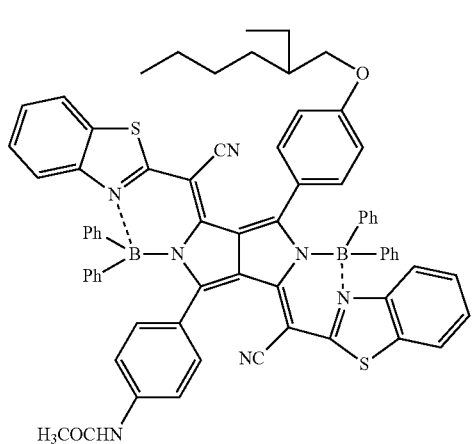
D-114
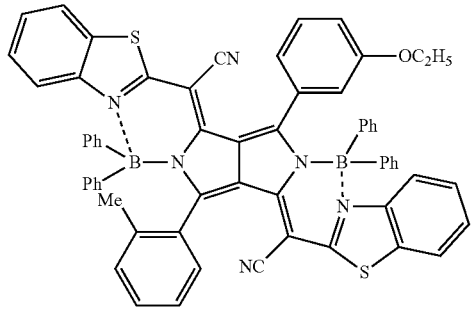
D-115
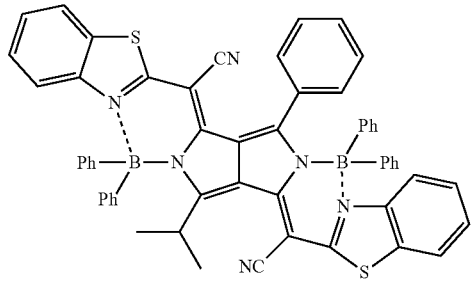
D-116

-continued
D-117
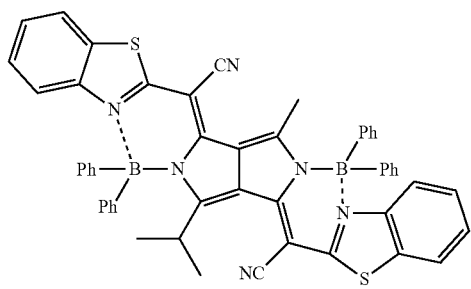
D-118
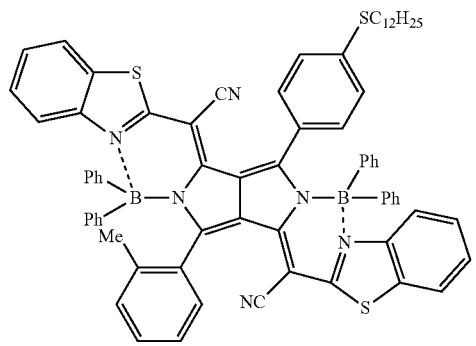
D-119
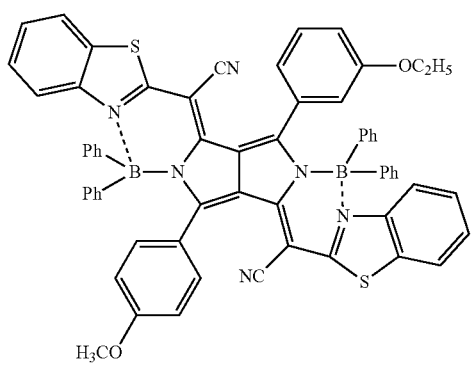
D-120
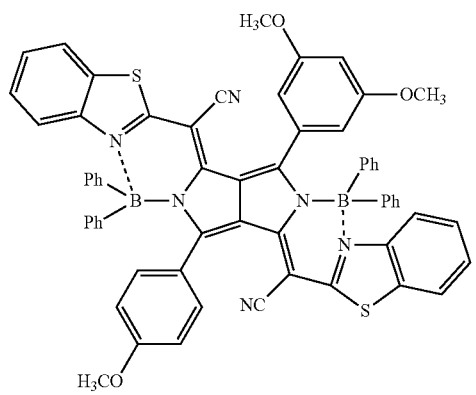
D-121
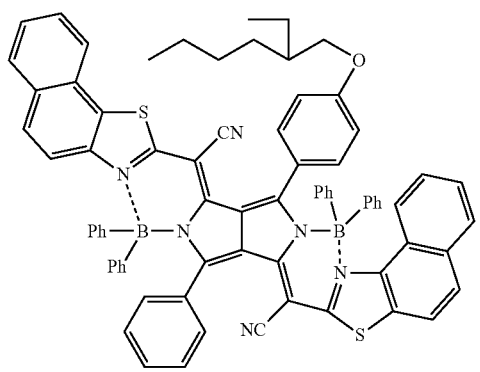
D-122
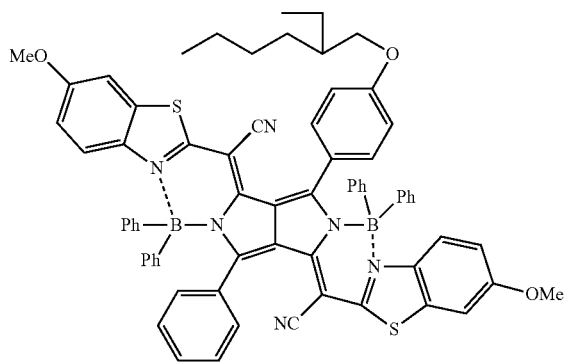
D-123
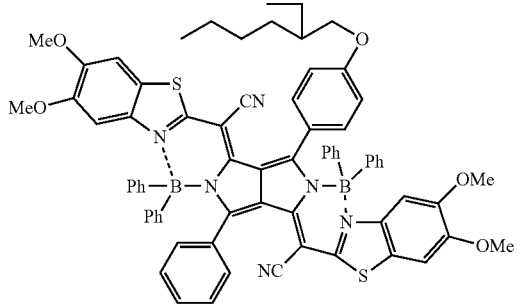
D-124
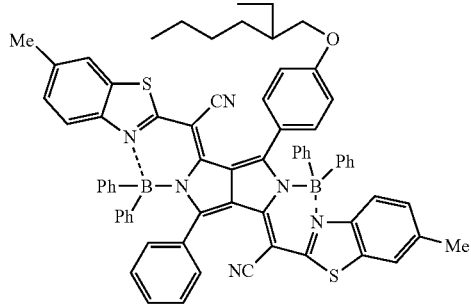

-continued
D-125 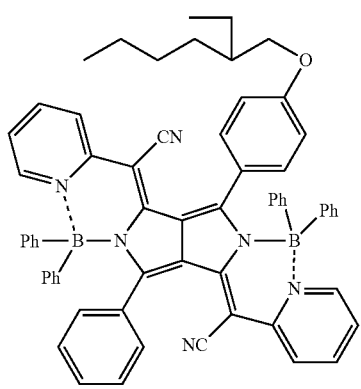
D-126 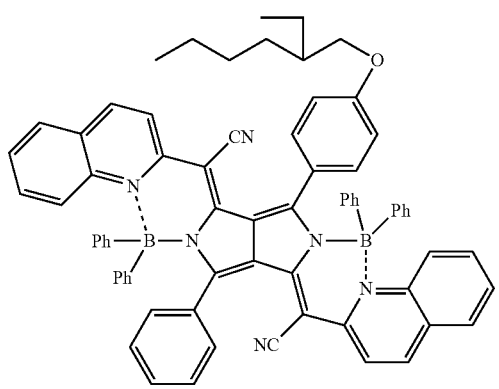
D-127 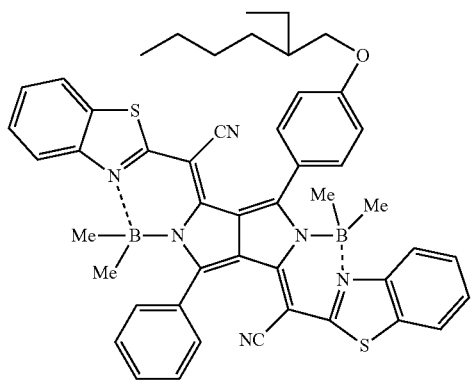
D-128 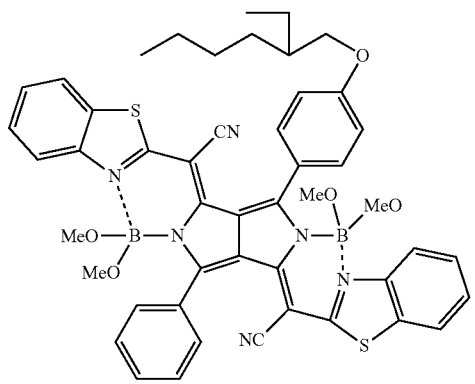
D-129 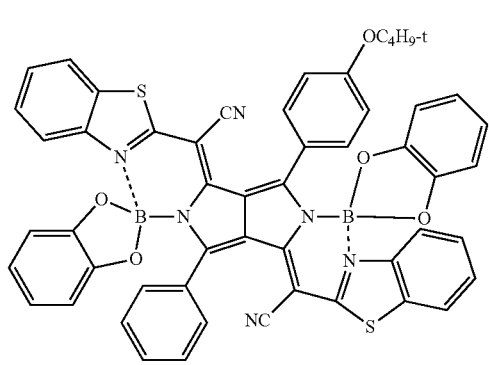
D-130 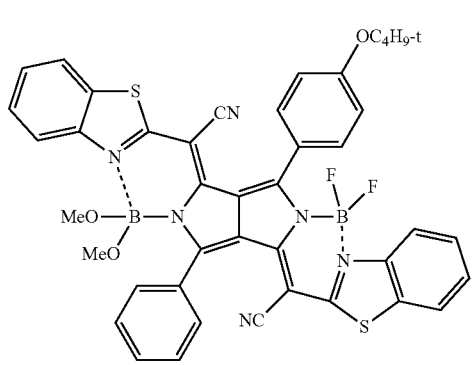
D-131 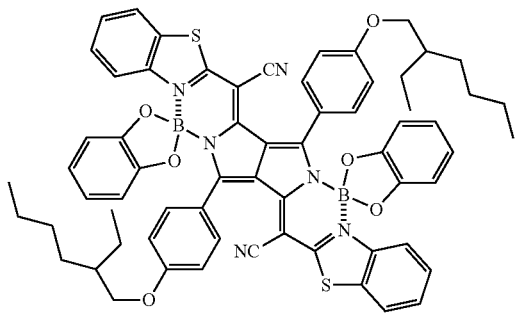
D-132 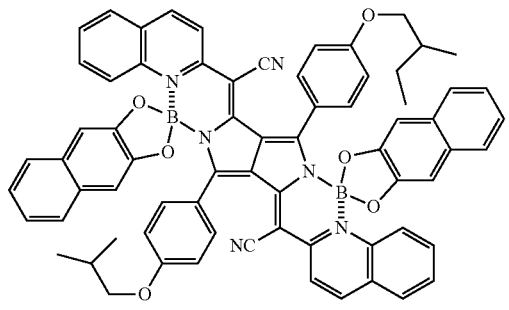

-continued
D-133
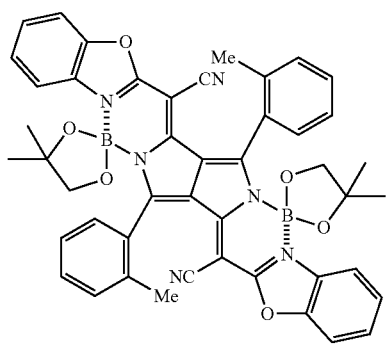
D-134
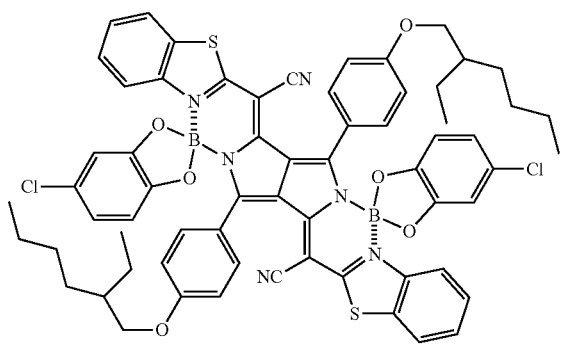
D-135
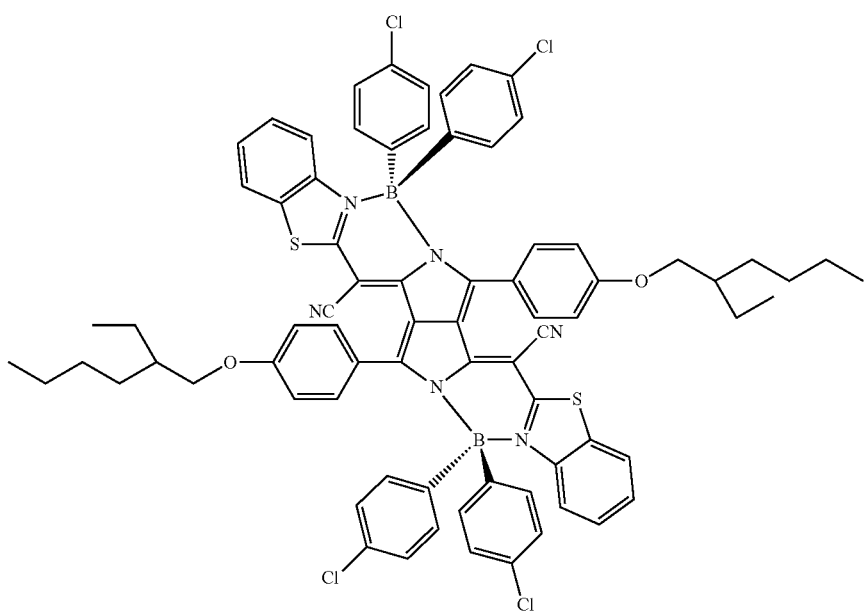
D-136
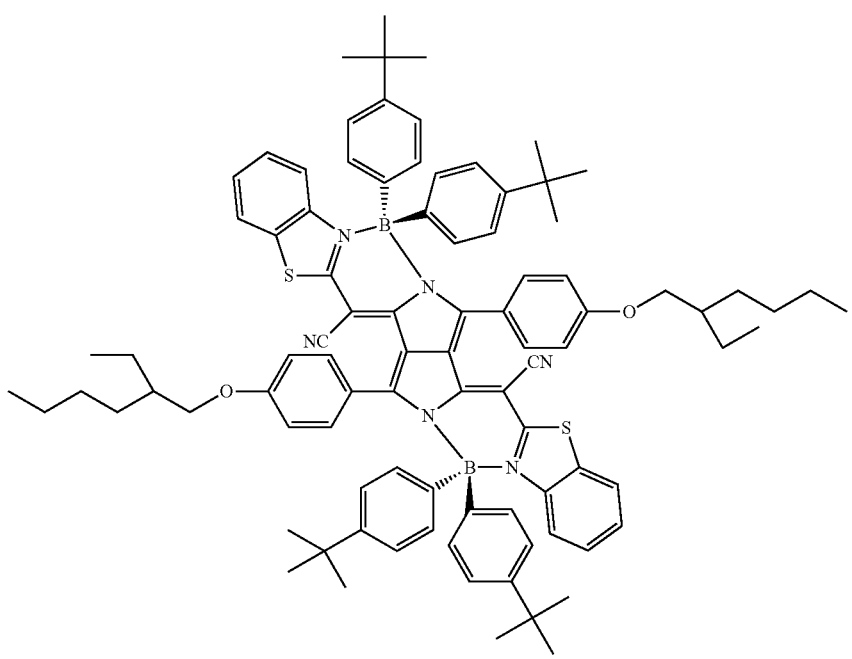

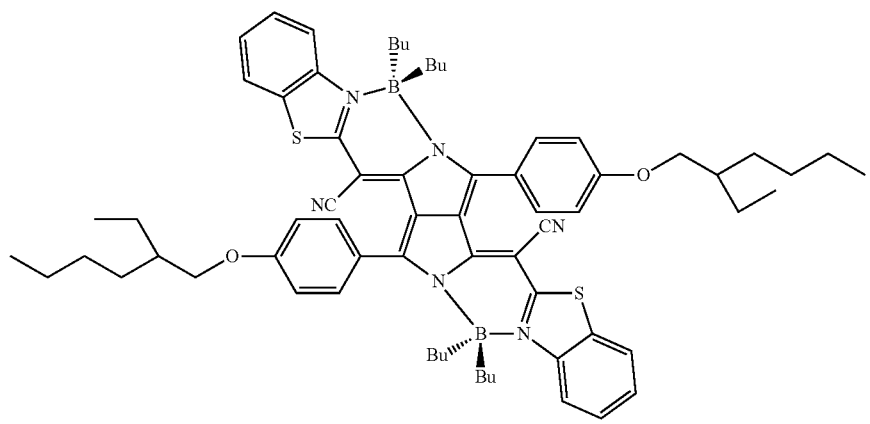
D-137
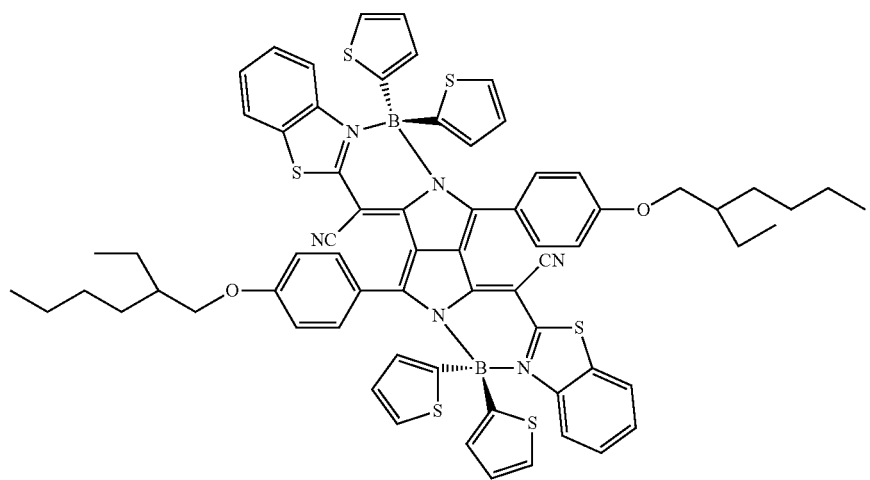
D-138
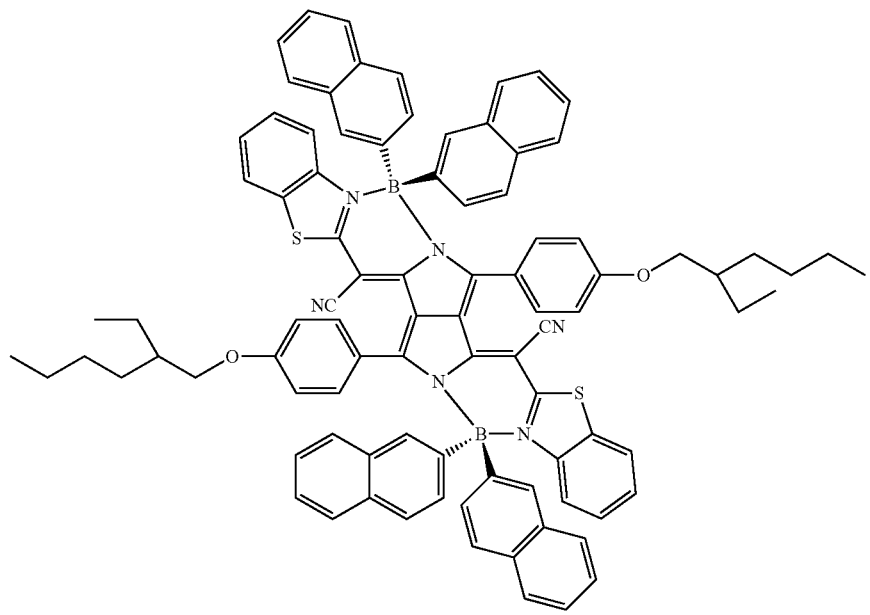
D-139

-continued
D-140
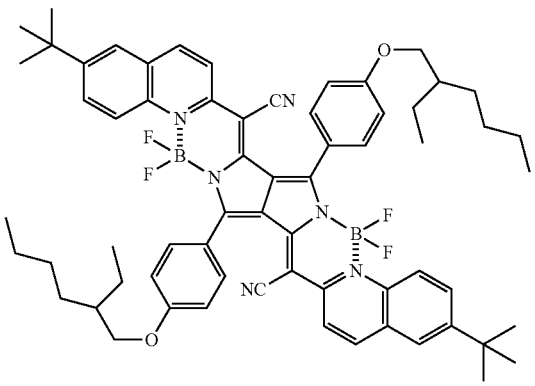
D-141A
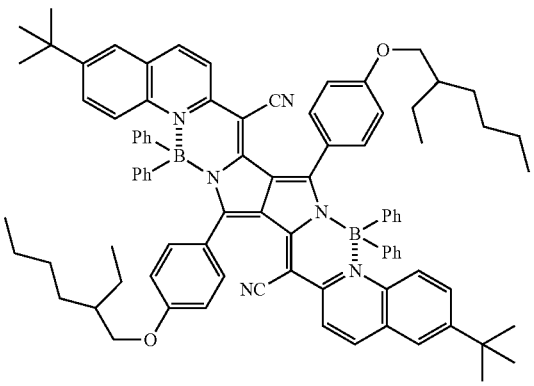
D-141B
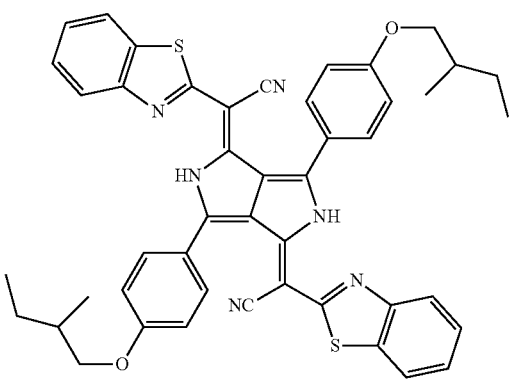
D-142
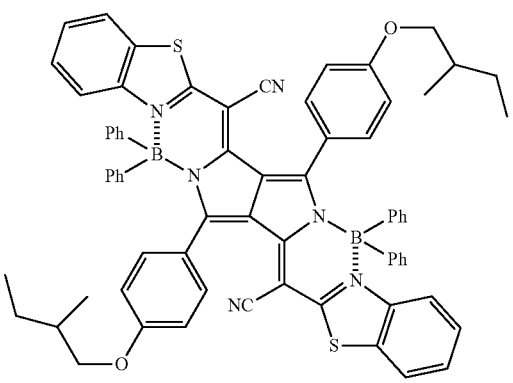
D-143
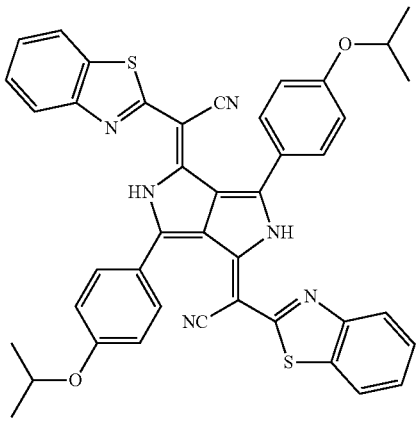
D-144
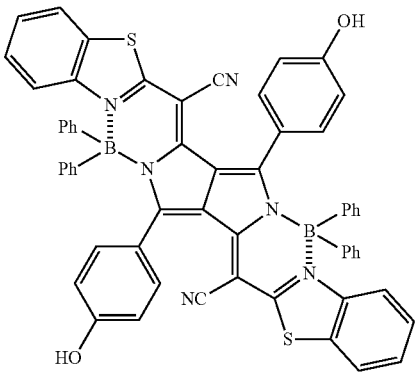
D-145
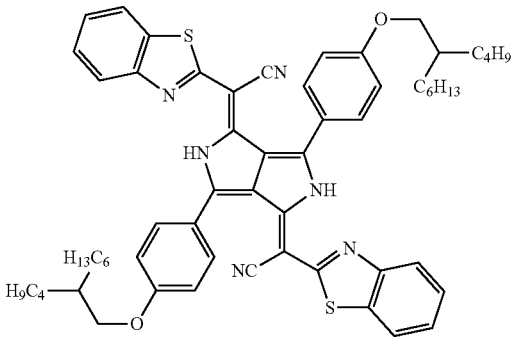
D-146
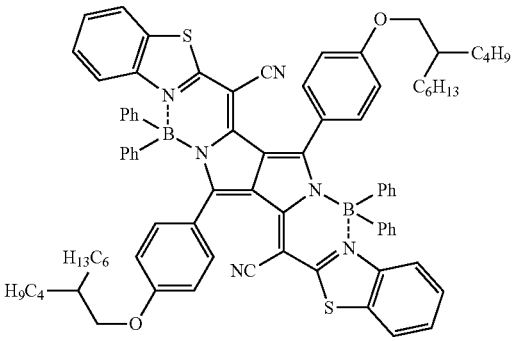

-continued
D-147
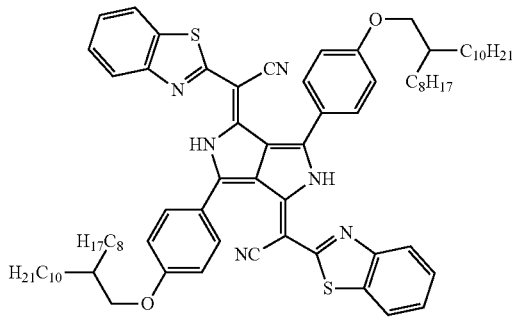
D-148
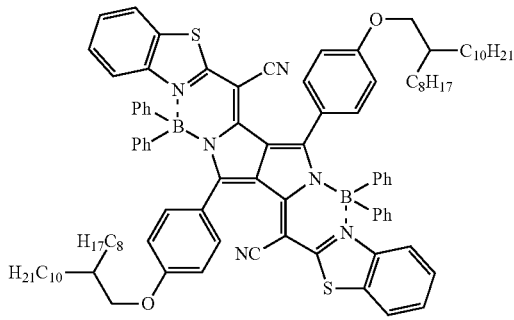
D-149
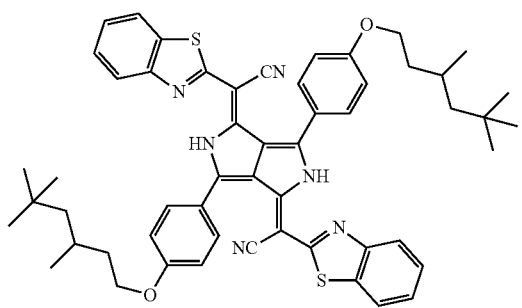
D-150
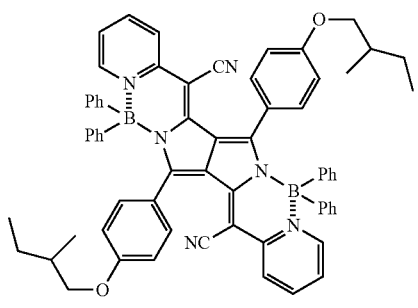
D-151
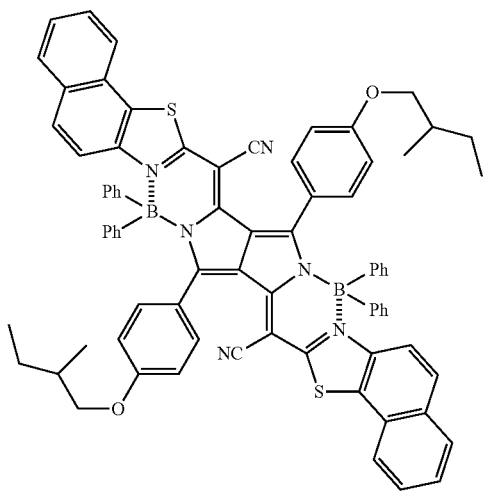
D-152
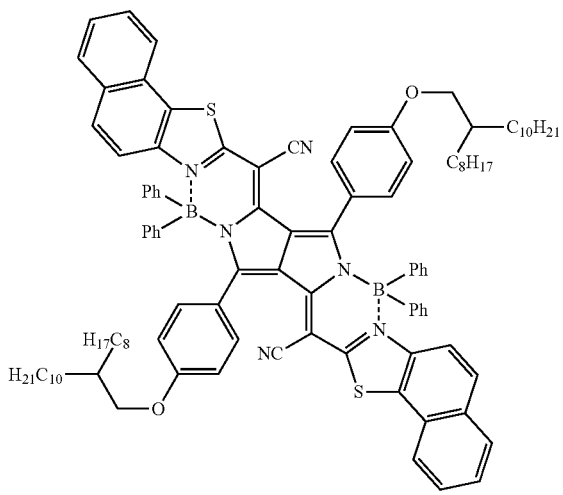
D-153
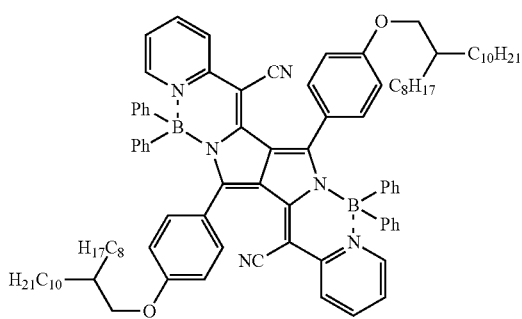

Hereinafter, a method of synthesizing the near-infrared absorptive dye represented by any one of formulae (1) to (4) will be described.

The near-infrared absorptive dye may be synthesized by condensing an active methylene compound with the corresponding diketopyrrolopyrrole compound and, as the case may be, further causing the resultant to react with a boron or a metal. The diketopyrrolopyrrole compound may be synthesized by a method described on pages 160 to 163 of "High Performance Pigments", Wiley-VCH, 2002. More specifically, the compound may be synthesized by a method in U.S. Pat. No. 5,969,154 or JP-A-9-323993. The condensation reaction between the diketopyrrolopyrrole compound and the active methylene compound or the subsequent boronization may be attained in accordance with the description of Non-Patent Document, Angewante Chemie International Edition of English, vol. 46, pp. 3750-3753 (2007) or a method described in Examples of the present invention. A reagent for the boronization may be synthesized with reference to J. Med. Chem., vol. 3, pp. 356-360 (1976). For example, bromocatechol borane may be commercially available from Tokyo Chemical Industry Co., Ltd.

The near-infrared absorptive dye has the absorption maximum of preferably from 700 to 1,200 nm, more preferably from 700 to 1,000 nm, though it is not particularly limited. It is preferable that the near-infrared absorptive dye selectively absorbs infrared rays having a wavelength of 700 nm or longer and 1,000 nm or shorter. The near-infrared absorptive dye has the molar absorption coefficient $\epsilon$ of preferably from 50,000 to 500,000, more preferably from 100,000 to 300,000, though it is not particularly limited.

The content of the near-infrared absorptive dye in the curable composition of the present invention can be appropriately adjusted according to the need, and the amount is preferably 0.01 to 50% by mass, more preferably 0.1 to 30% by mass in the curable composition. When the content is set within the above range, a significant near-infrared absorptivity can be favorably given to the composition and at the same time invisibility can be favorably given thereto.

In the curable composition of the present invention, the content of the near-infrared absorptive dye is desirably used in a fine-particle-dispersion state. By using it in a fine-particle-dispersion state, advantages including that durability of the compound is improved and maximum absorption wavelength is shifted to a longer wavelength can be obtained. The near-infrared absorptive dye that is used in the present invention preferably has a number average particle diameter of 1 to 500 nm, more preferably 10 to 200 nm, and still more preferably 10 to 100 nm. When the number average particle diameter of a fine-particle is 1 nm or more, surface energy of the particle is lowered, and thus aggregation cannot easily occur. As a result, it is preferable in that dispersing of the fine particles becomes easy and at the same time it becomes easy to maintain stably the dispersion state. Furthermore, when the number average particle diameter of a fine particle is 200 nm or shorter, particle scattering effect is reduced to yield a sharp absorption spectrum, and therefore preferable.

The fine-particle dispersion of the near-infrared absorptive dye may be produced by using methods described in detail, for example, in "Ganryou Bunsan Gijyutsu—Hyoumenshori to Bunsanzai no Tsukaikata oyobi Bunsanseihyouka—(Technology of Pigment Dispersion—Surface Treatment and Way of Using Dispersant and Evaluation of Dispersion Properties—)" published by Kabushiki-kaisha Gijutsu Jouhoukyoukai; "Ganryou no Jiten (Encyclopedia of Pigment)" published by Kabushiki-kaisha Asakura Shoten; and "Saisin [Ganryou Bunsan] Jitsumu Nouhau-Jireisyu (The Newest [Pigment Dispersion] Practical Know-how and Case Examples" published by Kabushiki-kaisha Gijutsu Jouhoukyoukai. In order to obtain the fine-particle dispersion, a usual dispersion machine can be used. Examples of the dispersion machine include a ball mill, a vibration ball mill, a planetary ball mill, a sand mill, a colloid mill, a jet mill, and a roller mill. For example, JP-A-52-92716 and a pamphlet of WO88/074794 disclose such dispersion machines. It is preferable to employ a medium dispersion machine of upright or horizontal type.

For the purpose of improving dispersion stability of the fine-particle dispersion including near-infrared absorptive dye, it is preferable to add a dispersant thereto. Examples of the dispersant may include a hydroxyl group-containing carboxylic acid ester, a salt of a long-chain polyaminoamide and a high molecular weight acid ester, a salt of a high molecular weight polycarboxylic acid, a salt of a long-chain polyaminoamide and a polar acid ester, a high molecular weight unsaturated ester, a copolymerized polymer, a modified polyurethane, a modified polyacrylate, a polyetherester-type anionic surfactant, a salt of a naphthalene sulfonic acid formalin condensate, an aromatic sulfonic acid formalin condensate, a polyoxyethylene alkylphosphoric ester, polyoxyethylene nonylphenyl ether, and stearylamine acetate.

Specific examples of the dispersant include a commercial product; organosiloxane polymers (e.g., KP341 (trade name), produced by Shin-etsu Chemical Industry Co., Ltd.); (meth) acrylic (co)polymers (e.g., Polyflow No. 75, No. 90 and No. 95 (trade names), produced by Kyoeisha Chemical Industry Co., Ltd.); cationic surfactants (e.g., W001 (trade name), produced by Yusho Co., Ltd.); nonionic surfactants, such as polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, and sorbitan fatty acid esters; anionic surfactants, such as WO04, WO05 and WO17 (trade names, produced by Yusho Co., Ltd.); polymeric dispersants, such as EFKA-46, EFKA-47, EFKA-47EA, EFKA POLYMER 100, EFKA POLYMER 400, EFKA POLYMER 401, and EFKA POLYMER 450 (trade names, produced by Morishita Industries Co., Ltd.), and Disperse Aid 6, Disperse Aid 8, Disperse Aid 15, and Disperse Aid 9100 (trade names, produced by San Nopco Limited); various kinds of Solsperse dispersants, such as Solsperse 3000, 5000, 9000, 12000, 13240, 13940, 17000, 24000, 26000, 28000, 32000, 39000, 71000 and 55000 (trade names, produced by Avecia); ADEKA PLURONIC L31, F38, L42, L44, L61, L64, F68, L72, P95, F77, P84, F87, P94, L101, P103, F108, L121, P-123 (trade names, produced by ADEKA CORPORATION), and BYK168 (trade name, produced by BYK Japan KK).

These dispersants may be used singly or as a mixture of two or more thereof. The fine-particle dispersion can be prepared by adding a near-infrared absorptive dye and a dispersant to a dispersion medium and dispersing them by using a dispersion machine. The blending amount of the dispersion medium added to a near-infrared absorptive dye can be any amount which provides the near-infrared absorptive dye with desired particle diameter. The dispersant is preferably blended in an amount of 1 to 150 parts by mass to the total amount of 100 parts by mass of the near-infrared absorptive dye and the dispersion medium.

Furthermore, it is also possible to form a curable composition in which a near-infrared absorptive dye is dispersed in a solution including a polymerizable monomer or a polymerizable binder resin and cure the composition under prescribed conditions of active energy ray and heat, and the like.

<Polymerizable Monomer>

The curable composition of present invention may preferably include polymerizable monomer. The polymerizable monomer is not particularly limited, but preferably may contain at least one selected from a (meth)acrylic monomer, an epoxy monomer, and an oxetanyl monomer, considering that these monomers are allowed to have a variety of substituents and are easily available.

The polymerizable monomer is preferably a monomer having two or more polymerizing groups (hereinafter, also referred to as "bi- or higher-functional monomer"). The polymerizable monomer is not particularly limited as long as it can be polymerized by an active energy ray and/or heat, but is more preferable a monomer having three or higher-functional groups (hereinafter, also referred to as "tri- or higher-functional monomer") considering the strength and solvent resistance of a resulting film, and the like.

The foregoing polymerizable groups are not particularly limited, but as described above, an acryloyloxy group, a methacryloyloxy group, an epoxy group, or an oxetanyl group is particularly preferable.

Specific examples of the polymerizable monomer may include: epoxy group-containing monomers described in paragraph numbers [0061] to [0065] of JPA-2001-350012; acrylate monomers and methacrylate monomers described in paragraph number of JP-A-2002-371216; oxetanyl group-containing monomers described in JP-A-2001-220526, JP-A-2001-310937, JP-A-2003-341217 (Paragraph Nos. [0021] to [0084]), and JP-A-2004-91556 (Paragraph Nos. [0022] to [0058]); and monomers described in "Hannousei Monomer No Shijo Tenbou" published by CMC Publishing Co., Ltd.

Examples of the epoxy monomer may include a bisphenol A epoxy resin, a bisphenol F epoxy resin, a brominated bisphenol A epoxy resin, a bisphenol S epoxy resin, a diphenylether epoxy resin, a hydroquinone epoxy resin, a naphthalene epoxy resin, a biphenyl epoxy resin, a fluorene epoxy resin, a phenolnovolak epoxy resin, an orthocresolnovolak epoxy resin, a trishydroxyphenylmethane epoxy resin, a tri-functional epoxy resin, a tetraphenylolethane epoxy resin, a dicylopentadiene phenol epoxy resin, a hydrogenated bisphenol A epoxy resin, a bisphenol A nucleus-containing polyol epoxy resin, a polypropyleneglycol epoxy resin, a glycidylester epoxy resin, a glycidylamine epoxy resin, a glyoxal epoxy resin, an alicyclic epoxy resin, and a heterocyclic epoxy resin.

As (meth)acrylic monomers, examples of tri-functional monomers may include trimethylolpropane triacrylate, trimethylolpropane PO (propylene oxide)-modified triacrylate, trimethylolpropane EO (ethylene oxide)-modified triacrylate, trimethylolpropane trimethacrylate, pentaerythritol triacrylate. Examples of tetra or higher-functional monomers may include pentaerythritol tetraacrylate, pentaerythritol tetramethacrylate, dipentaerythritol pentaacrylate, dipentaerythritol pentamethacrylate, dipentaerythritol hexaacrylate, and dipentaerythritol hexamethacrylate.

The oxetanyl group-containing monomer as an oxetanyl monomer may preferably be any of the compounds described in paragraph numbers [0021] to [0084] of JP-A-2003-341217. In addition, any of the compounds described in paragraph numbers [0022] to [0058] of JP-A-2004-91556 may be used.

<Polymerizable Binder Resin>

In the curable composition of the present invention, the polymerizable binder resin that can be cured by a polymerization reaction may be used. For example, a binder resin that can be cured by polymerization may be used, such as a photocurable binder resin that can be polymerized and cured by an action of visible light, UV light, electron beam or the like, and a thermosetting binder resin that can be polymerized and cured by heating.

(1) Photocurable Binder Resin

The photocurable resin (photocurable binder resin) that can be polymerized and cured by an action of light such as UV-light or electron beam may be a polymer that initiates polymerization by itself upon light irradiation or a polymer that initiates polymerization by an action of another component such as a photo-polymerization initiator activated by light irradiation.

Various kinds of compounds having an ethylenically double bond have polymerization reactivity per se, and may be used as a photocurable resin. A prepolymer that is conventionally blended in an UV-light curable resin composition used in various fields such as ink, paint, or adhesive include radical polymerizable prepolymers, cationic polymerizable prepolymers, and thiol-ene addition-type prepolymers, and any of them may be used.

Among these, the radical polymerizable prepolymers are most easily available in the market. Examples thereof may include ester acrylates, ether acrylates, urethane acrylates, epoxy acrylates, amino resin acrylates, acrylic resin acrylates, and unsaturated polyesters.

(2) Thermosetting Binder Resin

As the thermosetting binder resin, a combination of a compound having two or more thermosetting functional groups within a molecule and a curing agent, is usually used. A catalyst capable of promoting the thermosetting reaction may be further added. As the thermosetting functional group, an epoxy group is preferably used. A polymer having no polymerization reactivity per se may be used with the above combination.

As the compound having two or more thermosetting functional groups within a molecule, an epoxy compound having two or more epoxy groups within a molecule is usually used. The epoxy compound having two or more epoxy groups within a molecule is an epoxy compound (including a so-called epoxy resin) having two or more, preferably from 2 to 50, and more preferably from 2 to 20 epoxy groups within a molecule. An epoxy group having an oxirane ring structure may be used as the epoxy group. Examples thereof may include glycidyl, oxyethylene, and epoxycyclohexyl groups. The epoxy compound may be known polyepoxy compounds that can be cured by a carboxylic acid. These epoxy compounds are widely disclosed, for example, in "Epoxy Jushi Handbook" edited by Jinpo Masaki, published by The Nikkan Kogyo Shinbun, Ltd. (1987) and others, and they may be used in the present invention.

In the curable composition of the present invention, only one or both of the polymerizable monomer and the binder resin may be used.

<Polymerization Initiator>

In the curable composition of the present invention, a polymerization initiator may be used so as to promote polymerization reaction of the polymerizable monomer and of the binder resin. The polymerization initiator may be selected as appropriate in accordance with the kind of the polymerizable monomer and the binder, and the polymerization pathway.

(1) Polymerization Initiator Suitable for Acrylate (Methacrylate) Monomer and Photocurable Binder Resin A polymerization initiator suitable for the acrylate monomer, the methacrylate monomer, and the photocurable binder resin may be a photo-polymerization initiator when polymerization reaction is carried out by an active energy ray, and may be a heat-polymerization initiator when polymerization reaction is carried out by heat. Examples of the photo-polymerization initiator may include the ones described in paragraph numbers [0079] to [0080] of JP-A-2006-28455. Preferable examples thereof include 2-trichloromethyl-5-(p-styrylstyryl)-1,3,4-oxadiazole, 2,4-bis(trichloromethyl)-6-[4'-(N, N-bisethoxycarbonyl methylamino)-3'-bromophenyl]-s-triazine, 2-methyl-1-phenyl-2-morpholinopropane-1-one, 2-methyl-1-[4-(hexyl)phenyl]-2-morpholinopropane-1-one, and 2-ethyl-2-dimethylamino-1-(4-morpholinophenyl)-butanone-1. Furthermore, a commercially available product like IRGACURE series (trade name: IRGACURE 907, IRGACURE 819 and IRGACURE 379, etc., all manufactured by Ciba-Geigy), or DAROCUR series (trade name: DAROCUR TPO, etc., manufactured by Ciba-Geigy) may be also suitably used for the invention.

As the heat-polymerization initiator, a generally known organic peroxide compound or azo compound may be used. Use of such a heat-polymerization initiator can improve the strength of a functional film (for example, color pixels). Besides the heat-polymerization initiator, a curing catalyst may be used such as imidazole. Only one organic peroxide or azo compound may be used, or two or more of such compounds may be used in combination. Here, the organic peroxide is a derivative of hydrogen peroxide (H—O—O—H), and is an organic compound having —O—O— bond within a molecule.

When the organic peroxides are classified by the chemical structure, ketone peroxide, peroxy ketal, hydroperoxide, dialkyl peroxide, diacyl peroxide, peroxy ester, and peroxy dicarbonate are exemplified. Preferable specific examples may include 3,3',4,4'-tetrakis(t-butylperoxycarbonyl)benzophenone, benzoyl peroxide, 2,2-bis(4,4-di-t-butylperoxycyclohexyl)propane, 1,1-bis(t-hexylperoxy)-3,3,5-trimethyl cyclohexane, t-butylperoxy benzoate, di-t-butylperoxy benzoate, di-t-butylperoxy isophthalate, t-butylperoxy acetate, t-hexylperoxy benzoate, t-butylperoxy-3,5,5-trimethyl hexanoate, t-butylperoxy laurate, t-butylperoxy isopropyl monocarbonate, t-butylperoxy-2-ethylhexyl monocarbonate, 2,5-bis(m-toluoylperoxy)hexane, 2,5-dimethyl-2,5-bis(benzolyperoxy)hexane, t-hexylperoxy isopropyl monocarbonate, t-butylperoxy isobutylate, 1,1,3,3-tetramethylbutylperoxy-2-ethyl hexanoate, t-hexylperoxy isopropyl monocarbonate, 2,5-dimethyl-2,5-bis(2-ethylhexanoylperoxy)hexane, t-butylperoxy-2-ethyl hexanoate, t-butylperoxy maleic acid, cyclohexanone peroxide, methylacetoacetate peroxide, methylhexanone peroxide, acetylacetone peroxide, 1,1-bis(t-hexylperoxy)cyclohexane, 1,1-bis(t-butylperoxy)-3,3,5-trimethyl cyclohexane, 1,1-bis(t-butylperoxy)-2-methylcyclohexanone, 1,1-bis(t-butylperoxy)cyclohexane, 2,2-bis(t-butylperoxy)butane, 2,2-bis(4,4-di-t-butylperoxy cyclohexyl)propane, diisopropylbenzene hydroperoxide, 1,1,3,3-tetramethylbutyl hydroperoxide, cumene hydroperoxide, and t-butylhydroperoxide. Further, preferable examples may include peroxy ketal compounds such as 2,2-bis(4,4-di-t-butylpeoxycyclohexyl) propane, diacyl peroxide compounds such as benzoyl peroxide, and peroxy ester compounds such as t-butylperoxy benzoate.

Examples of the azo compound may include the compounds described in paragraph numbers [0021] to [0023] of JP-A-5-5014. Among these compounds, preferable are a compound which has a moderately high decomposition temperature and which is stable at normal temperature but decomposes to generate a radical when heated and serves as a polymerization initiator. Among the organic peroxide compounds or the azo compounds (heat polymerization initiators), use of a compound that has a relatively high half-life temperature (preferably 50° C. or higher, and more preferably 80° C. or higher) provides a preferable composition that does not change its viscosity with time. Examples of preferable heat-polymerization initiators may include azobis(cyclohexane-1-carbonitrile).

The content of the photo-polymerization initiator and/or the heat-polymerization initiator suitable for the acrylate monomer, the methacrylate monomer, and the photocurable binder resin is preferably from 0.1% to 10% by mass with respect to 100% by mass of the polymerization monomer and/or binder resin, and more preferably from 0.3% to 5% by mass. With the above blending amount, an effect as a polymerization initiator can be fully exhibited, and therefore a change in viscosity of the curable composition over time can be inhibited.

Only a single polymerization initiator may be used, or alternatively, two or more polymerization initiators may be used in combination.

(2) Polymerization Initiator Suitable for Oxetanyl Group-Containing Monomer or Binder Resin As the polymerization initiator suitable for the oxetanyl group-containing monomer or the binder resin, a compound that generates acid is preferable. Examples of the acid to be generated may include a carboxylic acid, a sulfonic acid, a phosphoric acid, a phosphoric acid monoester, a phosphoric acid diester, a sulfuric acid, a sulfuric acid monoester, a sulfinic acid, a hydrochloric acid, a nitric acid, a boric acid, a trifluoroboric acid, a boron complex, an antimony derivative, and a hexafluorophosphoric acid.

Among them, for effectively curing the oxetanyl group-containing monomer (oxetane compound) by an action of light and/or heat, a hydrochloric acid, a sulfonic acid, or an acid that contains a boron atom or a phosphorous atom is preferable, and an acid that contains a phosphorous atom is most preferable.

Examples of specific compounds (photo-polymerization initiators) that generate such an acid may include an organohalogen compound, an oxydiazole compound, an organic borate compound, a disulfone compound, an oxime ester compound, and an onium salt compound. Among these, an onium salt acid generator such as iodonium salt or sulfonium salt is suitably used.

Specific examples of the organohalogen compound may include compounds described in the following documents: "Bulletin of Chemical Society of Japan" 42, 2924 (1969) by Wakabayashi et al; U.S. Pat. No. 3,905,815; JP-B-46-4605 ("JP-B" means examined Japanese patent publication); JP-A-48-36281; JP-A-55-32070; JP-A-60-239736; JP-A-61-169835; JP-A-61-169837; JP-A -62-58241; JP-A-62-212401; JP-A-63-70243; JP-A-63-298339; "Journal of Heterocyclic Chemistry" 1 (No. 3), 1970 by M. P. Hutt; and others. In particular, an oxazole or s-triazine compound having a trihalomethyl group can be mentioned.

Specific examples of the organic borate compound may include organic borates described in, for example, JP-A-62-143044, JP-A-62-150242, JP-A-9-188685, JP-A-9-188686, JP-A-9-188710, JP-A-2000-131837, JP-A-2002-107916, Japanese Patent No. 2764769, and Japanese Patent Application No. 2000-310808, "Rad Tech'98, Proceeding Apr., 9-22, 1998, Chicago" by Kunz, Martin; organic boron sulfonium complex and organic boron oxosulfonium complexes described in JP-A-6-157623, JP-A-6-157564, and JP-A-6-175561; organic boron iodonium complexes described in JP-A-6-175554 and JP-A-6-175553; organic boron phosphonium complexes descried in JP-A-9-188710; and organic boron transition metal coordination complexes described in JP-A-6-348011, JP-A-7-128785, JP-A-7-140589, JP-A-7-306527, and JP-A-7-292014.

Examples of the disulfone compound may include compounds described, for example, in JP-A-61-166544 and JP-A-2002-328465 (Japanese Patent Application No. 2001-132318).

Examples of the oxime ester compound may include compounds described, for example, in J. C. S. Perkin II, 1653-1660 (1979); J. C. S. Perkin II, 156-162 (1979); Journal of Photopolymer Science and Technology, 202-232 (1995); JP-A-2000-66385; JP-A-2000-80068; and JP-T-2004-534797 ("JP-T" means a published Japanese translation of PCT international application).

Examples of the onium salt compound may include a diazonium salts described in Photogr. Sci. Eng., 18, 387 (1974) by S. I. Schlesinger, and Polymer, 21, 423 (1980) by T. S. Bal et al; ammonium salts described in, for example, U.S. Pat. No. 4,069,055 and JP-A-4-365049; phosphonium salts described in U.S. Pat. Nos. 4,069,055 and 4,069,056; iodonium salts described in EP Patent No. 104,143, U.S. Pat. No. 339,049, U.S. Pat. No. 410,201, JP-A-2-150848 and JP-A-2-296514.

An iodonium salt suitably used in the present invention is a diaryl iodonium salt, which is preferably substituted by two or more electron-donating substituents such as alkyl, alkoxy, and aryloxy groups, from the viewpoint of safety. More preferably, the diaryl iodonium salt is substituted by three or more alkoxy groups, and most preferably by four or more alkoxy groups. Further, another preferable diaryl iodonium salt that has excellent photocurable property is an iodonium salt in which at least one of the diaryl forms a part of a chromophore having an absorption at a wavelength of 300 nm or longer, or an iodonium salt that has a functional group having an absorption at a wavelength of 300 nm or longer as a substituent.

Examples of sulfonium salts suitably used in the present invention may include sulfonium salts described in EP Patent Nos. 370,693, 390,214, 233,567, 297,443 and 297,442, U.S. Pat. Nos. 4,933,377, 161,811, 410,201, 339,049, 4,760,013, 4,734,444 and 2,833,827, and DE Patent Nos. 2,904,626, 3,604,580 and 3,604,581. From the viewpoint of stability, the sulfonium salt may be preferably substituted by an electron-withdrawing group. The electron-withdrawing group preferably has a Hammett value of larger than 0. Examples of preferable electron-withdrawing group may include a halogen atom and a carboxylic acid.

Other preferable sulfonium salts include a triarylsulfonium salt from the viewpoints of the balance of heat-decomposition property and stability and photocurable property when used in combination with a sensitizer or the like. The triarylsulfonium salt preferably has at least one electron-withdrawing group such as a halogen atom or a carboxyl group, more preferably substituted by two or more electron-withdrawing groups, and most preferably substituted by three or more electron-withdrawing groups.

Another preferable sulfonium salt is a sulfonium salt in which one of the substituent(s) of the triarylsulfonium salt has a coumarin or anthraquinone structure, wherein the sulfonium salt has an absorption at a wavelength of 300 nm or longer. Still other preferable sulfonium salt is a sulfonium salt in which at least one of the triaryl forms a part of a chromophore having an absorption at a wavelength of 300 nm or longer. A triarylsulfonium salt that has a functional group having an absorption at a wavelength of 300 nm or longer as a substituent is also preferable.

Examples of the onium salt compound may include selenonium salts described in Macromolecules, 10(6), 1307 (1977) by J. V. Crivello et al., and J. Polymer Sci., Polymer Chem. Ed., 17, 1047 (1979) by J. V. Crivello et al.; and arsonium salts described in Teh, Proc. Conf. Rad. Curing ASIA, p. 478 Tokyo, Oct. (1988) by C. S. Wen et al.

The content of the polymerization initiator is preferably from 0.1% to 30% by mass with respect to the 100 parts by mass of the polymerizable monomer and/or binder resin, more preferably from 0.5% to 25% by mass, and particularly preferably from 1% to 20% by mass. When the content is within the above range, a better sensitivity can be attained and a tough curing portion can be formed. Regarding the aforementioned acid generating compounds, only a single acid generating compound may be used, or two or more acid generating compounds may be used in combination, (Curing Agent)

The epoxy monomer (epoxy group-containing monomer) and the thermosetting binder resin may be generally blended with a curing agent in combination. The curing agent may be preferably selected from curing agents and accelerators described in chapter 3 of "Sousetsu Epoxy Jushi Kisohen I" published by Epoxy Jushi Gijutsu Kyokai, Nov. 19, 2003. For example, a polycarboxylic anhydride or a polycarboxylic acid may be used.

Specific examples of the polycarboxylic anhydride may include an aliphatic or alicyclic dicarboxylic anhydride such as phthalic anhydride, itaconic anhydride, succinic anhydride, citraconic anhydride, dodecenyl succinic anhydride, tricarbaryl anhydride, maleic anhydride, hexahydro phthalic anhydride, dimethyltetrahydro phthalic anhydride, himic anhydride, and nadic anhydride; aliphatic polycarboxylic dianhydrides such as 1,2,3,4-butane tetracarboxylic dianhydride and cyclopentane tetracarboxylic dianhydride; aromatic polycarboxylic anhydrides such as pyromellitic anhydride, trimellitic anhydride, and benzophenone tetracarboxylic anhydride; and ester group-containing anhydrides such as ethyleneglycol bistrimellitate and glycerin tristrimellitate. Aromatic polycarboxylic anhydrides are particularly preferable. Further, a commercially available epoxy resin curing agent that is composed of a carboxylic anhydride may be suitably used.

Specific examples of the polycarboxylic acid used in the present invention may include an aliphatic polycarboxylic acid such as succinic acid, glutaric acid, adipic acid, butane tetracarboxylic acid, maleic acid, or itaconic acid; an alicyclic polycarboxylic acid such as hexahydro phthalic acid, 1,2-cyclohexane dicarboxylic acid, 1,2,4-cyclohexane tricarboxylic acid, or cyclopentane tetracarboxylic acid; and an aromatic polycarboxylic acid such as phthalic acid, isophthalic acid, terephthalic acid, pyromellitic acid, trimellitic acid, 1,4,5,8-naphthalene tetracarboxylic acid, or benzophenone tetracarboxylic acid. An aromatic polycarboxylic acid is preferable.

The polycarboxylic acid used in the present invention is preferably a vinylether-blocked carboxylic acid. Specific examples may include vinylether-blocked carboxylic acids described in "Sousetsu Epoxy Jushi Kisohen I" published by Epoxy Jushi Gijutsu Kyokai, pp. 193 to 194, JP-A-2003-66223, and JP-A-2004-339332. By blocking the carboxylic acid with vinylether, the addition reaction (esterification) between the carboxylic acid and the epoxy compound proceeds gradually at room temperature, so that increase in the viscosity of the curable composition with time may be suppressed. In addition, solubility to various kinds of solvents, to the epoxy monomer, and to the epoxy resin is increased, so that a homogeneous composition can be prepared. The vinylether-blocked carboxylic acid is desirably used in combination with a heat-latent catalyst described later. By using with the heat-latent catalyst, de-blocking reaction is promoted upon heating, so that film shrinkage upon heating is minimized. As a result, a color filter having a still higher strength can be formed.

Only a single polycarboxylic anhydride or polycarboxylic acid may be used, or a mixture of two or more selected from polycarboxylic anhydrides and polycarboxylic acids may be used. The blending amount of the curing agent used in the present invention is usually from 1 part to 100 parts by mass with respect to 100 parts by mass of the epoxy group-containing component (including monomer(s) as well as resin(s), if any), and preferably from 5 parts to 50 parts by mass. A blending amount of the curing agent of 1 part by mass or more realizes excellent curing property, so that a tough functional film can be formed.

(Heat-Latent Catalyst)

In the present invention, when the epoxy group-containing monomers and the thermosetting binder resin are used, a catalyst that can accelerate the thermosetting reaction between acid and epoxy may be added so as to improve the hardness and heat resistance of the resulting functional film. The catalyst may be a heat-latent catalyst that becomes active upon thermosetting.

The heat-latent catalyst exhibits catalytic activity when heated, so as to accelerate curing reaction and impart excellent physical characteristics to the resulting cured product. The heat-latent catalyst is added as may be necessary. A heat-latent catalyst exhibiting an acid-catalyst activity at a temperature of 60° C. or higher is preferable, and examples thereof include a compound obtained by neutralizing a protonic acid with a Lewis base, a compound obtained by neutralizing a Lewis acid with a Lewis base, a mixture of a Lewis acid and a trialkyl phosphate, sulfonic acid esters, and an onium compound. Various kinds of compound as described in JP-A-4-218561 may be used.

Specific examples may include:
(a) a compound obtained by neutralizing a halogenocarboxylic acid, a sulfonic acid, a phosphoric acid mono- or di-ester, or the like with any of various kinds of amines such as ammonia, monomethylamine, triethylamine, pyridine and ethanolamine, or with a trialkylphosphine;
(b) a compound obtained by neutralizing a Lewis acid such as $BF_3$, $FeCl_3$, $SnCl_4$, $AlCl_3$, or $ZnCl_2$ with the aforementioned Lewis base;
(c) an ester compound formed from methane sulfonic acid, ethane sulfonic acid, benzene sulfonic acid or the like and a primary alcohol or a secondary alcohol; and
(d) a phosphoric acid mono- or di-ester compound of a primary or secondary alcohol.

Examples of the onium compound may include an ammonium compound of $[R^1NR^2R^3R^4]^+X^-$, a sulfonium compound of $[R^1SR^2R^3]^+X^-$, and an oxonium compound of $[R^1OR^2R^3]^+X^-$. Here, $R^1$ to $R^4$ each independently represent an alkyl group, an alkenyl group, an aryl group, an alkoxy group, or the like. $X^-$ represents a counter anion.

The heat-latent catalyst is desirably an acid catalyst free of halogen, considering, for example, contamination of liquid crystals. Examples of the acid-catalyst-free of halogen may include "NOFCURE-LC-1" and "NOFCURE-LC-2" (both are trade name, NOF Corporation).

<Curable Ink Composition>

The curable composition of the present invention may be suitably used for an ink. If an additive which can give viscosity and other properties is added to the curable composition of the present invention, an ink which is suitable for various applications such as ink-jet, flexographic printing, off-set printing, thermal transfer printing, or screen printing may be prepared. Examples of the additive include a solvent, a polymerization initiator, a vehicle, a buffer agent, a biocide, a sequestering agent (chelating agent), a viscosity modifier, a wetting agent, a binder resin, an UV absorbent and a latex particle.

The total content of the near-infrared absorptive dye in the ink is preferably 1 to 50% by mass with respect to the total amount of the ink. When the total content of the dye in the ink composition is less than 1% by mass, the film thickness may sometimes increase in order to obtain a cured coating film having a required near-infrared ray absorption property.

<Ink-jet Ink>

By mixing the curable composition with a coloring agent, a dispersant for dye, or an agent for promoting wetting, etc., an ink-jet ink may be provided.

When the curable composition of the present invention is to be used as an ink-jet ink, the curable composition is designed so as to exhibit its property without damaging the property of the near-infrared absorptive dye after printing. The important point is that the molded product obtained after curing has both the near-infrared absorption property and visible light transmitting property.

1. Polymerizable Monomer

When the curable composition of the present invention is to be used as an ink-jet ink, it is necessary to include a polymerizable monomer. With respect to the polymerizable monomer, it is preferable to use the polymerizable monomer in combination with a monomer having at least two polymerizable groups (hereinafter, also referred to as a "bi- or higher-functional monomer"). Furthermore, the polymerizable monomer is not particularly limited if it can undergo a polymerization reaction by active energy ray and/or heat. However, from the viewpoint of improving strength of a cured coating film (cured film) or improving its resistance to a solvent, it is preferable to use the polymerizable monomer in combination with a monomer having at least three polymerizable groups (hereinafter, also referred to as a "tri- or higher-functional monomer").

The polymerizable monomer preferably may contain at least one selected from a (meth)acrylic monomer, an epoxy monomer, and an oxetanyl monomer, considering that these monomers are allowed to have a variety of substituents and are easily available.

The blending amount of the polymerizable monomer and the polymerizable binder described below is preferably 5 to 97% by mass of the total ink-jet ink and more preferably, 30 to 95% by mass. The blending amount of the polymerizable monomer is preferably 30 to 100% by mass of the total ink-jet ink. More preferably, it is 50 to 100% by mass of the total ink-jet ink. When the blending amount of the polymerizable monomer is within the above range, sufficient polymerization is obtained when the curable composition is cured, and therefore damages caused by poor film strength will not easily occur.

2. Polymerizable Binder Resin

The ink-jet ink of the present invention may be admixed with a binder resin under the purpose of controlling viscosity or controlling ink hardness, etc. As for the binder resin, a binder resin which only consists of a resin having no polymerizability per se and simply solidifies by drying may be used. However, to provide the coated film with sufficient strength, durability and adhesiveness, it is preferable to form a pattern for the pixels on a substrate by an ink jet method and use a polymerizable binder resin which can cure pixels by polymerization reaction. Examples of the binder resin include a photocurable binder resin which can be cured by polymerization using visible light, UV ray, an electron beam, etc. and a thermosetting binder resin which can be cured by polymerization by heating, 3. Polymerization Initiator In the ink jet ink of the present invention, a polymerization initiator may be used so as to promote polymerization reaction of the polymerizable monomer or of the binder resin. The polymerization initiator may be selected as appropriate in accordance with the kind of the polymerizable monomer and the binder contained in the curable composition of the present invention used for the ink-jet ink and the polymerization pathway.

When a polymerization reaction of an acrylate (methacrylate) monomer and a photocurable binder resin is carried out by using active energy ray, a photo-polymerization initiator is used. When the polymerization reaction is carried out by using heat, a heat-polymerization initiator is used. Examples of the photo-polymerization initiator include 2-trichloromethyl-5-(p-styrylstyryl)-1,3,4-oxadiazole and 2,4-bis(trichloromethyl)-6-[4'-(N,N-bisethoxycarbonyl methylamino)-3'-bromophenyl]-s-triazine. Examples of the heat-polymerization initiator include 3,3',4,4'-tetrakis(t-butylperoxycarbonyl)benzophenone, benzoyl peroxide, 2,2-bis(4,4-di-t-butylperoxycyclohexyl)propane, 1,1-bis(t-hexylperoxy)-3,3,5-trimethyl cyclohexane, t-butylperoxy benzoate, and di-t-butylperoxy benzoate.

The content of the photo-polymerization initiator and/or the heat-polymerization initiator suitable for the acrylate monomer, the methacrylate monomer, and the photocurable binder resin is preferably from 0.1% to 10% by mass with respect to 100% by mass of the polymerization monomer and/or binder resin, and more preferably from 0.3% to 5% by mass. With the above blending amount, an effect as a polymerization initiator can be fully exhibited, and therefore a change in viscosity of the curable composition over time can be inhibited. Only a single polymerization initiator may be used, or alternatively, two or more polymerization initiators may be used in combination.

As the polymerization initiator suitable for the oxetanyl group-containing monomer or the binder resin, a compound that generates acid is preferable. Examples of the acid to be generated may include a carboxylic acid, a sulfonic acid, a phosphoric acid, a phosphoric acid monoester, a phosphoric acid diester, a sulfuric acid, a sulfuric acid monoester, a sulfinic acid, a hydrochloric acid, a nitric acid, a boric acid, a trifluoroboric acid, a boron complex, an antimony derivative, and a hexafluorophosphoric acid.

Among them, for effectively curing the oxetanyl group-containing monomer (oxetane compound) by an action of light and/or heat, a hydrochloric acid, a sulfonic acid, or an acid that contains a boron atom or a phosphorous atom is preferable, and an acid that contains a phosphorous atom is most preferable.

Examples of specific compounds (photo-polymerization initiators) that generate such an acid may include an organohalogen compound, an oxydiazole compound, an organic borate compound, a disulfone compound, an oxime ester compound, and an onium salt compound. Among these, an onium salt acid generator such as iodonium salt or sulfonium salt is suitably used. The content of the polymerization initiator is preferably from 0.1 parts to 30 parts by mass with respect to 100 parts by mass of the polymerizable monomer and/or binder resin, more preferably from 0.5 parts to 25 parts by mass, and particularly preferably from 1 part to 20 parts by mass. When the content is within the above range, a better sensitivity can be attained and a tough curing portion can be formed. Regarding the aforementioned acid generating agents, only a single acid generating compound may be used, or two or more acid generating agents may be used in combination.

4. Curing Agent

As a polymerizable monomer included in the curable composition of the present invention, an epoxy-type monomer (i.e., a monomer including an epoxy group) is used. Furthermore, when a thermosetting binder resin is used, a curing agent may be blended in general. As for the curing agent, polycarboxylic acid anhydride or polyvalent carboxylic acid may be preferably used.

Specific examples of the polycarboxylic anhydride may include phthalic anhydride, itaconic anhydride, succinic anhydride, citraconic anhydride, dodecenyl succinic anhydride, tricarbaryl anhydride, maleic anhydride, hexahydro phthalic anhydride, and dimethyltetrahydro phthalic anhydride.

Specific examples of the polycarboxylic acid used in the present invention may include an aliphatic polycarboxylic acid such as succinic acid, glutaric acid, adipic acid, butane tetracarboxylic acid, maleic acid, or itaconic acid; an alicyclic polycarboxylic acid such as hexahydro phthalic acid, 1,2-cyclohexane dicarboxylic acid, 1,2,4-cyclohexane tricarboxylic acid, or cyclopentane tetracarboxylic acid; and an aromatic polycarboxylic acid such as phthalic acid, isophthalic acid, terephthalic acid, pyromellitic acid, trimellitic acid, 1,4,5,8-naphthalene tetracarboxylic acid, or benzophenone tetracarboxylic acid. An aromatic polycarboxylic acid is preferable.

The polycarboxylic acid used in the present invention is preferably a vinylether-blocked carboxylic acid. Specific examples may include vinylether-blocked carboxylic acids described in "Sousetsu Epoxy Jushi Kisohen I" published by Epoxy Jushi Gijutsu Kyokai, pp. 193 to 194, JP-A-2003-66223, and JP-A-2004-339332. By blocking the carboxylic acid with vinylether, the addition reaction (esterification) between the carboxylic acid and the epoxy compound proceeds gradually at room temperature, so that increase in the viscosity of the ink-jet ink with time may be suppressed. In addition, solubility to various kinds of solvents, to the epoxy monomer, and to the epoxy resin is increased, so that a homogeneous composition can be prepared. The vinylether-blocked carboxylic acid is desirably used in combination with a heat-latent catalyst described later. By using with the heat-latent catalyst, de-blocking reaction is accelerated upon heating, so that film shrinkage upon heating is minimized and so that a color filter having a still higher strength can be formed.

Only a single polycarboxylic anhydride or polycarboxylic acid may be used, or a mixture of two or more selected from polycarboxylic anhydrides and polycarboxylic acids may be used. The blending amount of the curing agent used in the present invention is usually from 1 part to 100 parts by mass with respect to 100 parts by mass of the epoxy group-containing component (including monomer(s) as well as resin(s), if any), and preferably from 5 parts to 50 parts by mass. A blending amount of the curing agent of 1 part by mass or more realizes excellent curing property, so that a tough functional film can be formed.

5. Surfactant

The ink jet ink of the present invention may further include a surfactant. Preferable examples of the surfactant may include surfactants disclosed in paragraph number [0021] of JP-A-7-216276, JP-A-2003-337424, and JP-A-11-133600. The content of the surfactant is preferably 5% by mass or less with respect to the total amount of the ink-jet ink.

6. Solvent

The ink-jet ink of the present invention may also contain a solvent. Basically, the solvent is not particularly limited so long as it satisfies the solubility of each component and the boiling point of the solvent that will be described below. However, it is preferably chosen in consideration of solubility of a binder, coating property and safety described below.

The ink-jet ink of the present invention contains at least one kind of solvent. Examples of the solvent may include a water-soluble organic solvent such as an alcohol and a water-insoluble organic solvent such as an ester or ether. The water-insoluble organic solvent is more preferable from the viewpoint of keeping the ink viscosity low, because the monomer, binder, dispersant and the like to be used can be dissolved therein even if they have no high polar group.

Examples of other additives may include those described in paragraph numbers to [0071] of JP-A-2000-310706.

7. Near-infrared Absorptive Dye

The total content of the near-infrared absorptive dye in an ink jet ink is preferably 1 to 50% by mass, and more preferably 2 to 20% by mass with respect to the total amount of the ink. When the blending amount is too large, discharging may be difficult as the viscosity of the ink becomes high or dissolution in a solvent may be difficult to achieve. When the blending amount is too small, no effect can be obtained.

The content of the total polymerizable compounds in an ink jet ink is preferably 5 to 97% by mass, and more preferably 30 to 95% by mass with respect to the ink. When the use amount of the monomer is within the above range, sufficient polymerization is attained when the curable composition is cured, and therefore damages caused by poor film strength will not easily occur. In addition, the term "polymerizable compound" means both the polymerizable monomer and the polymerizable binder that will be described below.

<Method of Producing Ink-jet Ink>

Various methods can be employed for the production of the ink-jet ink of the present invention. For example, by mixing a monomer solution which is prepared by mixing each component required for an ink-jet ink (for example, a polymerizable monomer or a binder) with a fine-particle dispersion of the near-infrared absorptive dye described above, an ink-jet ink may be produced. To avoid aggregation of the fine particles of near-infrared absorptive dye at the time of mixing, it is preferable to add the monomer solution in small portions to the fine-particle dispersion under stirring.

During the preparation of the monomer solution, treatments such as heating or ultrasonic treatment may be applied as appropriate so long as polymerization does not take place in the monomer solution., <Properties of Ink-jet Ink>

When the curable composition of the present invention is used as an ink jet recording ink, considering an ink discharge property, viscosity is preferably 7-30 mPa·s, and more preferably 7 to 25 mPa·s at the temperature of discharging (for example, 40 to 80° C., preferably 25 to 50° C.). The viscosity of the ink composition of the present invention at room temperature (25 to 30° C.) is preferably 35 to 500 mPa·s, and more preferably 35 to 200 mPa·s.

When the curable composition of the present invention is used as an ink-jet ink, it is preferable to adjust appropriately the constitutional ratio so as to obtain the viscosity range as described above. By setting the viscosity at room temperature high, even when a porous recording medium is used, ink penetration into the recording medium is avoided so that uncured monomer and malodor can be reduced. Furthermore, ink spreading at the time of landing of ink liquid droplets is suppressed, and as a result, quality of an image is improved.

The surface tension of the ink composition of the present invention at 25° C. is preferably 20 to 30 mN/m, and more preferably 23 to 28 mN/m. When recording is carried out on various types of recording medium such as polyolefin, PET, coated paper, and uncoated paper, it is preferably at least 20 mN/m from the viewpoint of spreading and penetration, and it is preferably 30 mN/m or lower from the viewpoint of wettability.

<Curing Method>

By using the curable composition of the present invention, a coating film is formed and then the cured coating film is formed. When the curable composition contains a solvent, the cured coating film is formed after the solvent is evaporated. For example, there can be used a curable composition such that contains a resin with high molecular weight dissolved in an organic solvent and a film is cured by evaporation of the solvent after forming the film.

When the polymerizable monomer or the polymerizable binder included in the curable composition can be cured by active radiation, a cured coating film of the curable composition is formed by irradiating the coating film with active radiation. If it can be used as a polymerizable monomer or a polymerizable binder which is curable by active radiation, any kind may be used without specific limitation. Examples of the active radiation that is used herein include α-rays, γ-rays, electron beams, X-rays, UV-rays, visible rays and IR rays. As an active radiation source, a mercury lamp, a gas laser and a solid-state laser, and the like can be used.

In addition to the above, the cured coating film of the present invention may also be formed by heating. Further, a curing agent or a catalyst which is generally used in the art may be blended. However, regardless of the type of the resin components used, it is necessary to design the curable composition so as to be able to be molded into a specific shape without compromising performance of a near-infrared absorptive dye. It is also necessary that the molded article obtained after curing exhibits fully near-infrared absorption properties.

<Image Forming Method>

In the present invention, by forming a coated film of an ink jet ink on a substrate and curing the coated film, an image may be formed. Further, in the present invention, by discharging the ink composition on a substrate for ink-jet recording and curing the ink composition discharged on the substrate by irradiating with active radiation or by heating, an image may be formed. Herein, a method of irradiating active radiation will be explained in greater detail.

The image forming method of the present invention comprises (a) a step of discharging the ink composition of the present invention onto a substrate such as a recording medium, and (b) a step of curing the discharged ink composition. Since the image forming method of the present invention comprises the steps (a) and (b) above, an image of the ink composition cured on the substrate is formed.

An ink jet recording device, which is described in detail below, may be employed in step (a) of the image forming method of the present invention.

<Ink-jet Recording Device>

An ink-jet recording device that can be used in the recording method of the present invention is not particularly limited, and a conventional ink-jet recording device that can achieve a target resolution may be arbitrarily selected and used. That is, any known ink-jet recording device, including a commercial device, may be used for carrying out discharging of the ink composition onto a recording medium in step (a) of the ink jet recording method of the present invention.

Examples of an ink-jet recording device that can be used in the image forming method of the present invention include a device equipped with an ink supply system, a temperature sensor, and an active radiation source.

The ink supply system comprises, for example, a base tank containing the ink composition of the present invention, a supply pipe, an ink supply tank immediately before an ink jet head, a filter, and a piezo-type ink jet head. The piezo-type ink-jet head may be driven so as to discharge multisize dots of preferably 1 to 100 pL, and more preferably 8 to 30 pL, at a resolution of preferably 320×320 to 4,000×4,000 dpi, more preferably 400×400 to 1,600×1,600 dpi, and furthermore preferably 720×720 dpi. Here, dpi referred to in the present invention means the number of dots per 2.54 cm.

In the radiation-curing ink, the temperature of the discharged ink is preferably kept constant, therefore the region from the ink supply tank to the ink jet head was thermally insulated and heated. A method of controlling the temperature is not particularly limited, but it is preferable to provide, for example, temperature sensors at a plurality of piping locations, and control heating according to the ink flow rate and the temperature of the surroundings. The temperature sensors may be provided on the ink supply tank and in the vicinity of the ink-jet head nozzle. Furthermore, the head unit that is to be heated is preferably thermally shielded or insulated so that the device main body is not influenced by the temperature of the outside air. In order to reduce the printer start-up time required for heating, or in order to reduce the thermal energy loss, it is preferable to thermally insulate the head unit from other sections and also to reduce the heat capacity of the entire heated unit.

The step (b) of curing the ink composition by irradiating the discharged ink-jet ink with active radiation is now explained.

The ink jet ink discharged onto a substrate cures upon exposure to radiation. This is because the polymerization initiator included in the ink jet ink of the present invention is decomposed by irradiation with active radiation to generate initiating species such as a radical, an acid and a base, and the like, and polymerization of specific monofunctional (meth) acrylic acid derivatives or other polymerizable compound, that are used in combination as necessary, is caused and accelerated by the function of the initiating species, resulting in the curing of the ink composition. The active radiation used here is α-rays, γ-rays, electron beams, X-rays, ultraviolet rays, visible light, infrared light, etc. The peak wavelength of the active radiation depends on the absorption characteristics of the photopolymerization initiator and, for example, is preferably 200 to 600 nm, more preferably 300 to 450 nm, and furthermore preferably 350 to 420 nm.

The active radiation is preferably irradiated at the exposed surface illuminance of 10 to 2,000 mW/cm$^2$, more preferably 20 to 1,000 mW/cm$^2$.

As an active radiation source, a mercury lamp, a gas/solid laser, and the like are mainly used, and as a light source used for curing of an UV-curable ink-jet recording ink, a mercury lamp and a metal halide lamp can be used. Further, GaN series semiconductor UV emitting device, in addition, LED (UV-LED), LD (UV-LD) may be used as light sources for photocurable type ink-jet recording.

When an UV ray source is needed, an UV-LED or an UV-LD may be used. For example, Nichia Corporation has marketed an UV-LED having a wavelength of the main emission spectrum of between 365 nm and 420 nm and this may be used. Furthermore, other UV-LEDs are available, and irradiation can be carried out with radiation of a different UV bandwidth. The active radiation source particularly preferable in the present invention is an UV-LED, and an UV-LED having a peak wavelength at 350 to 420 nm is particularly preferable.

The maximum illuminance (illumination intensity) of the LED on a substrate is preferably 10 to 2,000 mW/cm$^2$, more preferably 20 to 1,500 mW/cm$^2$, and particularly preferably 50 to 1,000 mW/cm$^2$.

The ink jet ink of the present invention is preferably exposed to such active radiation preferably for 0.01 to 120 sec, and more preferably 0.1 to 90 sec.

Irradiation conditions for the active radiation and basic irradiation methods are disclosed in JP-A-60-132767. Specifically, light sources are provided on both sides of a head unit containing an ink discharge device (ink ejecting device), and the head unit and the light sources are made to scan by a so-called shuttle system. Irradiation with active radiation is carried out after a fixed period of time (for example, 0.01 to 0.5 sec, preferably 0.01 to 0.3 sec, and more preferably 0.01 to 0.15 sec) has elapsed after the ink landed. By controlling the time from after the ink composition has landed until before the irradiation so that it is a very short time, it becomes possible to prevent the ink composition that has landed on a recording medium from spreading before being cured. Furthermore, when a porous recording medium is used, since exposure can be carried out before the ink composition penetrates to a deep part where the light source cannot reach, it is possible to prevent the unreacted monomer from remaining. As a result, malodor can be reduced.

Moreover, curing may be completed by another light source that does not involve driving. International patent application WO 99/54415 discloses, as an irradiation method, a method employing optical fiber or a method in which a collimated light source is shed on a mirror surface provided on a side face of a head unit and a recording area is irradiated with UV rays, and such a curing method can also be applied to the ink jet recording method of the present invention.

By employing the above-mentioned ink-jet recording method, it is possible to keep the dot diameter of landed ink constant even for various recording media having different surface wettabilities, thus improving the image quality. For the purpose of obtaining a color image, it is preferable to superimpose colors in order from those with low lightness. By superimposing inks in order from one with low lightness, it becomes easy for radiation to reach to a lower ink, the curing sensitivity is improved, the amount of residual monomer decreases, odor is reduced, and an improvement in adhesiveness can be expected. Although it is possible to discharge all colors and then expose them at the same time, it is preferable to expose one color at a time from the viewpoint of accelerating curing.

In this way, the ink-jet ink of the present invention is cured with high sensitivity by irradiation with an active radiation, thereby forming a near-infrared absorptive image on the substrate.

<Resist Solution>

Next, the resist solution which may be used for photolithographic method using the curable composition of the present invention will be explained.

1. Polymerizable Binder

The resist solution used for photolithographic method preferably contains at least one type of binder. The binder used in the invention is not particularly limited so long as it is alkali-soluble, and is preferably selected in view of heat resistance, developability, availability, and the like.

The alkali-soluble binder is preferably a linear organic high-molecular polymer, which is soluble in organic solvents and developable with an aqueous weak-alkaline solution. Examples of the linear organic high-molecular polymer include a polymer having a carboxylic acid group at a side chain thereof, for example, a methacrylic acid copolymer, an acrylic acid copolymer, an itaconic acid copolymer, a crotonic acid copolymer, a maleic acid copolymer or a partially-esterified maleic acid copolymer such as those described in JP-A-59-44615, JP-B-54-34327, JP-B-58-12577, JP-B-54-25957, JP-A-59-53836 and JP-A-59-71048. In particular, an acidic cellulose derivative having a carboxylic acid group at a side chain thereof is useful. In addition, preferable examples thereof include a polymer obtained by adding an acid anhydride to a polymer having a hydroxyl group; and a polyhydroxystyrene series resin, a polysiloxane series resin, poly(2-hydroxyethyl(meth)acrylate), polyvinylpyrrolidone, polyethylene oxide and polyvinyl alcohol.

The alkali-soluble binder may be formed using a monomer having a hydrophilic group as a copolymerization component. Examples of the monomer having a hydrophilic group include alkoxyalkyl(meth)acrylate, hydroxyalkyl (meth) acrylate, glycerol (meth)acrylate, (meth)acrylamide, N-methylol acrylamide, secondary or tertiary alkyl acrylamide, dialkylaminoalkyl(meth)acrylate, morpholinoalkyl(meth) acrylate, N-vinylpyrrolidone, N-vinylcaprolactam, vinylimidazole, vinyltriazole, methyl(meth)acrylate, ethyl(meth) acrylate, branched or linear propyl(meth)acrylate, branched or linear butyl(meth)acrylate, and phenoxyhydroxypropyl (meth)acrylate.

Examples of monomer having a hydrophilic group further include a monomer having a tetrahydrofurfuryl group, a phosphate moiety, a phosphate ester moiety, a quaternary ammonium salt moiety, an ethyleneoxy chain, a propyleneoxy chain, a sulfonic acid moiety, a sulfonic acid salt moiety, or a morpholinoethyl group.

The binder resin may have a polymerizable group at a side chain thereof for improving the cross-linking efficiency. Preferable examples of the alkali-soluble binder include a polymer having an allyl group, a (meth)acrylic group or an allyloxyalkyl group at a side chain thereof.

Examples of the polymer having a polymerizable group include KS RESIST-106 (trade name, manufactured by Osaka Organic Chemical Industry Ltd.), and CYCLOMER P Series (trade name, manufactured by Daicel Chemical Industries, Ltd.).

In order to increase the strength of a cured coating film, alcohol-soluble nylon, and polyether of 2,2-bis(4-hydroxyphenyl)-propane and epichlorohydrin are also useful.

2. Crosslinking Agent

As for the cross-linking agent, it is not particularly limited so long as it can react with the polymerizable binder described above to yield cross-linking. Examples of the cross-linking agent include (a) an epoxy resin, (b) a melamine compound, a guanamine compound, a glycoluril compound and a urea compound, each of which is substituted with at least one substituent selected from a methylol group, an alkoxymethyl group or an acyloxymethyl group, and (c) a phenol compound, a naphthol compound or a hydroxyanthracene compound, each of which is substituted with at least one substituent selected from a methylol group, an alkoxymethyl group or an acyloxymethyl group. Among these compounds, a polyfunctional epoxy resin is preferable.

When a cross-linking agent is contained in the curable composition, the content is preferably from 1% by mass to 70% by mass, more preferably from 5% by mass to 50% by mass, and still more preferably from 7% by mass to 30% by mass, with respect to the total solid content (mass) of the curable composition. When the content is within the above range, sufficient curing as well as excellent eluting properties at an unexposed area can be obtained, whereby insufficient curing at an exposed area and deterioration of eluting properties at the unexposed area can be prevented.

3. Polymerizable Monomer

The resist solution of the present invention can be preferably constituted by containing at least one type of polymerizable monomer. The polymerizable monomer is mainly contained when the resist solution is constituted as a negative-type. The polymerizable monomer may be added to a positive-type system containing a naphthoquinonediazide compound described below, together with a photopolymerization initiator described below. In this case, curing of a formed pattern can further be accelerated. Hereinafter, the polymerizable monomer will be described.

The polymerizable monomer is preferably a compound having at least one addition-polymerizable ethylenically-unsaturated group, and having a boiling point of 100° C. or higher under normal pressure. Examples thereof include: monofunctional acrylates and methacrylates, such as polyethylene glycol mono(meth)acrylate, polypropylene glycol mono(meth)acrylate, phenoxyethyl(meth)acrylate; polyethylene glycol di(meth)acrylate; trimethylolethane tri(meth) acrylate; neopentyl glycol di(meth)acrylate; pentaerythritol tri(meth)acrylate; pentaerythritol tetra(meth)acrylate; dipentaerythritol penta(meth)acrylate; dipentaerythritol hexa(meth)acrylate; hexanediol(meth)acrylate; trimethylolpropane tri(acryloyloxypropyl)ether; tri(acryloyloxyethyl)isocyanurate; compounds obtained by adding an ethylene oxide or a propylene oxide to a polyfunctional alcohol such as glycerin or trimethylolethane, and then (meth)acrylating the resultant; urethane acrylates such as those described in JP-B-48-41708 and JP-B-50-6034 and JP-A-51-37193; polyester acrylates such as those described in JP-A-48-64183, JP-B-49-43191 and JP-B-52-30490; and polyfunctional acrylates or methacrylates, such as epoxyacrylates obtained by the reaction of an epoxy resin and (meth)acrylic acid, and mixtures thereof.

Examples of polymerizable monomers further include photo-curable monomers and oligomers described in "Journal of the Adhesion Society of Japan", Vol. 20, No. 7, pp. 300-308.

The content of the polymerizable monomer in the resist solution is preferably from 0.1% by mass to 90% by mass, more preferably from 1.0% by mass to 80% by mass, and still more preferably from 2.0% by mass to 70% by mass, with respect to the total solid content of the resist solution.

4. Radiation-Sensitive Compound

The resist solution of the present invention can be preferably used by containing at least one radiation-sensitive compound. The radiation-sensitive compound can cause chemical reactions such as the generation of radicals, acids or bases when irradiated with UV light with a wavelength of 400 nm or shorter. When the resist solution of the present invention contains the radiation-sensitive compound, it is possible to insolubilize the polymerizable binder by cross-linking, polymerization or decomposition of an acidic group. Further, by causing polymerization of the polymerizable monomer and oligomer or cross-linking by cross-linking agent, the cured coating film can resist against an alkali developer.

When the resist solution is constituted as a negative-type, it is in particular preferable that the resist solution contains a photopolymerization initiator. When the resist solution is constituted as a positive-type, it is preferable that the resist solution contains a naphthoquinonediazide compound.

5. Photopolymerization Initiator

The photo-polymerization initiator, which is included when the resist solution of the present invention is a negative-type composition, will be explained below. The photopolymerization initiator used in the invention is not particularly limited so long as it causes polymerization of the polymerizable monomer, and is preferably selected in consideration of its characteristics, initiation efficiency, absorption wavelength, availability and cost.

The photopolymerization initiator may further be added to the positive-type composition containing a naphthoquinonediazide compound. In this case, the cure degree of a formed pattern can further be accelerated.

Examples of the photopolymerization initiator include at least one activated halogen compound selected from a halomethyloxadiazole compound or a halomethyl-s-triazine compound; 3-aryl-substituted coumarin compounds; Rofin dimers; benzophenone compounds; acetophenone compounds and derivatives thereof; cyclopentadiene-benzene-iron complexes and salts thereof; and oxime series compounds.

Next, the naphthoquinonediazide compound, which may be included in the resist solution of the present invention will be described.

The naphthoquinonediazide compound is a compound having at least one o-quinonediazide group, and specific examples thereof include o-naphthoquinonediazide-5-sulfonic acid ester, o-naphthoquinonediazide-5-sulfonic acid amide, o-naphthoquinonediazide-4-sulfonic acid ester, and o-naphthoquinonediazide-4-sulfonic acid amide. These esters and amides can be produced by a known method, for example, using a phenol compound represented by Formula (1) described in JP-A-2-84650 and JP-A-3-49437.

When the resist solution is a negative type, content of the photo-polymerization initiator in the resist solution is preferably 0.01 to 50% by mass, more preferably 1 to 30% by mass, and still more preferably 1 to 20% by mass with respect to the solid content of the polymerizable monomer. When the content is within the range, polymerization proceeds favorably and favorable film strength can be obtained.

When the resist solution is a positive type, it is preferable that the alkali-soluble binder and the crosslinking agent are usually dissolved in an organic solvent at proportions of about 2 to 50% by mass and about 2 to 30% by mass, respectively. Usually, the amounts of the naphthoquinonediazide compound and the near-infrared absorptive dye to be added are preferably approximately from 2 to 30 mass % and approximately from 2 to 50 mass %, respectively, with respect to the solution containing the binder and crosslinking agent dissolved therein.

6. Solvent

When the resist solution of the present invention is prepared, a solvent can be usually used. The solvent used in the invention is not particularly limited so long as it satisfies the requirements for solubility of respective components in the composition and for coating properties of the photo-curable resist solution. In particular, the solvent is preferably selected properly in consideration of solubility of the binder and coating properties and safety.

Examples of the solvent include those described in paragraph [0272] of JP-A-2008-292970.

Among these, methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether and propylene glycol methyl ether acetate are more preferable.

7. Additives

The resist solution of the present invention may contain various additives such as filler, a high-molecular compound other than those described above, a surfactant, an adhesion accelerator, an antioxidant, an ultraviolet absorbent and an aggregation inhibitor, if necessary. Examples thereof include the additives described in paragraphs to [0276] of JP-A-2008-292970.

<Preparation Method of Resist Solution>

When the resist solution is prepared, components for constituting the composition may be added in block, or, alternatively, the respective components may be dissolved in two or more different solvents, which are then sequentially added to form a composition. When the above components are blended, the order in which the components are added, and the conditions of operation are not particularly limited. For example, the composition may be prepared by simultaneously dissolving all the components in a solvent. Alternatively, in accordance with the necessity, the components are dissolved in two or more different solutions appropriately, and the resultant solutions are mixed at the time of use (at the time of coating).

The composition prepared as above may be filtrated before use, by using a filter such as MILLIPORE Filter (trademark), preferably using a pore size of from 0.01 µm to 3.0 µm, and more preferably from 0.05 µm to 0.5 µm.

Total content of the near-infrared absorptive dye in the resist solution is preferably 1 to 30% by mass, and more preferably 2 to 10% by mass with respect to the total amount of the resist solution.

<Method of Producing a Near-infrared Absorptive Filter by Using Resist Solution>

A near-infrared absorptive filter can be formed by using the resist solution of the present invention. The near-infrared absorptive filter of the present invention is formed, for example, in such a manner that the resist solution of the present invention is applied on a substrate by a coating method such as spin coating, cast coating or roll coating, and the resultant film is irradiated with light via a predetermined mask pattern, followed by developing the cured coating film by using a developer, to form a negative-type or positive-type colored pattern (resist pattern).

The key point is that a resist solution is designed without damaging the property of a near-infrared absorptive dye and near-infrared absorption property of a near-infrared absorptive filter produced by using the resist solution is fully exhibited.

The light source used for exposure of the resist solution of the present invention is preferably a light source that emits light with a wavelength of 400 nm or shorter. The light source is not particularly limited, and, examples thereof include lamp light sources such as a xenon lamp, a halogen lamp, a tungsten lamp, a high-pressure mercury lamp, an ultrahigh-pressure mercury lamp, a metal halide lamp, a medium-pressure mercury lamp, a low-pressure mercury lamp, a carbon arc lamp and a fluorescent lamp, Ar ion laser (364 nm, 351 nm, 10 mW to 1 W), Kr ion laser (356 nm, 351 nm, 10 mW to 1 W), solid-state lasers such as a combination of Nd:YAG (YVO4) and SHG crystal×2 (355 nm, 5 mW to 1 W), a combination of a waveguide-type wavelength conversion element with an AlGaAs semiconductor, or a combination of a waveguide-type wavelength conversion element with an AlGaInP/AlGaAs semiconductor (300 nm to 350 nm, 5 mW to 100 mW), and other pulsed lasers such as N2 laser (337 nm, pulse: 0.1 mJ to 10 mJ) and XeF (351 nm, pulse: 10 mJ to 250 mJ). When only a specific wavelength is used, an optical filter may be employed.

Ultraviolet rays such as an ArF excimer laser (wavelength: 193 nm), a KrF excimer laser (wavelength: 248 nm) or an i-line ray (wavelength: 365 nm) may be used. In consideration of cost and exposure energy, the light source is in particular preferably ultraviolet rays, and examples thereof include i-line ray.

Further, the formed pattern may be subjected to curing step, by heating and/or exposing, in order to further cure the pattern, if necessary. The light or radiation ray used in the curing process is preferably a radiation ray such as an i-line ray.

In the production of the near-infrared absorptive filter of the present invention, a near-infrared absorptive filter with desired number of color hues can be produced. In the case of producing a negative-type infrared absorptive filter, the aforementioned image forming process (and the curing process, as needed) is repeated in accordance with the desired number of colors. In the case of producing a positive-type infrared absorptive filter, the image forming process and the curing process are repeated in accordance with the desired number of colors.

Examples of the substrate include soda glass, PYREX (registered trademark) glass and quartz glass, and substrates each obtained by attaching a transparent conductive film to any of these materials, which are used in a liquid crystal display element and the like; photoelectric conversion element substrates that are used in image sensing device, such as a silicon substrate; and a complementary metal-oxide semi-conductor (CMOS). These substrates may sometimes have black stripes that separate the respective pixels.

Furthermore, on these substrates, an undercoat layer may be provided, if necessary, for the purpose of improving the adhesion with upper layers, preventing materials from diffusion, or flattening the support surface.

With respect to the developer which is used for the production of the near-infrared absorptive filter of the present invention, any composition which dissolves an area from which the resist solution of the present invention is to be removed by development (i.e., non-cured area in a negative type) but does not dissolve other area (i.e., cured area in a negative type) may be used. Specifically, various combinations of organic solvents or aqueous alkaline solutions may be used. Examples of the organic solvents include solvents that can be used when the aforementioned resist solution of the present invention is prepared.

The aqueous alkaline solution is preferably an aqueous alkaline solution obtained by dissolving an alkaline compound to have a concentration of from 0.001% by mass to 10% by mass, more preferably from 0.01% by mass to 1% by mass. Examples of the alkaline compound include sodium hydroxide, potassium hydroxide, sodium carbonate, sodium silicate, sodium metasilicate, aqueous ammonia, ethylamine, diethylamine, dimethylethanolamine, tetramethylammonium hydroxide, tetraethylammonium hydroxide, choline, pyrrole, piperidine, and 1,8-diazabicyclo-[5.4.0]-7-undecene. When such an aqueous alkaline solution is used as a developer, washing with water is usually performed after the development.

<Method of Producing a Near-infrared Absorptive Filter by Using an Ink-jet Ink>

The method of producing a near-infrared absorptive filter according to the present invention includes forming pixels by discharging liquid droplets of the ink jet ink onto recessed portions comparted with partition walls that are formed on a substrate.

The method of producing a near-infrared absorptive filter according to the present invention includes a step of forming pixels by discharging liquid droplets of the ink-jet ink onto recessed portions comparted with partition walls that are formed on a substrate (hereinafter, it may be also referred to as a "pixel-forming process"). Preferably, it includes a step of curing the pixels of at least one color by irradiation with active energy ray or a step of forming all the pixels having desired color hues and then curing them by heating. If necessary, it may comprise other steps like a baking treatment, etc.

The partition wall has been preliminary formed on the substrate prior to the pixel forming step. The details of the method of forming the partition wall will be described later.

—Pixel-forming Process—

In the pixel-forming process, liquid droplets of the ink jet ink of the present invention are provided onto recessed portions comparted with partition walls (walls for separating deep-pixels) to form pixels. This pixel becomes a color pixel such as red (R), green (G) or blue (B) which constitute the color filter.

By allowing the ink jet ink to penetrate for forming pixels (for example, a pixel pattern having three colors RGB) into recessed portions comparted with partition walls that are formed on a substrate, pixel-forming can be achieved to give multiple pixels of at least two colors.

As the method for providing liquid droplets of the ink jet ink, there can be used conventional methods such as a method of heat-curing the ink, a method of photo-curing the ink, or a method of discharging droplets onto a transparent image-receiving layer previously formed on a substrate.

A pattern shape of the near-infrared absorptive filter is not particularly limited, and may be stripe-like, lattice-like, or delta arrangement-like which is general as a black matrix shape.

As an ink-jet method, various methods such as a method of continuously discharging a charged ink-jet ink, and controlling the ink by an electric field; a method of intermittently discharging an ink using a piezo element; and a method of heating an ink, and intermittently discharging the ink utilizing foaming thereof can be adapted.

As the discharging conditions of ink jet ink, it is preferable that the ink is discharged while the ink viscosity is reduced by heating at 30° C. to 60° C., from the viewpoint of discharge stability. Since an ink-jet ink has generally a higher viscosity than that of an aqueous ink, a viscosity fluctuation range due to temperature variation is great. Since the viscosity fluctuation directly and greatly influences on a liquid droplet size and a liquid droplet discharging rate, and easily deteriorates image quality, it is important to keep the temperature of an ink-jet ink constant as much as possible.

As the ink-jet head (hereinafter, simply referred to as head), the conventional head can be applied and a continuous type, and a dot on demand type can be used. Among the dot on demand type, in a thermal-type head, a type having an operation valve as described in JP-A-9-323420 is preferable from the viewpoint of discharge. In a piezo-type head, heads described in, for example, EP A 277,703, and EP A 278,590 can be used. Among them, the piezo head is more preferable since influence of heat on an ink jet ink can be reduced, and a usable solvent is widely selected. The heads are preferably those having such a temperature-regulating function as to be able to control the temperature of the ink. It is preferable that an discharging temperature is set so that a viscosity at discharging is 5 to 25 mPas, and an ink temperature is controlled so that a variation width of a viscosity is within ±5%. The head is preferably operated at a driving frequency of 1 to 500 kHz. A shape of a nozzle of the head is not necessarily required to be circle, and is not limited to an elliptical or rectangular shape. A nozzle diameter is preferably in the range of 10 to 100 μm. An opening itself of the nozzle is not necessarily a true circle, but in that case, as a nozzle diameter, a diameter when a circle having an equivalent area to that of an opening is postulated is adopted.

The near-infrared absorptive filter in the present invention preferably has a configuration constituted of groups composed of a colored layer having three colors formed by discharging of ink with three colors RGB.

In the present invention, the remaining ink may be polymerized to form pixels with a step of removing an organic solvent included in liquid droplets to give the remaining ink and irradiating an active energy ray to the remaining ink (hereinafter, it may be also referred to as "first curing step") and/or a step of heating the remaining ink (hereinafter, it may be also referred to as "second curing step"). Furthermore, when the temperature at which heat-polymerization of the remaining ink initiates is T° C., it is also possible that pre-heating is carried out at the temperature of less than T° C. (hereinafter, it may be also referred to as a "pre-heating step") to remove an organic solvent included in the liquid droplets and to obtain the remaining ink, and with the step of irradiating an active energy ray to the remaining ink and/or the step of heating the remaining ink at the temperature of at least T° C. to polymerize the remaining ink, and as a result pixels can be formed.

Hereinafter, first curing step, second curing step and pre-heating step will be explained.

—First Curing Step—

The method of the present invention may comprise a step of curing a pixel of at least one color formed in the pixel forming step, by irradiating the pixel with an active ray (first curing step). In the first curing step, the ink-jet inks of the present invention of the respective colors including red (R), green (G) and blue (B) can be cured to form cured pixels. Curing may be carried out each time a pixel of one color is formed, or may be carried out after pixels of plural colors are formed.

Curing of the R, G and B ink-jet inks of the present invention may be carried out by exposure to a light from an energy source for emitting an active energy ray in a wavelength region corresponding to the photosensitive wavelength of each ink thereby accelerating the polymerization.

The energy source may be suitably selected from, for example, those emitting an UV ray at 400 to 200 nm, far-UV ray, g-line, h-line, i-line, KrF excimer laser light, ArF excimer laser light, electron beam, X-ray, molecular beam and ion beam with which the above-mentioned polymerization initiator can be sensitized. Specifically; a light source for emitting an active ray in the wavelength range of 250 to 450 nm, preferably 365±20 nm, for example, LD, LED (light emitting diode), a fluorescent lamp, a low-pressure mercury lamp, a high-pressure mercury lamp, a metal halide lamp, a carbon arc lamp, a xenon lamp, a chemical lamp or the like may be preferably used in curing. Preferable light sources include LED, a high-pressure mercury lamp, a metal halide lamp, and the like.

The time of irradiation with an active energy ray may be suitably set depending on a combination of the monomer and the polymerization initiator and may be for example 1 to 30 seconds.

—Second Curing Step—

The method of producing a near-infrared absorptive filter according to the present invention may further comprise a step of curing all pixels of desired hues including red (R), green (G) and blue (B) by heating (second curing step). As described above, both the production efficiency and display properties of the near-infrared absorptive filter can be satisfied by providing the method with both the first and second curing steps. Furthermore, curing may be carried out only by the second curing step.

In this step, it is possible that pixels consisting of desired hues and partition walls are formed, and then the first curing step is carried out followed by the heating treatment (so-called baking treatment) to achieve curing by heat. That is, a substrate on which the pixels photo-polymerized with light irradiation and the partition walls have been formed is heated by placing it in an electric oven, a drying oven or the like, or by irradiation with an infrared lamp.

Although the heating temperature and heating time in this step depend on the ink-jet ink composition and the thickness of the pixel, heating is carried out generally preferably at about 120° C. to about 250° C. for about 10 minutes to about 120 minutes, from the viewpoint of securing sufficient solvent resistance, alkali resistance, and UV absorbance.

Furthermore, in the method of producing a near-infrared absorptive filter using an ink-jet ink of the present invention, a pre-heating step may be introduced before carrying out polymerization of pixels by light exposure with an active energy ray and/or by heat treatment. The heating temperature for the pre-heating step is not particularly limited. However, when the temperature at which heat-polymerization of the pixel initiates is T° C., it is preferably less than T° C. so as not to cause polymerization of a pixel area. More preferably, it is between 50° C. and 100° C., and still more preferably 60° C. and 90° C. By introducing this process, evaporation of an organic solvent in the ink which is applied by an ink-jet method is promoted so that the near-infrared absorptive filter can be produced efficiently. Further, as the viscosity of the remaining ink is reduced by heat, higher flowability is obtained and it becomes possible to obtain a near-infrared absorptive filter having pixel areas with high flatness.

As long as the remaining ink is an ink jet ink with flowability like the ink of the present invention, the pre-heating step is effective not only for an ink in which pixel areas are polymerized by heat but also for an ink which is polymerized by light. In case of an ink-jet ink which is polymerized by light, the temperature T at which the ink starts to get polymerized by heat indicates the temperature at which a photo-polymerization initiator, and the like is decomposed by heat to initiate the polymerization reaction or the temperature at which the monomer itself is decomposed by heat to initiate the polymerization reaction.

The time for the pre-heating step is not particularly limited. However, it is preferably carried out for 1 to 5 minutes.

The temperature T can be obtained as follows.

Once an ink-jet ink is heated, the ink starts to polymerize by heating. In this regard, the temperature from which gellation of the ink, etc. is observed is taken as T. More specifically, when an increase in ink viscosity after heating is at least 5 mPa·s higher compared to the ink viscosity before heating, the heating temperature is taken as T.

In the method of producing a near-infrared absorptive filter by using the ink-jet ink of the present invention, the pixel-forming step to the pre-heating step, the first curing step, and the second curing step is preferably carried out within 24 hours. More preferably, it is carried out within 12 hours. Still more preferably, it is carried out within 6 hours. By carrying out the process from pixel-forming step to the final curing step (i.e., second curing step) within 24 hours, aggregation of pigments in the ink or precipitation of various binders, etc. are prevented, and therefore surface state of the pixels can be improved.

(Partition Wall)

In the present invention, an ink-jet ink is discharged onto recessed portions on a substrate comparted with partition walls that is formed on the substrate so as to deposit liquid droplets of the ink jet ink and so as to from a pixel. Any partition wall may be used, but in the case of producing a near-infrared absorptive filter, a partition wall that can function as a black matrix (BM) and has a light-shielding property is preferable. The partition wall may be prepared from the same material and by the same method as a known black matrix for an infrared absorptive filter. As the black matrix for the known infrared absorptive filter, there are, for example, a black matrix described in paragraph numbers [0021] to [0074] of JP-A-2005-3861, and paragraph numbers [0012] to [0021] of JP-A-2004-240039, and the black matrix for an ink jet described in paragraph numbers [0015] to [0020] of JP-A-2006-17980, paragraph numbers [0009] to [0044] of JP-A-2006-10875. In the known preparation methods described above, from the viewpoint of cost reduction, it is preferable to use a photosensitive resin transfer material. The photosensitive resin transfer material has at least a light-shielding resin layer disposed on a temporary support. The light shielding resin layer can be transferred to a substrate by attaching the transfer material to the substrate with pressure.

<Solid-state Imaging Sensing Device Equipped with a Near-infrared Absorptive Filter>

The near-infrared absorptive filter which is produced by adding liquid droplets of the ink-jet ink having the curable ink composition onto recessed portions comparted with partition walls that are formed on a substrate followed by curing has an excellent resistance to light, has almost no absorption in the visible range, and can cut off rays in the near-infrared range. Since this near-infrared absorptive filter has an excellent property of absorbing rays in the near-infrared range and high visible light transmitting property, it may be used as a solid-state imaging sensing device for a video camera and a digital camera, etc.

According to the present invention, there can be provided a curable composition, an ink composition, an ink jet ink, and a resist solution, which are near-infrared absorptive and have high non-visibility. Further, according to the present invention, there can be provided a method of producing a near-infrared absorptive filter using the ink-jet ink and the resist solution.

The present invention can provide a curable composition which has a property of absorbing near-infrared ray and has very small absorption in the visible range. The cured coating film that is produced by using the curing composition exhibits an excellent functional effect of having both near-infrared ray absorption property and the non-visibility.

Furthermore, an image according to the present invention, which is obtained by forming a coating film of the ink-jet ink including the curing ink composition of the present invention and curing the coating film thereafter, has excellent resistance to light and high non-visibility. Therefore, it cannot be seen by naked eyes but can be detected with near-infrared ray, and have resistance to spreading by water and a solvent, etc.

Furthermore, a near-infrared absorptive filter according to the present invention, which is produced by adding liquid droplets of the ink-jet ink having the curable ink composition onto recessed portions comparted with partition walls that are formed on a substrate followed by curing, has an excellent resistance to light, has almost no absorption in the visible range, and can cut off rays in the near-infrared range. As a result, the near-infrared absorptive filter may be used as a solid-state imaging sensing device.

Still furthermore, according to the method of producing a near-infrared absorptive filter comprising the steps of forming a layer by coating the resist solution including the curable composition on a substrate, exposing the layer of the curable composition formed on the substrate via a mask, and forming a pattern image by development, a near-infrared absorptive filter may be formed for each pixel.

EXAMPLES

The present invention will be described in more detail based on the following examples. Materials, amounts to be used, proportions, details and procedures of treatment and processing, or the like, as shown in the examples, may appropriately be modified without departing from the spirit and scope of the present invention. It is therefore understood that the present invention is by no means intended to be limited to the specific examples below. In the following examples and comparative examples, the term "part(s)" and the symbol "%" denote "part(s) by mass" and "% by mass", respectively, unless otherwise specified.

—Synthesis of Near-infrared Absorptive Dye—

Synthetic Example 1

[Preparation of Exemplified Compound (D-17)]

An exemplified compound (D-17) was prepared in accordance with the following scheme 1.

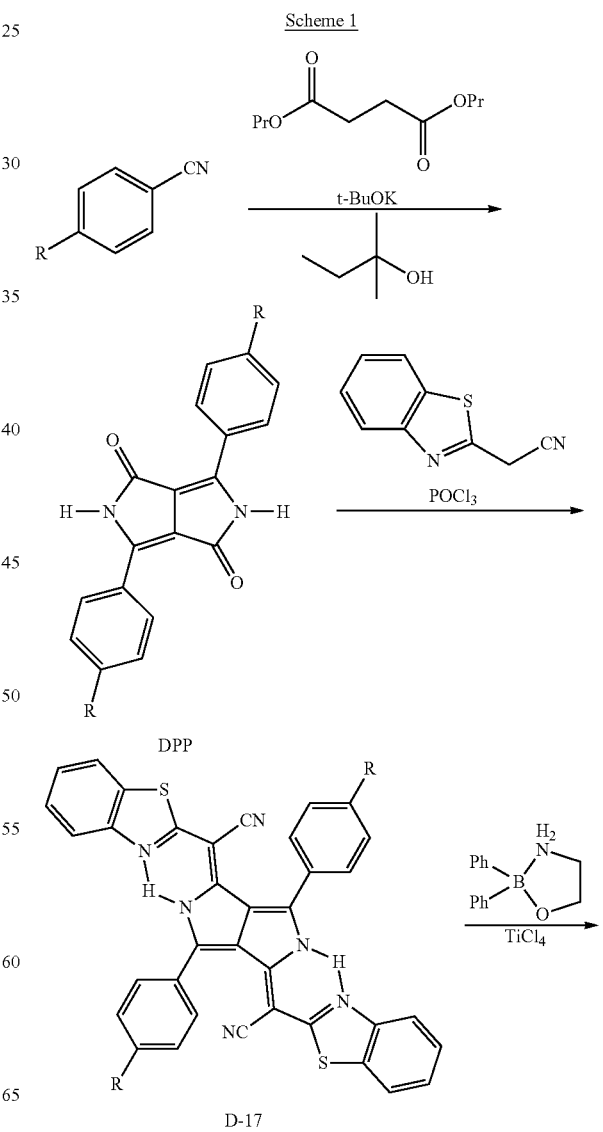

-continued

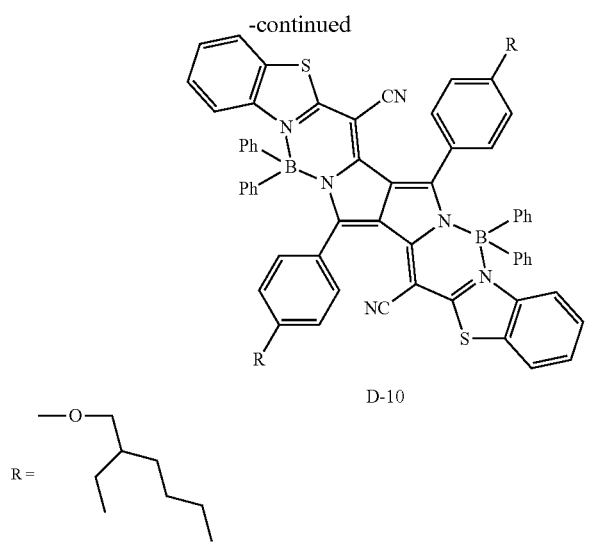

D-10

R = —O—CH₂CH(C₂H₅)C₄H₉ (2-ethylhexyl)

First, a diketopyrrolopyrrole compound (DPP) was synthesized in accordance with a method described in U.S. Pat. No. 5,969,154, using 4-(2-ethylhexyloxy)benzonitrile as a starting material.

In 60 mL of toluene, 3 g (1 molar equivalent) of the diketopyrrolopyrrole compound, and 1.6 g (2.5 molar equivalents) of 2-benzothiazoleacetonitrile were stirred, and then thereto was added 6.5 g (8 molar equivalents) of phosphorus oxychloride. The solution was heated and refluxed for 4 hours. The solution was cooled to room temperature (25° C.), and then thereto were added 50 mL of chloroform and 20 mL of water. Furthermore, the solution was stirred for 30 minutes. Therefrom, the organic layer was taken out by a liquid-separating operation. The organic layer was washed with an aqueous solution of sodium hydrogen carbonate, and then the solvent was distilled off under reduced pressure. The obtained crude product was purified by silica gel column chromatography (solvent: chloroform), and further a chloroform/acetonitrile solvent was used to recrystallize the purified product to yield 3.3 g of the target compound (D-17) (yield: 70%).

$^1$H-NMR (CDCl$_3$): δ 0.9 to 1.0 (m, 12H), 1.35 to 1.6 (m, 16H), 1.8 (m, 2H), 3.95 (d, 4H), 7.1 (d, 4H), 7.4 to 7.5 (m, 4H), 7.7 (d, 4H), 7.75 (d, 2H), 8.0 (d, 2H)

Synthetic Example 2

[Preparation of Exemplified Compound (D-10)]

An exemplified compound (D-10) was prepared in accordance with the scheme 1.

Titanium chloride (0.9 mL, 3 molar equivalents) was added to a 1.2 M solution of 2-aminomethyl diphenylborinate (1.4 g, 3 molar equivalents) in toluene, and then the solution was stirred at an external temperature of 100° C. for 30 minutes. Next, a 0.2 M solution of exemplified compound (D-17) (2.3 g) in toluene was added thereto, and further the solution was stirred for 2 hours under heating and refluxing conditions. The solution was cooled to room temperature, and methanol was added thereto. As a result, a crystal precipitated. The crystal was collected by filtration, and was recrystallized with chloroform/methanol. This process gave 3.0 g of the exemplified compound (D-10) (yield: 93%).

The λmax of the exemplified compound (D-10) was 779 nm in chloroform. The molar absorption coefficient of the exemplified compound (D-10) was $2.06 \times 10^5$ dm$^3$/mol·cm in chloroform.

$^1$H-NMR (CDCl$_3$): δ 0.9 to 1.0 (m, 12H), 1.35 to 1.6 (m, 16H), 1.8 (m, 2H), 3.85 (d, 4H), 6.45 (s, 8H), 7.0 (d, 4H), 7.15 (m, 12H), 7.2 (m, 2H), 7.25 (m, 4H+4H), 7.5 (m, 2H)

Synthetic Example 3

[Preparation of Exemplified Compound (D-28)]

An exemplified compound (D-28) was prepared in the same manner as the above, except that the starting materials were changed. $^1$H-NMR results for identifying the structure thereof are shown below.

Exemplified Compound (D-28)

$^1$H-NMR (CDCl$_3$): 1.9 (s, 6H), 6.65 (d, 2H), 6.7 to 6.8 (m, 6H), 6.95 (m, 8H), 7.0 to 7.1 (m, 4H), 7.25 to 7.35 (m, 12H), 7.5 (m, 2H), 7.85 (d, 2H)

The λmax of the exemplified compound (D-28) was 752 nm in chloroform. The molar absorption coefficient of the exemplified compound (D-28) was $1.53 \times 10^5$ dm$^3$/mol·cm in chloroform.

Synthetic Example 4

[Preparation of Exemplified Compound (D-142)]

An exemplified compound (D-142) was prepared in the same manner as the above, except that the starting materials were changed. The exemplified compound (D-142) had low solubility to DMSO and chloroform, and thus it was impossible to conduct $^1$H-NMR measurement of the exemplified compound (D-142). MALDI-MASS spectrum result for identifying the structure thereof is shown below.

Calculated value: [M+]=1100.42, Measured value: [M-H]=1099.5

The solution absorption spectra of exemplified compounds (D-10) and (D-28) are shown in FIG. 1.

It was found that each of exemplified compounds (D-10) and (D-28) was good in the absorptivity of near-infrared rays and was small in absorptivity in the range of 400 to 500 nm so as to be excellent in invisibility.

—Preparation of a Fine-particle Dispersion—

Preparation Example 1

[Preparation of a Fine-particle Dispersion Including the Exemplified Compound (D-142)]

Figure 2:
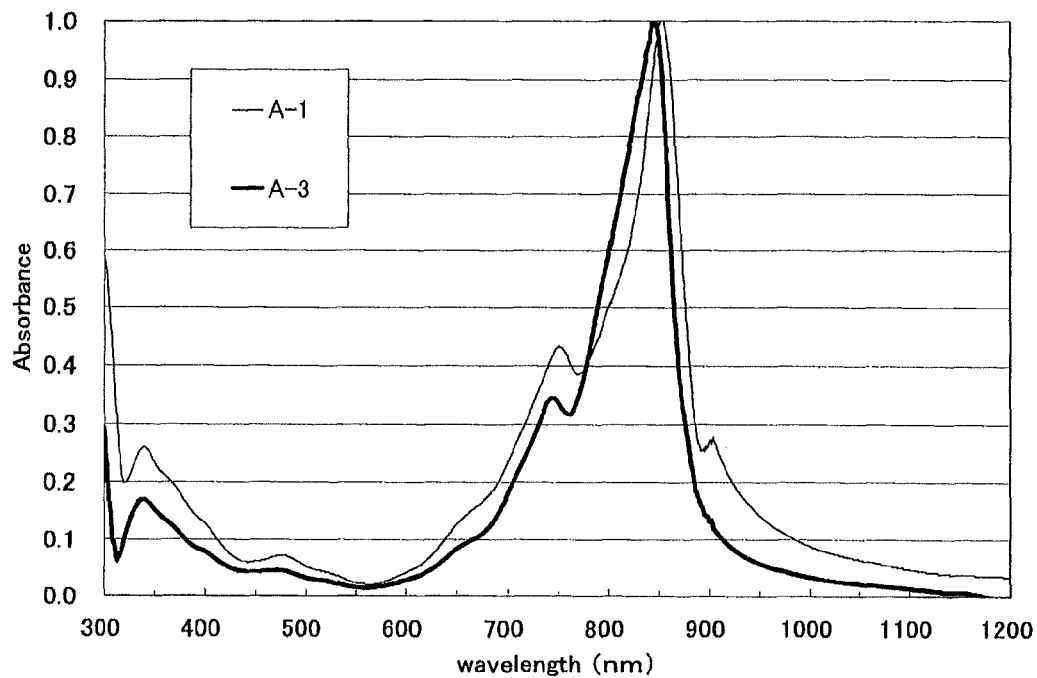
FIG. 2 is a graph showing absorption spectra of fine-particle dispersions A-1 and A-3.
Figure 3:
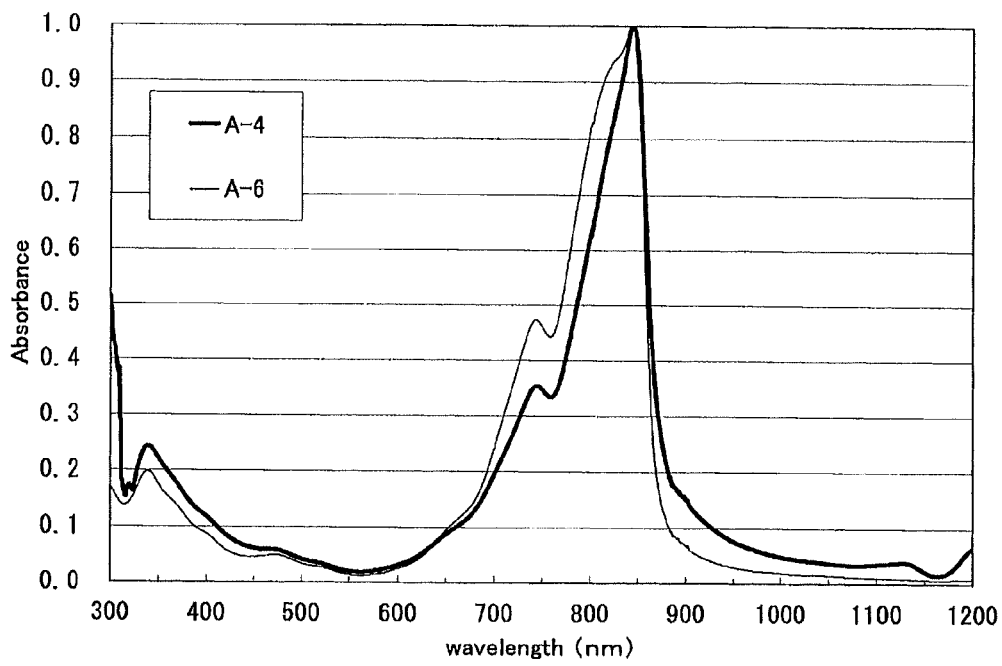
FIG. 3 is a graph showing absorption spectra of fine-particle dispersions A-4 and A-6.

To the near-infrared absorptive compound (5 parts by mass) shown in Table 1 below and a dispersant (5 parts by mass), a dispersion medium (90 parts by mass) was added to obtain 100 parts by mass. In addition, zirconia beads of 0.1 minφ were added in an amount of 100 parts by mass and treated with a planetary ball mill at 300 rpm for 8 hours. After that, the beads were separated by filtration and the dispersions A-1 to A-6, each of which consists of fine particles, were prepared. Absorption spectra of the dispersions A-1, A-3, A-4 and A-6, each of which is normalized against the maximum absorption wavelength, are shown in FIG. 2 (A-1 and A-3) and FIG. 3 (A-4 and A-6). The absorption spectra were measured by diluting the dispersions with the dispersion medium. As shown in FIG. 2 and FIG. 3, the dispersions A-1, A-3, A-4 and A-6 all have absorption of 0.1 or less at 550 nm, and therefore it was found that they have almost no absorption in the visible range and has high non-visibility. In addition, the absorptions in the infrared range were found to be very sharp.

TABLE 1

| Entry | Near-infrared absorptive dye | Dispersant | Dispersion medium |
|---|---|---|---|
| A-1 | D-10 | W-1 | S-1 |
| A-2 | D-10 | W-1 | S-2 |
| A-3 | D-142 | W-1 | S-1 |
| A-4 | D-142 | W-1 | S-2 |
| A-5 | D-142 | W-1 | S-3 |
| A-6 | D-142 | W-1 | S-4 |

Dispersant
W-1: Solsperse 55000 (trade name, manufactured by Avecia)
Dispersion medium
S-1: Propyleneglycol monomethylether acetate (PEGMEA)
S-2: N-vinylcaprolactam (NVC)
S-3: Phenoxyethyl acrylate (PEA)
S-4: Dipropyleneglycol diacrylate (DPGDA)

—Preparation of a Photo-curable Ink Composition—

Example 1

The following components were stirred by a high-speed water-cooling type stirrer to give a photo-curable ink composition B-1.

| | |
|---|---|
| Fine-particle dispersion A-4 | 20.0 parts |
| N-vinylcaprolactam (NVC) | 42.0 parts |
| Dipropyleneglycol diacrylate (DPGDA) | 30.0 parts |
| Irgacure 819 (trade name, manufactured by Ciba Specialty Chemicals Inc., photo-polymerization initiator) | 8.0 parts |

Example 2

The following components were stirred by a high-speed water-cooling type stirrer to give a photo-curable ink composition B-2.

| | |
|---|---|
| Fine-particle dispersion A-5 | 20.0 parts |
| N-vinylcaprolactam (NVC) | 25.0 parts |
| Phenoxyethyl acrylate (PEA) | 20.0 parts |
| Dipropyleneglycol diacrylate (DPGDA) | 23.0 parts |
| Irgacure 907 (trade name, manufactured by Ciba Specialty Chemicals Inc., photo-polymerization initiator) | 4.0 parts |
| Darocur TPO (trade name, manufactured by Ciba Specialty Chemicals Inc., photo-polymerization initiator) | 8.0 parts |

—Production of a Cured Coating Film by Light Irradiation—

Example 3

The photo-curable ink composition B-1 described above was applied on a glass substrate having a thickness of 1.0 mm by spin coating method. After that, light with exposure energy of 2000 mJ/cm² at 365 nm was irradiated thereto to produce a cured coating film C-1.

Example 4

A cured coating film C-2 was prepared by carrying out the same procedures as Example 3, except that the photo-curable ink composition was changed from B-1 to B-2.

—Preparation of a Heat-curable Ink-jet Ink—

Example 5

The following components were stirred by a high-speed water-cooling type stirrer to give an ink composition B-3.

| | |
|---|---|
| Fine-particle dispersion A-3 | 30.0 parts |
| EHPE 3150 (trade name, manufactured by DAICEL CHEMICAL INDUSTRIES, LTD., epoxy resin) | 10.5 parts |
| COMPOCERAN E103A (solid content: 50%) (trade name, manufactured by Arakawa Chemical Industries, Ltd., silane modified epoxy resin having alkoxy group) | 10.5 parts |
| RIKACID MTA-15 (trade name, manufactured by New Japan Chemical Co., Ltd., heat-polymerization initiator) | 0.5 part |
| Propyleneglycol monomethylether acetate (PEGMEA) | 48.5 parts |

—Production of a Cured Coating Film by Heat Curing—

Example 6

The heat-curable ink jet ink described above was applied on a glass substrate having a thickness of 0.7 mm by spin coating method. After that, pre-baking was carried on a hot plate at 90° C. for 10 minutes. After that, it was heated in a clean oven at 200° C. for 30 minutes for carrying out the post-baking followed by further post-baking by heating at 240° C. for 30 minutes to produce a cured coating film C-3.

Figure 4:
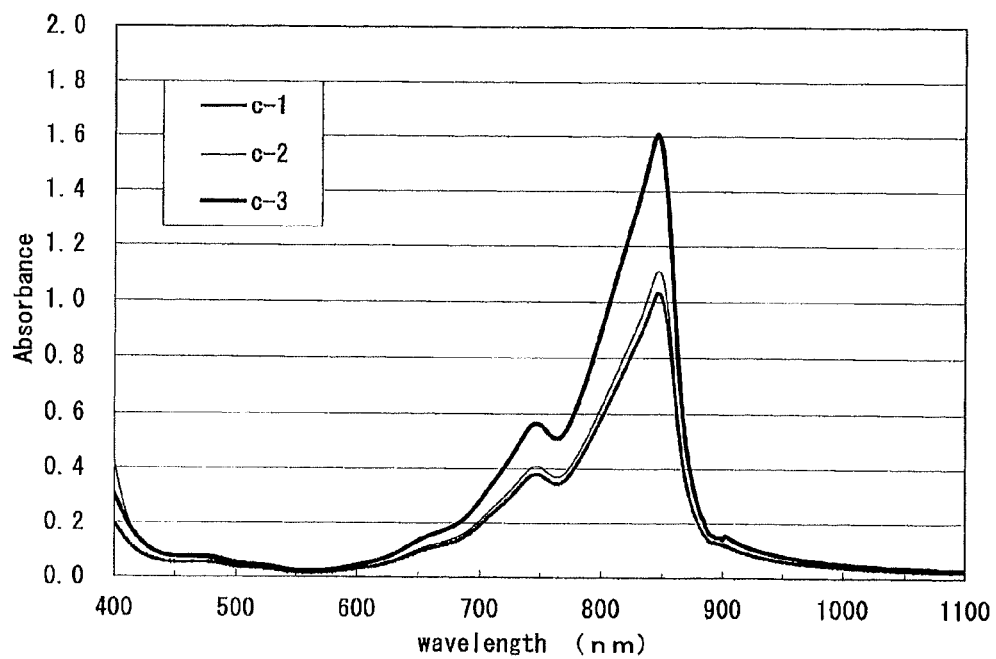
FIG. 4 is a graph showing transmission spectra of cured coating films C-1, C-2 and C-3.

Transmission spectra of the cured coating films C-1, C-2 and C-3, that were obtained in Examples 3, 4 and 6, respectively, are shown in FIG. 4. As shown in FIG. 4, C-1, C-2 and C-3 all have absorption of 0.1 or less at 550 nm, and therefore it was found that they have almost no absorption in the visible range and have very high non-visibility. Furthermore, the absorptions in the infrared range were found to be very sharp. Still furthermore, it was found that spectrum change due to the curing reaction was not observed in the visible range and the near-infrared range, and deterioration of the near-infrared absorptive dye due to the curing and deterioration of a dispersion state having the fine particles did not occur.

Comparative Example

A dispersion A'-7 was prepared in the same manner as the method of producing A-4 in Preparation Example 1, except that the following exemplified compound I-2, which is described in JP-A-2002-146254, was used instead of the exemplified compound D-142,

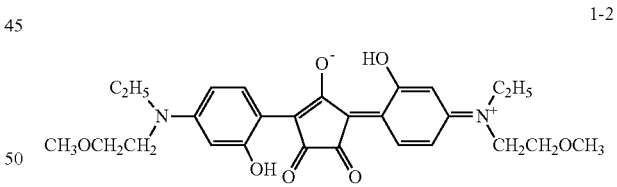

I-2

Subsequently, an ink composition B'-4 was obtained in the same manner as Example 1, except that the dispersion A'-7 was used instead of the dispersion A-4. Furthermore, an ink composition C-4 was obtained in the same manner as Example 3, except that the ink composition B'-4 was used instead of the ink composition B-1.

—Light Resistance Test of a Cured Coating Film—

Example 7

The cured coating films C-1, C-2, C-3 and C-4 were set in a discoloration tester equipped with super Xenon lamp (220,000 lux), and light irradiation was carried out for 48 hours under the condition that no UV cut filter is used. After that, the transmission spectra of the cured coating films were measured after irradiation, and the residual rate was calculated with respect to the absorbance at maximum absorption wavelength.

The residual rate is defined as follows:

Residual rate (%)=(absorption after irradiation)÷(absorption before irradiation)×100, and higher value indicates better fastness.

The residual rate values are given below.

C-1: 97% (Example 3)
C-2: 94% (Example 4)
C-3: 96% (Example 6)
C-4: 22% (Comparative example)

From the above results, it was found that the cured coating film using the curable composition which includes the near-infrared absorptive dye of the present invention shows much higher light fastness compared to comparative examples.

—Preparation of a Photo-curable Ink-jet Ink—

Example 8

The following components were stirred by a high-speed water-cooling type stirrer to give an ink composition B-5.

| | |
|---|---|
| Fine-particle dispersion A-4 | 10.0 parts |
| Fine-particle dispersion A-6 | 10.0 parts |
| LIGHT-ACRYLATE L-A | 20.4 parts |
| [Lauryl acrylic acid ester:monofunctional acrylate] | |
| Actilane 421 (trade name, manufactured by Akcros Chemicals) [Propoxylated neopentyl glycol diacrylate:bifunctional acrylate] | 16.0 parts |
| Photomer 2017 (trade name, manufactured by EChem, UV diluent) | 23.0 parts |
| Genorad 16 (trade name, manufactured by Rahn, stabilizer) | 0.05 part |
| Rapi-Cure DVE-3 (trade name, manufactured by ISP Europe, vinyl ether) | 8.0 parts |
| Darocur TPO (trade name, manufactured by Ciba Specialty Chemicals Inc., photo-polymerization initiator) | 8.5 parts |
| Irgacure 907 (trade name, manufactured by Ciba Specialty Chemicals Inc., photo-polymerization initiator) | 4.0 parts |
| Byk 307 (trade name, manufactured by BYK Chemie, anti-foaming agent) | 0.05 part |

—Printing of an Ink-jet Ink—

Example 9

The obtained ink jet ink B-5 was discharged as a droplet on a polyvinyl chloride sheet and irradiated with UV ray by passing the sheet under UV light emitting diode (UV-LED) at a given speed. As a result, the ink was cured and a printed material C-5 was obtained.

In the example, discharging of the ink was performed by using a commercially available ink-jet recording device which is equipped with a piezo-type ink jet nozzle. For a light emitting diode for curing (UV-LED), NCCU033 (manufactured by Nichia Corporation.) was used. The LED emits UV ray having wavelength of 365 nm per single chip, and with application of current of about 500 mA, about 100 mW light is emitted from the chip. Multiple chips are aligned at 7 mm interval to obtain power of 0.3 W/cm$^2$ on the surface of a recording medium (hereinafter, also referred to as medium). The time from discharging of the ink to light exposure and the light exposure time can be varied depending on the conveying speed of the medium and the distance between the head and the LED of conveying direction. In the example, the exposure is carried out about 0.5 seconds after landing. The light exposure energy on the medium was adjusted to 1500 mJ/cm$^2$. Further, the ink-supplying system of the ink-jet recording device used for the evaluation consists of a base tank, a supply pipe, an ink supply tank right before an ink jet head, a filter, and a piezo-type ink-jet head. The region from the ink supply tank to the ink-jet head was thermally insulated and heated. The temperature sensors were provided near the ink supply tank and the ink-jet head nozzle, respectively. Temperature control was carried out to maintain the nozzle temperature constantly at 70° C.±2° C. The piezo-type ink-jet head was driven to discharge multi-size dots of 8 pl to 30 pl, with resolution of 720×720 dpi. In addition, the "dpi" described in the present invention indicates the number of dots per 2.54 cm.

The resulting printed material C-5 has no sticky feeling to the touch and, even when it is pressed against a commercial copy paper, no part of the film (cured ink-jet ink) was peeled off. Furthermore, the printed image was not eye-catching, and therefore has high non-visibility. Furthermore, when observed by a CCD camera equipped with a filter for cutting visible light, the boundary between the printed area and the non-printed area was clearly recognizable. Thus, it was found that the near-infrared absorptive image of the present invention is useful as information display which is not eye-catching.

—Preparation of a Resist Solution—

Example 10

| (1) Preparation of a resist solution D (negative type) | |
|---|---|
| Composition | |
| PGMEA | 5.20 parts |
| Cyclohexanone | 52.6 parts |
| Binder (41% cyclohexanone solution of benzylmethacrylate/methacrylic acid/ 2-hydroxyethylmethacrylate copolymer (molar ratio = 60:20:20)) | 30.5 parts |
| Dipentaerythritol hexaacrylate | 10.2 parts |
| Polymerization inhibitor (p-methoxyphenol) | 0.006 part |
| Fluorine-containing surfactant (trade name: F-475, manufactured by DIC Corporation) | 0.80 part |
| Photopolymerization initiator TAZ-107 (trade name, manufactured by Midori Kagaku Co., Ltd.) | 0.58 part |

The components described above were mixed and dissolved to prepare the resist solution D.

(2) Production of Glass Substrate with Undercoat Layer Applied Thereon

A glass substrate (Corning 1737) was cleaned ultrasonically using an aqueous 0.5% NaOH solution, followed by washing with water and dehydration-baking (200° C./20 minutes). Then, the resist solution D obtained in the above (1) was applied to the cleaned glass substrate in a film thickness of 2 µm by using a spin coater and dried at 220° C. for one hour to form a cured coating film (undercoat layer).

| (3) Preparation of a resist solution E (negative type) | |
|---|---|
| Composition | |
| Fine-particle dispersion A-1 | 40.0 parts |
| Cyclohexanone | 44.0 parts |
| Dipentaerythritol hexaacrylate | 15.0 parts |
| Polymerization inhibitor (p-methoxyphenol) | 0.006 part |
| Fluorine-containing surfactant (trade name: F-475, manufactured by DIC Corporation) | 0.80 part |
| Photopolymerization initiator TAZ-107 (trade name, manufactured by Midori Kagaku Co., Ltd.) | 2.0 parts |

The components described above were mixed and dissolved to prepare the resist solution E (resist solution [negative type]), —Exposure and Development of Resist (Image Formation)—

The resist solution E obtained in (3) above was applied onto the undercoat layer formed on the substrate with the undercoat layer obtained in (2) above to a film thickness of 0.6 μm using a spin coater, and prebaked at 100° C. for 120 seconds.

Subsequently, exposure was performed on the coating film using an exposure apparatus at a wavelength of 365 nm via a mask having 2 μm width, with exposure amount of 200 mJ/cm$^2$. After the exposure, development was performed using developer CD-2000 (trade name, manufactured by FUJIFILM Electronic Materials Co., Ltd.) at 25° C. for 40 seconds, followed by rinsing with running water for 30 seconds and spray-drying. After that, post-baking was carried out at 200° C. for 15 minutes.

The infrared absorptive pattern as obtained above showed good near-infrared absorption property, and therefore it was found that it may be suitably used as a near-infrared absorptive filter.

—Preparation of a Photo-curable Ink-jet Ink—

Example 11

The following components were stirred by a high-speed water-cooling type stirrer to give an ink composition B-6.

| | |
|---|---|
| Fine-particle dispersion A-4 | 7.0 parts |
| Fine-particle dispersion A-6 | 7.0 parts |
| DPCA-60 (trade name, manufactured by NIPPON KAYAKU CO., LTD., caprolactone modified dipentaerythritol hexaacrylate) | 16.0 parts |
| KF-353 (trade name, manufactured by Shin-Etsu Chemical Co., Ltd., polyether modified silicone oil) | 0.5 part |
| Cyclohexanone | 69.5 parts |

(Formation of Partition Wall Substrate)

An alkali-free glass substrate was washed with an UV cleansing apparatus, then washed with a brush using a detergent and further washed by ultrasonic cleaning with ultrapure water. The substrate was heat-treated at 120° C. for 3 minutes to stabilize its surface state.

The substrate was cooled, then regulated at a temperature of 23° C., and coated with a deeply-colored ink composition B-6 prepared as described above, by using a glass-substrate coater equipped with a slit-shaped nozzle (trade name: MH-1600, manufactured by F.A.S. Asia). Subsequently, a part of the solvent was evaporated for 30 seconds with VCD (vacuum drier, manufactured by Tokyo Ohka Kogyo Co., Ltd.) to eliminate the fluidity of the coating layer, and the specimen was pre-baked at 120° C. for 3 minutes to give a deeply-colored composition layer K1 of 2.3 μm in thickness.

Pattern exposure was carried out in a nitrogen atmosphere with exposure amount of 300 mJ/cm$^2$, partition wall width of 20 μm and space width of 100 μm by using the proximity-type exposure device (manufactured by Hitachi High-Tech Electronics Engineering Co., Ltd.) having an ultrahigh pressure mercury lamp while the substrate and a mask (a quartz exposure mask having an image pattern) were set up perpendicularly with a distance of 200 μm between the surface of the exposure mask and the deeply-colored photosensitive layer K1.

Then, the surface of the deeply-colored composition layer K1 was uniformly moistened by spraying it with purified water via a shower nozzle, and then shower-developed at 23° C. for 80 seconds with a 100-fold diluted solution of a KOH type developer (trade name: CDK-1, containing a nonionic surfactant, manufactured by FUJIFILM Electronic Materials Co., Ltd.) at a pressure of 0.04 MPa in a flat nozzle, to give a patterning image. Subsequently, ultra pure water was sprayed using a ultrahigh pressure shower nozzle at a pressure of 9.8 Mpa to remove residues, post-exposure was carried out with exposure amount of 2500 mJ/cm$^2$ from the side in which deeply-colored composition layer K1 is formed on the substrate, and heating was carried out in an oven at 240° C. for 50 minutes to obtain a stripe-patterned partition wall having film thickness of 2.0 μm, optical density of 4.0, and an opening with 100 μm width.

(Ink-Repellency-Providing Plasma Treatment)

The partition wall-formed substrate was subjected to ink-repellency-providing plasma treatment using a cathode-coupling parallel-plate plasma treatment apparatus under the following conditions;

Gas used: $CF_4$

Gas flow rate: 80 sccm

Pressure: 40 Pa

RF power: 50 W

Treatment time: 30 sec

The ink composition B-6 was discharged to the region that is separated by partition wall on a substrate as obtained above (i.e., recessed portions that are surrounded by protruded portions) by using an ink jet printer (trade name: DMP-2831, manufactured by FUJIFILM Dimatix). After that, heating was carried out in an oven at 100° C. for 2 minutes. Thereafter, it was left in the oven at 220° C. for 30 minutes.

The near-infrared absorptive pattern as obtained above showed favorable near-infrared absorption property, and therefore it was found that it can be suitably used as a near-infrared absorptive filter.

From the results above, it was found that the curable composition, ink, resist solution and their cured coating film, and the near-infrared absorptive image and the near-infrared absorptive filter formed by using them have an excellent characteristic of high non-visibility and high fastness.

Having described our invention as related to the present embodiments, it is our intention that the present invention not be limited by any of the details of the description, unless otherwise specified, but rather be construed broadly within its spirit and scope as set out in the accompanying claims.

What we claim is:

1. A curable composition, comprising a polymerizable monomer, a polymerization initiator, and a near-infrared absorptive dye represented by formula (1):

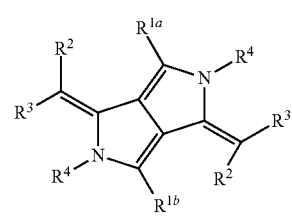

Formula (1)

wherein $R^{1a}$ and $R^{1b}$ may be the same or different, and each independently represent an alkyl group, an aryl group, or a heteroaryl group, and when $R^{1a}$ and $R^{1b}$ represent an aryl or heteroaryl group, at least one of $R^{1a}$ and $R^{1b}$ has an alkoxy group whose alkyl moiety is a branched alkyl group; $R^2$ and $R^3$ each independently represent a hydrogen atom or a substituent, and at least one of $R^2$ and $R^3$ is an electron withdrawing group; $R^2$ and $R^3$ may be bonded to each other to form a ring; and $R^4$ represents a hydrogen atom, an alkyl group, an aryl group, a heteroaryl group, a substituted boron, or a metal atom, and $R^4$ may be covalently bonded or coordinately bonded to at least one among $R^{1a}$, $R^{1b}$ and $R^3$, wherein the polymerizable monomer is a (meth)acrylic monomer having three or more polymerizing groups.

2. The curable composition according to claim 1, wherein $R^4$ in formula (1) is a substituted boron.

3. The curable composition according to claim 1, wherein the near-infrared absorptive dye represented by formula (1) is a dye represented by any one of formulae (2) to (4):

Formula (2)

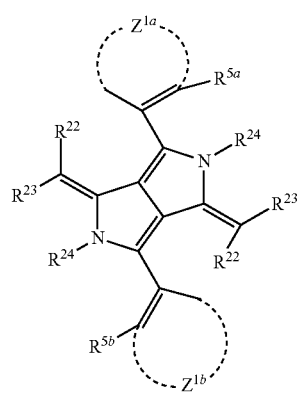

wherein $Z^{1a}$ and $Z^{1b}$ each independently represent an atomic group that forms an aryl ring or a heteroaryl ring; $R^{5a}$ and $R^{5b}$ each independently represent an aryl group having 6 to 20 carbon atoms, a heteroaryl group having 4 to 20 carbon atoms, an alkyl group having 1 to 20 carbon atoms, an alkoxy group having 1 to 20 carbon atoms whose alkyl moiety is a branched alkyl group, an alkoxycarbonyl group having 1 to 20 carbon atoms, a carboxyl group, a carbamoyl group having 1 to 20 carbon atoms, a halogen atom, or a cyano group; $R^{5a}$ or $R^{5b}$ may be bonded to $Z^{1a}$ or $Z^{1b}$ to form a condensed ring; $R^{22}$ and $R^{23}$ each independently represent a cyano group, an acyl group having 1 to 6 carbon atoms, an alkoxycarbonyl group having 1 to 6 carbon atoms, an alkylsulfinyl or arylsufinyl group having 1 to 10 carbon atoms, or a nitrogen-containing heteroaryl group having 3 to 20 carbon atoms, or $R^{22}$ and $R^{23}$ may be bonded to each other to form a cyclic acidic nucleus; $R^{24}$ represents a hydrogen atom, an alkyl group having 1 to 20 carbon atoms, an aryl group having 6 to 20 carbon atoms, a heteroaryl group having 4 to 20 carbon atoms, a metal atom, or a substituted boron having at least one substituent selected from a halogen atom, an alkyl group having 1 to 10 carbon atoms, an aryl group having 6 to 20 carbon atoms, and a heteroaryl group having 4 to 20 carbon atoms; and $R^{24}$ may be covalently bonded or coordinately bonded to $R^{23}$;

Formula (3)

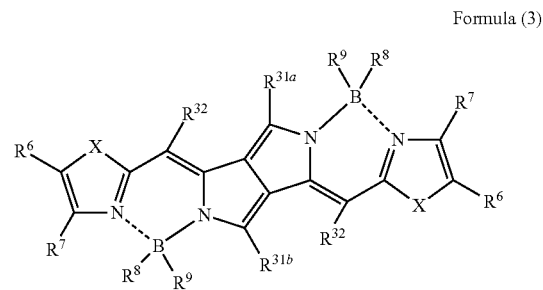

wherein $R^{31a}$ and $R^{31b}$ each independently represent an alkyl group having 1 to 20 carbon atoms, an aryl group having 6 to 20 carbon atoms, or a heteroaryl group having 3 to 20 carbon atoms, which aryl or heteroaryl group has an alkoxy group whose alkyl moiety is a branched alkyl group; $R^{32}$ represents a cyano group, an acyl group having 1 to 6 carbon atoms, an alkoxycarbonyl group having 1 to 6 carbon atoms, an alkylsulfinyl or arylsulfinyl group having 1 to 10 carbon atoms, or a nitrogen-containing heteroaryl group having 3 to 10 carbon atoms; $R^6$ and $R^7$ each independently represent a hydrogen atom, an alkyl group having 1 to 10 carbon atoms, an aryl group having 6 to 10 carbon atoms, or a heteroaryl group having 4 to 10 carbon atoms; $R^6$ and $R^7$ may be bonded to each other to form a ring, and the formed ring is an alicycle having 5 to 10 carbon atoms, an aryl ring having 6 to 10 carbon atoms, or a heteroaryl ring having 3 to 10 carbon atoms; $R^8$ and $R^9$ each independently represent an alkyl group having 1 to 10 carbon atoms, an alkoxy group having 1 to 10 carbon atoms, an aryl group having 6 to 20 carbon atoms, or a heteroaryl group having 3 to 10 carbon atoms; X represents an oxygen atom, a sulfur atom, —NR—, —CRR'—, or —CH=CH— wherein R and R' each independently represent a hydrogen atom, an alkyl group having 1 to 10 carbon atoms, or an aryl group having 6 to 10 carbon atoms; and Formula (4)

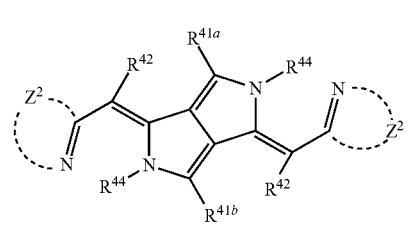

wherein $R^{41a}$ and $R^{41b}$ represent groups different from each other and each represent an alkyl group having 1 to 20 carbon atoms, an aryl group having 6 to 20 carbon atoms, or a heteroaryl group having 3 to 20 carbon atoms, and when $R^{41a}$ and $R^{41b}$ represent an aryl or heteroaryl group, at least one of $R^{41a}$ and $R^{41b}$ has an alkoxy group whose alkyl moiety is a branched alkyl group; $R^{42}$ represent a cyano group, an acyl group having 1 to 6 carbon atoms, an alkoxycarbonyl group having 1 to 6 carbon atoms, an alkylsulfinyl or arylsulfinyl group having 1 to 10 carbon atoms, or a nitrogen-containing heteroaryl group having 3 to 10 carbon atoms; $Z^2$ represents a group of atoms which is combined with —C=N— to form a nitrogen-containing, 5- or 6-membered heteroring, and the nitrogen-containing heteroring may be a pyrazole ring, a thiazole ring, an oxazole ring, an imidazole ring, an oxadiazole ring, a thiadiazole ring, a triazole ring, a pyridine ring, a pyridazine ring, a pyrimidine ring, or a pyrazine ring, a benzo-condensed ring or a naphtho-condensed ring thereof, or a composite made from these condensed rings; $R^{44}$ represents a hydrogen atom, an alkyl group having 1 to 20 carbon atoms, an aryl group having 6 to 20 carbon atoms, a heteroaryl group having 4 to 20 carbon atoms, a metal atom, or a substituted boron having at least one substituent selected from a halogen atom, an alkyl group having 1 to 10 carbon atoms, an aryl group having 6 to 20 carbon atoms, and a heteroaryl group having 4 to 20 carbon atoms; $R^{44}$ may be covalently bonded or coordinately bonded to the nitrogen-containing heteroring which $Z^2$ forms; and the above dye may further be substituted.

4. The curable composition according to claim 1, wherein the near-infrared absorptive dye represented by any one of formulae (1) to (4) has a maximum absorption wavelength for rays in a range of 700 nm to 1000 nm.

5. The curable composition according to claim 1, comprising the near-infrared absorptive dye represented by any one of formulae (1) to (4) in a fine-particle-dispersion state.

6. A curable ink composition, comprising the curable composition according to claim 1.

7. An ink-jet ink, comprising the curable ink composition according to claim 6.

8. A resist solution, comprising the curable composition according to claim 1.

9. A method of producing a cured coating film of the curable composition according to claim 1, comprising irradiating the coating film of the curable composition with active radiation and/or heating the coating film of the curable composition.

10. A method of forming an image, comprising the steps of forming a coating film of the ink-jet ink according to claim 8 on a substrate and curing the coating film thereafter.

11. A method of producing a near-infrared absorptive filter, comprising the steps of forming a layer by coating the resist solution according to claim 7 on a substrate, exposing the layer of the curable composition formed on the substrate via a mask, and forming a pattern image by development.

12. A method of producing a near-infrared absorptive filter, which comprises discharging liquid droplets of the ink-jet ink according to claim 7 onto recessed portions comparted with partition walls formed on a substrate so as to form a pixel of the near-infrared absorptive filter.

13. A solid-state imaging sensing device, comprising the near-infrared absorptive filter that is produced according to the method of producing a near-infrared absorptive filter according to claim 12.

14. The curable composition according to claim 1, wherein the content of the near-infrared absorptive dye is 0.01 to 30% by mass.

15. The curable composition according to claim 1, wherein the polymerization initiator is selected from the group consisting of 2-trichloromethyl-5-(p-styrylstyryl)-1,3,4-oxadiazole, 2,4-bis(trichloromethyl)-6-[4'-(N,N-bisethoxycarbonyl methylamino)-3'-bromophenyl]-s-triazine, 2-methyl-1-phenyl-2-morpholinopropane-1-one, 2-methyl-1-[4-(hexyl)phenyl]-2-morpholinopropane-1-one, and 2-ethyl-2-dimethylamino-1-(4-morpholinophenyl)-butanone-1.

16. The curable composition according to claim 3, wherein in formula (3), X represents an oxygen atom, a sulfur atom, —NR—, or —CRR'—, wherein R and R' each independently represents a hydrogen atom, an alkyl group having 1 to 10 carbon atoms, or an aryl group having 6 to 10 carbon atoms.

17. The curable composition according to claim 1, wherein the (meth)acrylic monomer is a tri-functional monomer selected from the group consisting of trimethylolpropane triacrylate, trimethylolpropane (propylene oxide)-modified triacrylate, trimethylolpropane (ethylene oxide)-modified triacrylate, trimethylolpropane trimethacrylate, and pentaerythritol triacrylate.

18. The curable composition according to claim 1, wherein the (meth)acrylic monomer is selected from the group consisting of pentaerythritol tetraacrylate, pentaerythritol tetramethacrylate, dipentaerythritol pentaacrylate, dipentaerythritol pentamethacrylate, dipentaerythritol hexaacrylate, and dipentaerythritol hexamethacrylate.

19. The curable composition according to claim 1, wherein the polymerization initiator is an oxime initiator.

20. The curable composition according to claim 1, wherein the polymerization initiator is a triazine initiator.

21. The curable composition according to claim 1, wherein the content of the polymerization initiator is 0.1 to 10% by mass with respect to 100% by mass of the polymerizable monomer.

22. The curable composition according to claim 1, wherein the curable composition further comprises a polymerizable binder.

23. The curable composition according to claim 1, wherein the curable composition further comprises a cross linking agent and wherein the crosslinking agent is an epoxy resin.

24. A curable composition, comprising a polymerizable monomer and/or a polymerizable binder, a polymerization initiator, and a near-infrared absorptive dye represented by any one of formulae (2) to (4):

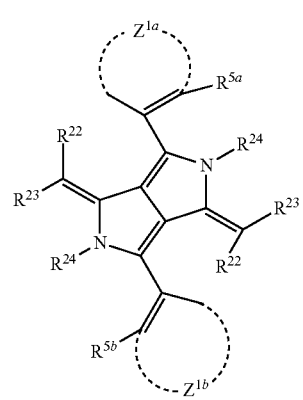

Formula (2)

wherein $Z^{1a}$ and $Z^{1b}$ each independently represent an atomic group that forms an aryl ring or a heteroaryl ring; $R^{5a}$ and $R^{5b}$ each independently represent an aryl group having 6 to 20 carbon atoms, a heteroaryl group having 4 to 20 carbon atoms, an alkyl group having 1 to 20 carbon atoms, an alkoxy group having 1 to 20 carbon atoms, an alkoxycarbonyl group having 1 to 20 carbon atoms, a carboxyl group, a carbamoyl group having 1 to 20 carbon atoms, a halogen atom, or a cyano group; $R^{5a}$ or $R^{5b}$ may be bonded to $Z^{1a}$ or $Z^{1b}$ to form a condensed ring; $R^{22}$ and $R^{23}$ each independently represent a cyano group, an acyl group having 1 to 6 carbon atoms, an alkoxycarbonyl group having 1 to 6 carbon atoms, an alkylsulfinyl or arylsufinyl group having 1 to 10 carbon atoms, or a nitrogen-containing heteroaryl group having 3 to 20 carbon atoms, or $R^{22}$ and $R^{23}$ may be bonded to each other to form a cyclic acidic nucleus; $R^{24}$ represents a hydrogen atom, an alkyl group having 1 to 20 carbon atoms, an aryl group having 6 to 20 carbon atoms, a heteroaryl group having 4 to 20 carbon atoms, a metal atom, or a substituted boron having at least one substituent selected from a halogen atom, an alkyl group having 1 to 10 carbon atoms, an aryl group having 6 to 20 carbon atoms, and a heteroaryl group having 4 to 20 carbon atoms; and $R^{24}$ may be covalently bonded or coordinately bonded to $R^{23}$;

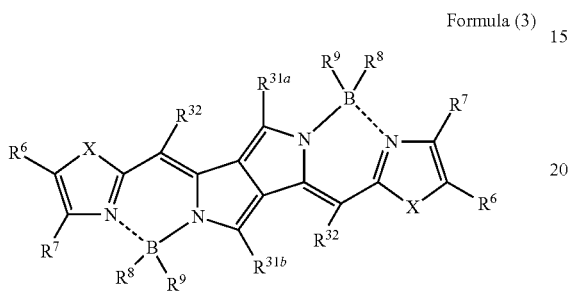

Formula (3)

wherein $R^{31a}$ and $R^{31b}$ each independently represent an alkyl group having 1 to 20 carbon atoms, an aryl group having 6 to 20 carbon atoms, or a heteroaryl group having 3 to 20 carbon atoms; $R^{32}$ represents a cyano group, an acyl group having 1 to 6 carbon atoms, an alkoxycarbonyl group having 1 to 6 carbon atoms, an alkylsulfinyl or arylsulfinyl group having 1 to 10 carbon atoms, or a nitrogen-containing heteroaryl group having 3 to 10 carbon atoms; $R^6$ and $R^7$ each independently represent a hydrogen atom, an alkyl group having 1 to 10 carbon atoms, an aryl group having 6 to 10 carbon atoms, or a heteroaryl group having 4 to 10 carbon atoms; $R^6$ and $R^7$ may be bonded to each other to form a ring, and the formed ring is an alicycle having 5 to 10 carbon atoms, an aryl ring having 6 to 10 carbon atoms, or a heteroaryl ring having 3 to 10 carbon atoms; $R^8$ and $R^9$ each independently represent an alkyl group having 1 to 10 carbon atoms, an alkoxy group having 1 to 10 carbon atoms, an aryl group having 6 to 20 carbon atoms, or a heteroaryl group having 3 to 10 carbon atoms; X represents an oxygen atom, a sulfur atom, —NR—, or —CRR'—, wherein R and R' each independently represents a hydrogen atom, an alkyl group having 1 to 10 carbon atoms, or an aryl group having 6 to 10 carbon atoms; and

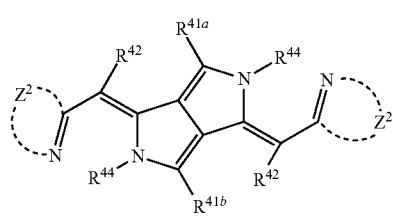

Formula (4)

wherein $R^{41a}$ and $R^{41b}$ represent groups different from each other and each represent an alkyl group having 1 to 20 carbon atoms, an aryl group having 6 to 20 carbon atoms, or a heteroaryl group having 3 to 20 carbon atoms; $R^{42}$ represent a cyano group, an acyl group having 1 to 6 carbon atoms, an alkoxycarbonyl group having 1 to 6 carbon atoms, an alkylsulfinyl or arylsulfinyl group having 1 to 10 carbon atoms, or a nitrogen-containing heteroaryl group having 3 to 10 carbon atoms; $Z^2$ represents a group of atoms which is combined with —C=N— to form a nitrogen-containing, 5- or 6-membered heteroring, and the nitrogen-containing heteroring may be a pyrazole ring, a thiazole ring, an oxazole ring, an imidazole ring, an oxadiazole ring, a thiadiazole ring, a triazole ring, a pyridine ring, a pyridazine ring, a pyrimidine ring, or a pyrazine ring, a benzo-condensed ring or a naphtho-condensed ring thereof, or a composite made from these condensed rings; $R^{44}$ represents a hydrogen atom, an alkyl group having 1 to 20 carbon atoms, an aryl group having 6 to 20 carbon atoms, a heteroaryl group having 4 to 20 carbon atoms, a metal atom, or a substituted boron having at least one substituent selected from a halogen atom, an alkyl group having 1 to 10 carbon atoms, an aryl group having 6 to 20 carbon atoms, and a heteroaryl group having 4 to 20 carbon atoms; $R^{44}$ may be covalently bonded or coordinately bonded to the nitrogen-containing heteroring which $Z^2$ forms; and the above dye may further be substituted.

25. The curable composition according to claim 1, wherein $R^{1a}$ and $R^{1b}$ is 4-(2-ethylhexyloxy)phenyl, 4-(2-methylbutyloxy)phenyl, or 4-(2-octyldodecyloxy)phenyl.

26. The curable composition according to claim 1, wherein when $R^{1a}$ or $R^{1b}$ represents an aryl or heteroaryl group, the near-infrared absorptive dye is selected from the group consisting of

D-1

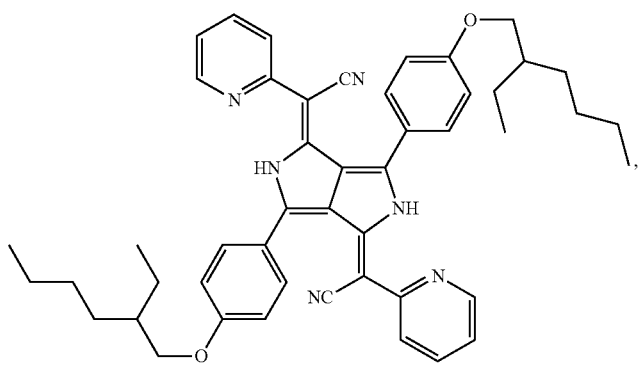

D-10
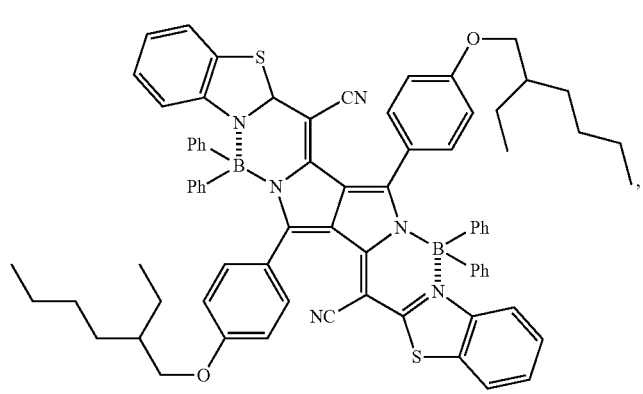
D-15
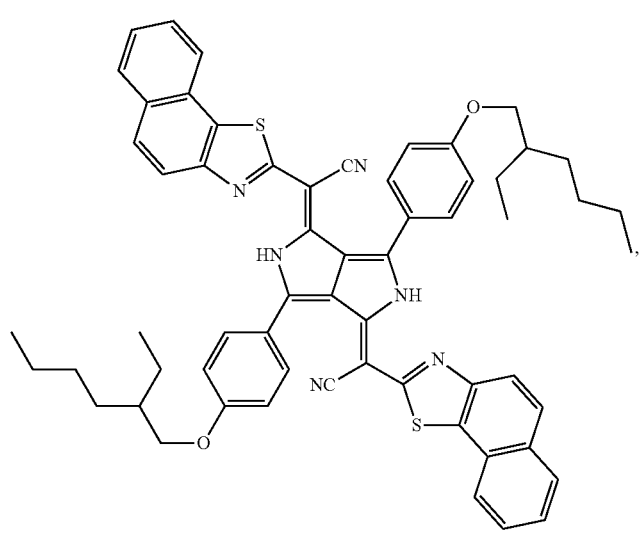
D-17
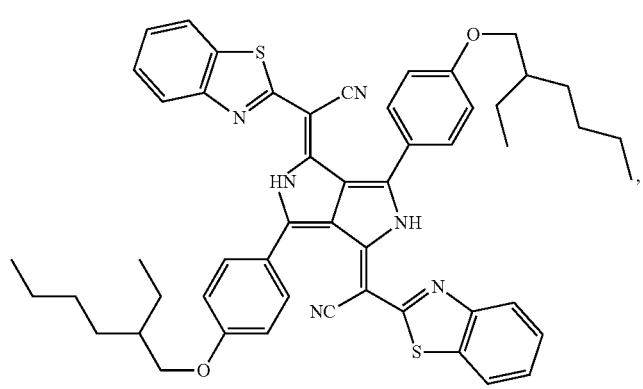

-continued
D-20
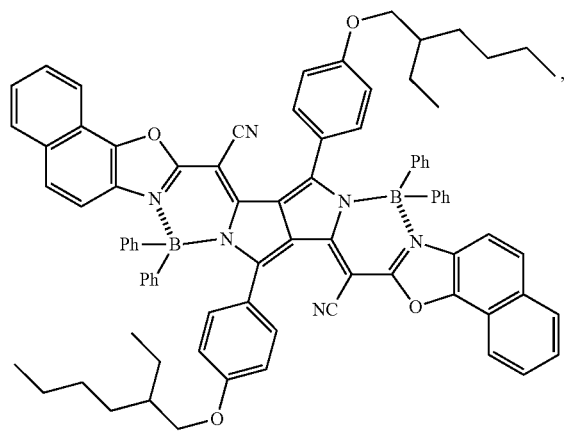
D-21
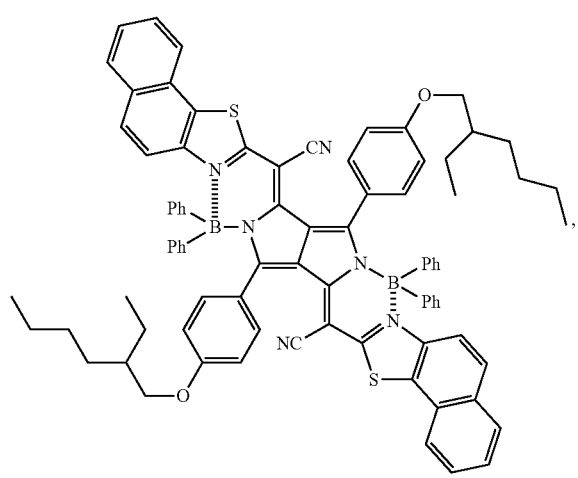
D-25
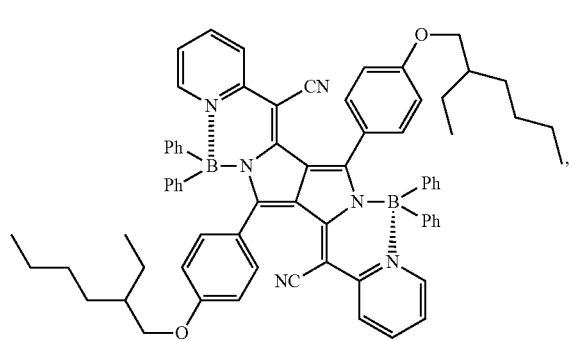
D-30
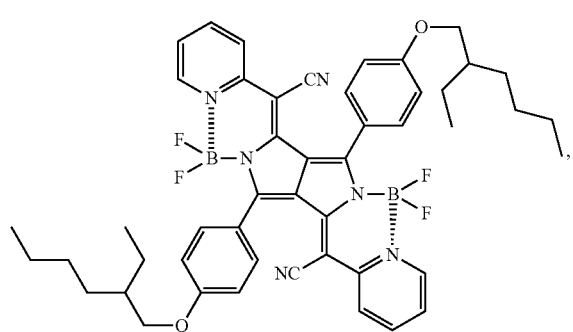

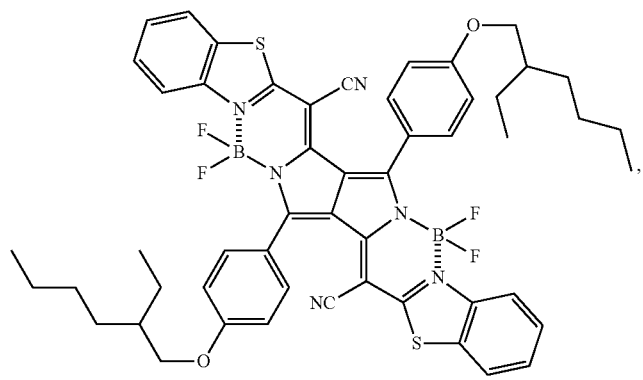
D-33
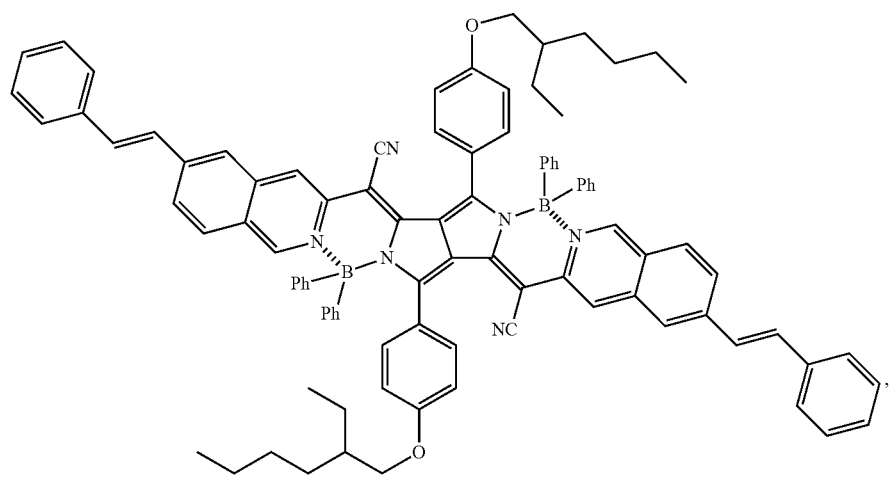
D-43
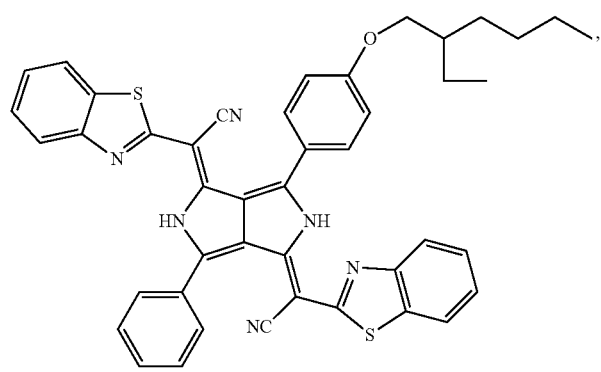
D-101
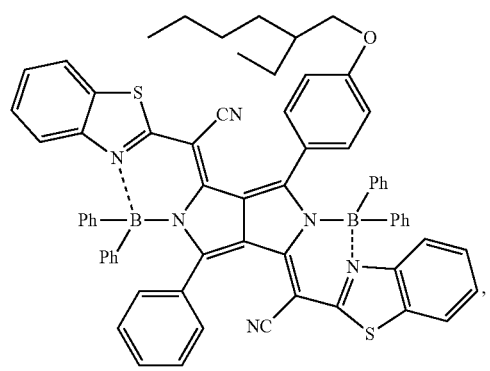
D-102

-continued
D-107
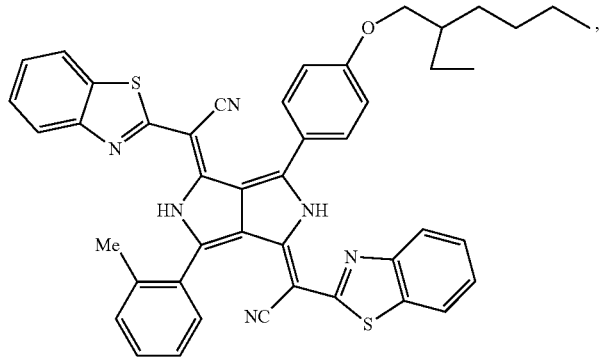
D-108
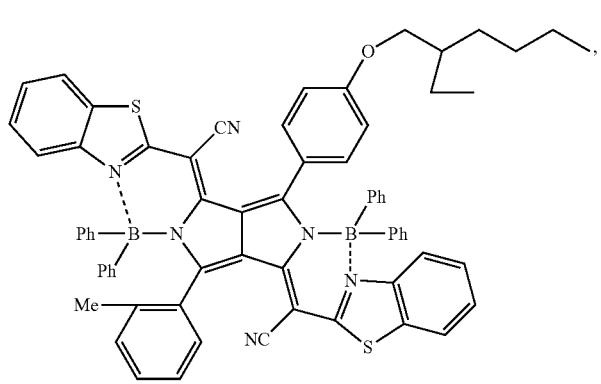
D-111
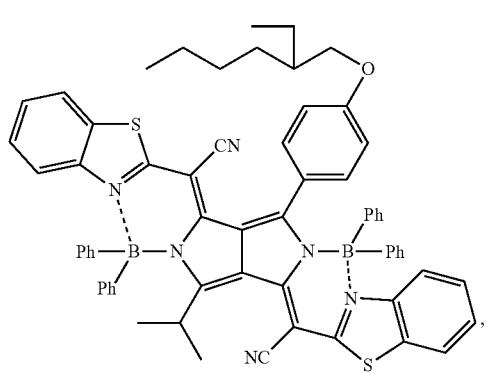
D-112
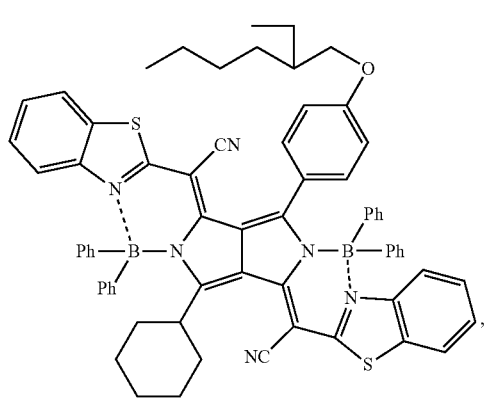

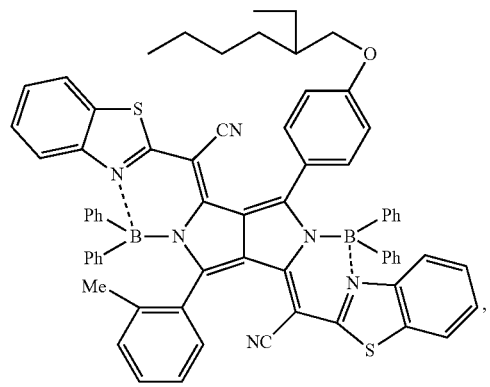
D-113
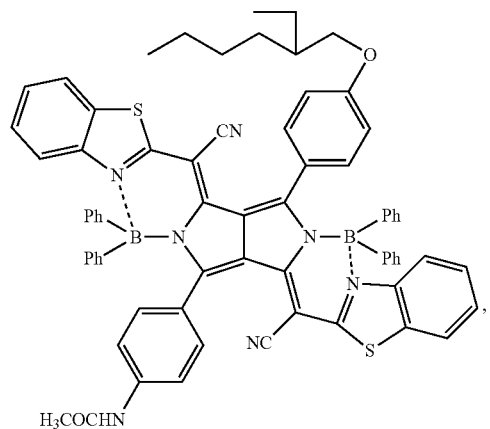
D-114
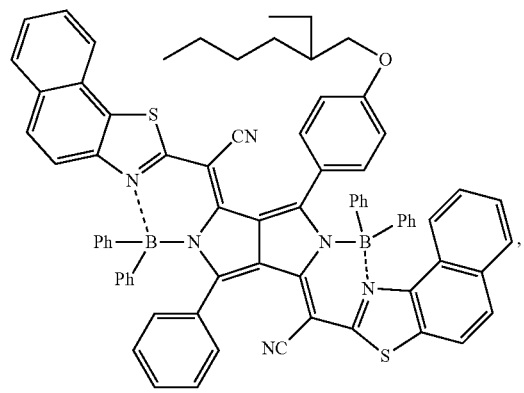
D-121
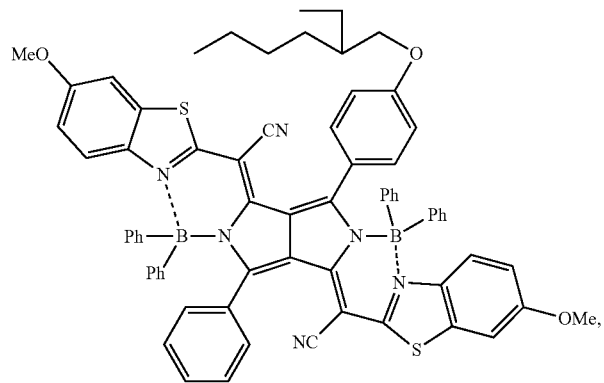
D-122

-continued
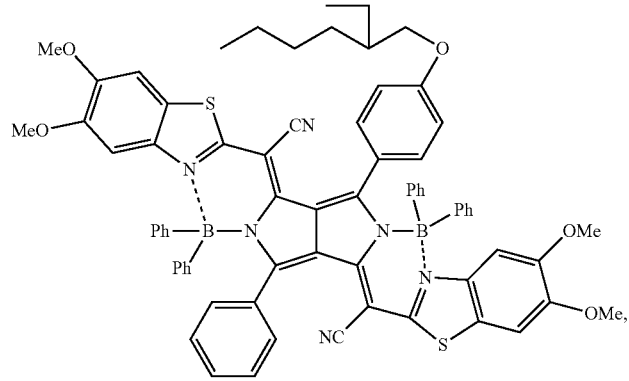
D-123
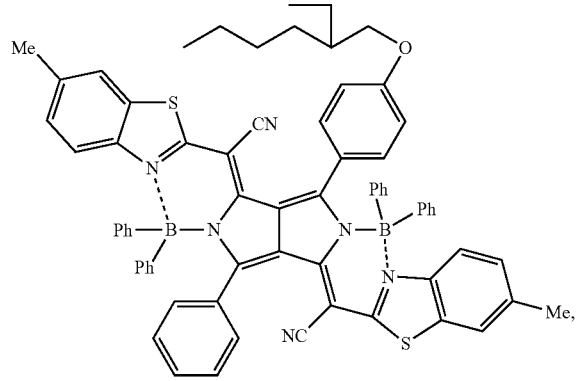
D-124
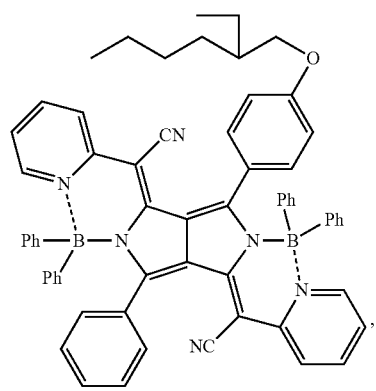
D-125
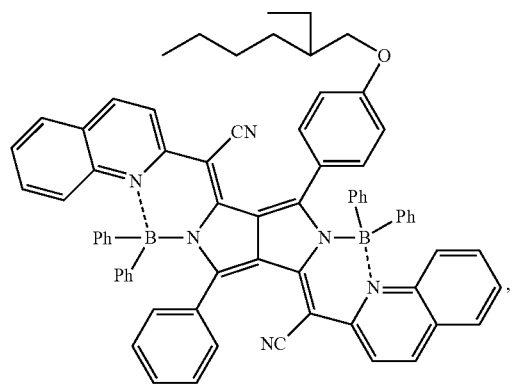
D-126

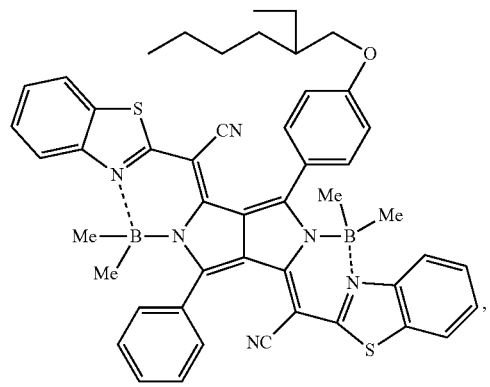
D-127
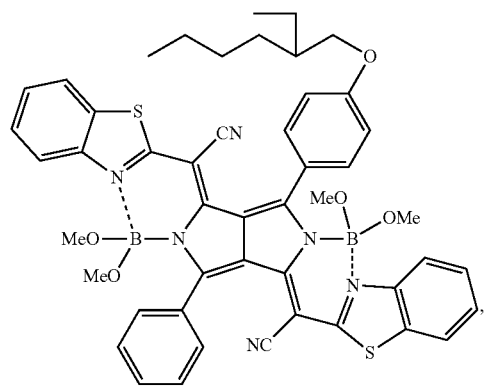
D-128
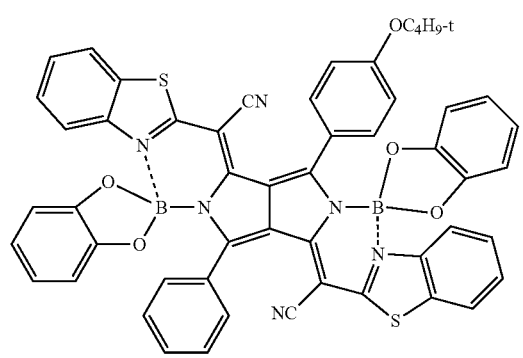
D-129
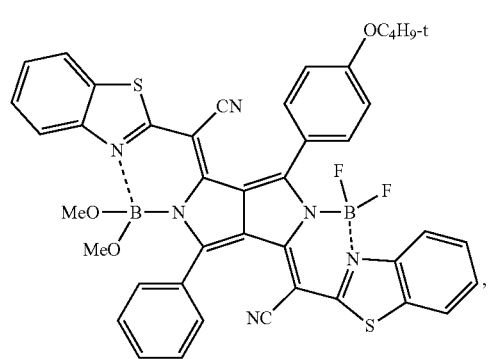
D-130

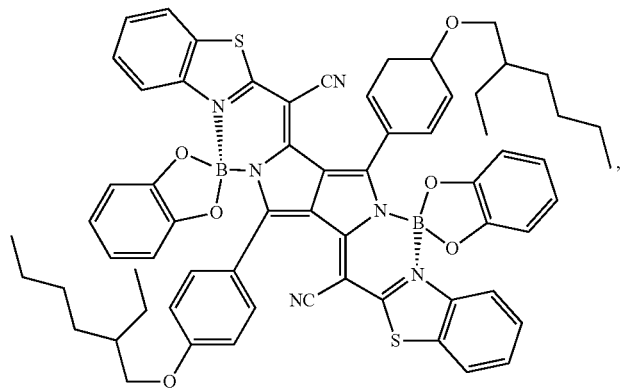
D-131
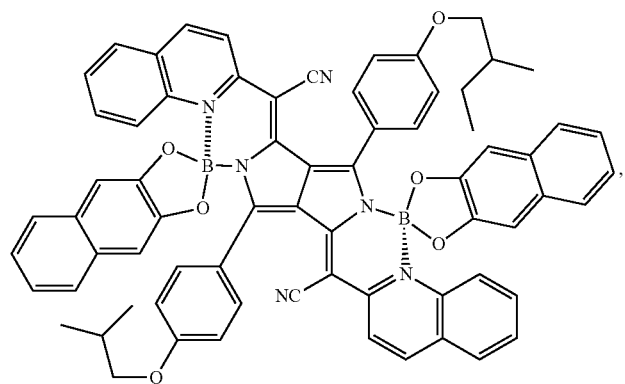
D-132
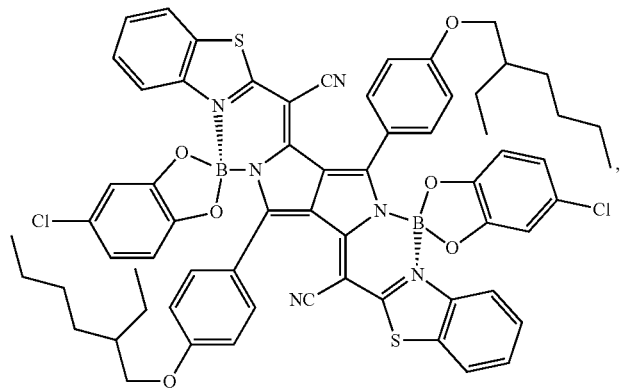
D-134

D-135
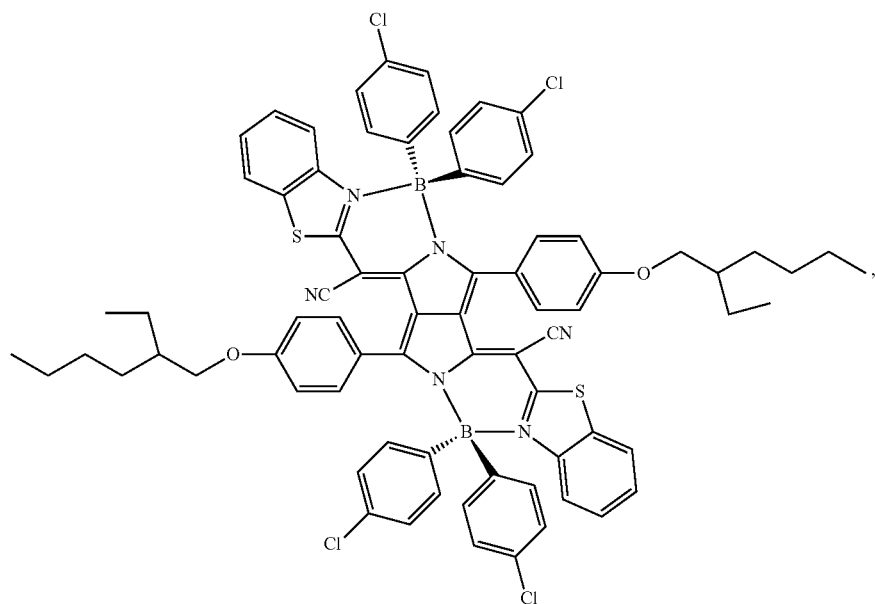
D-136
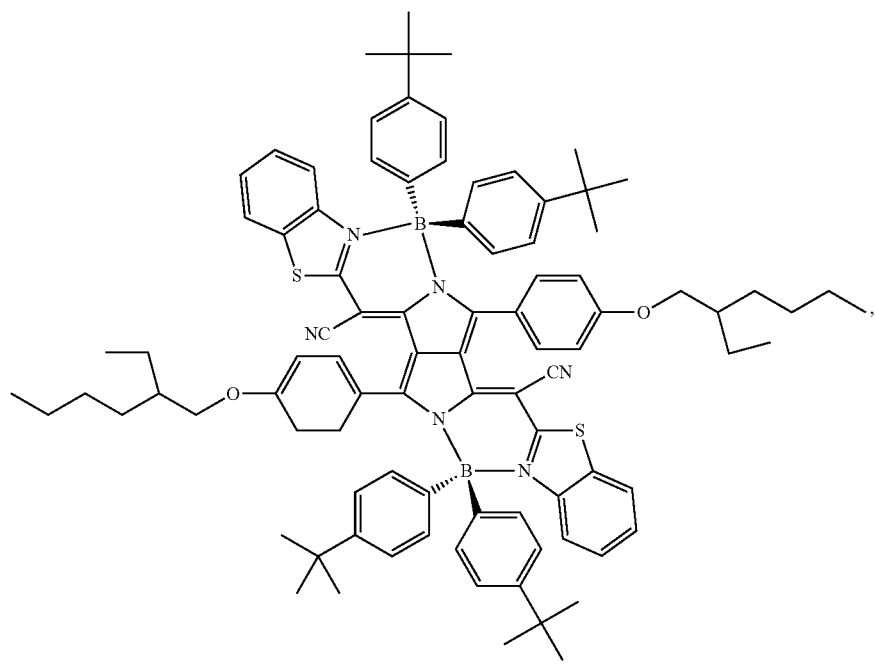

D-137
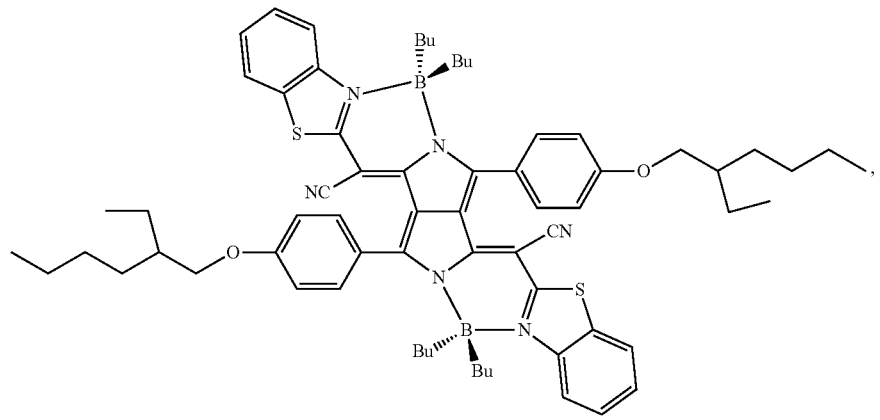
D-138
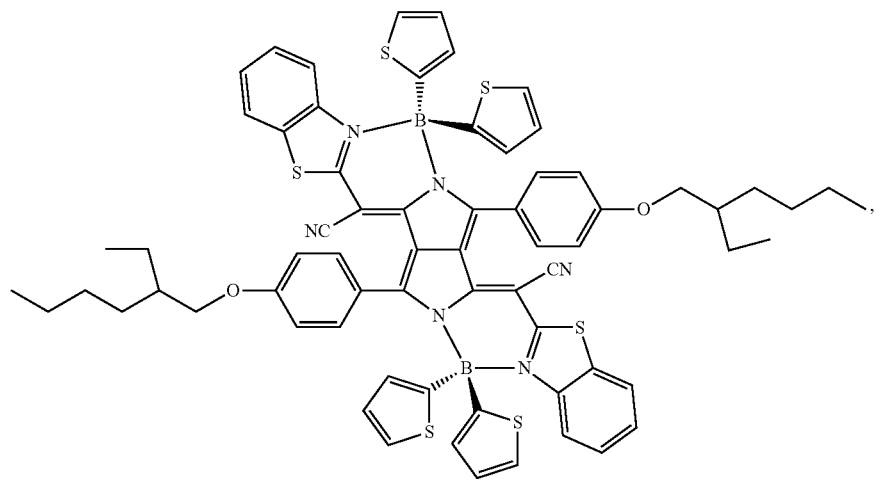
D-139
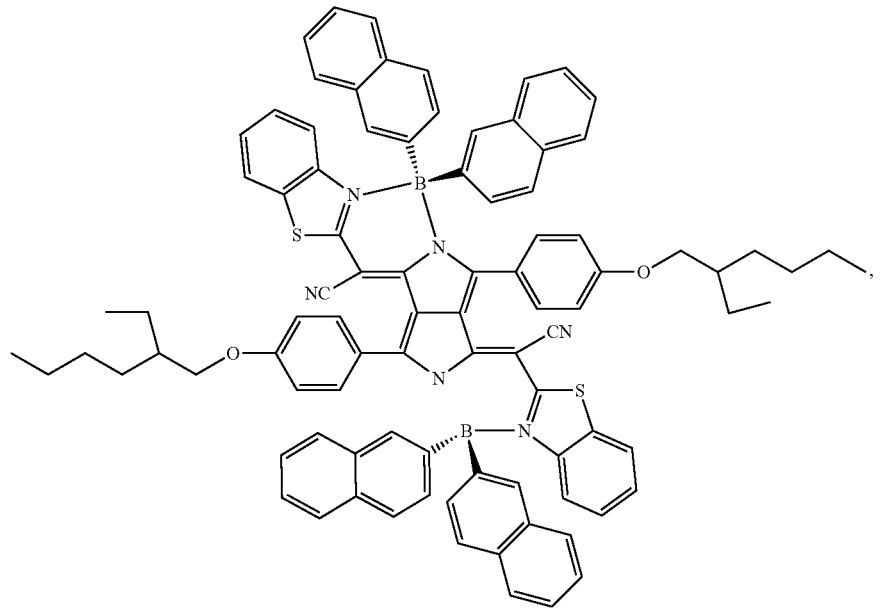

-continued
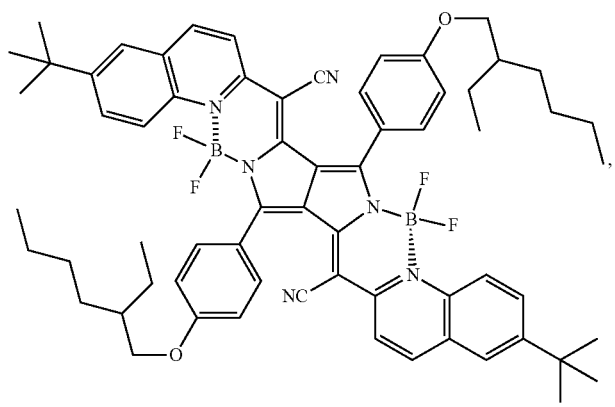
D-140
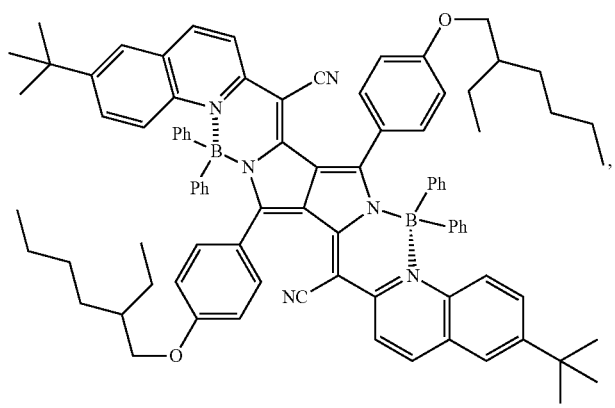
D-141A
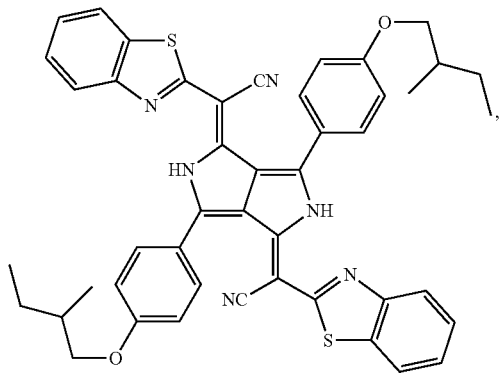
D-141B
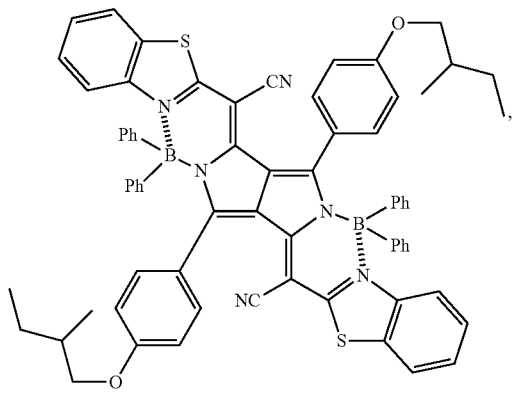
D-142

D-143
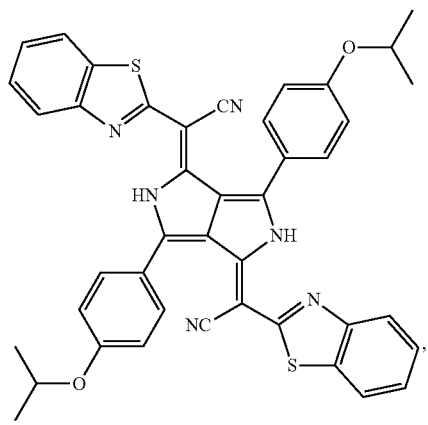
D-145
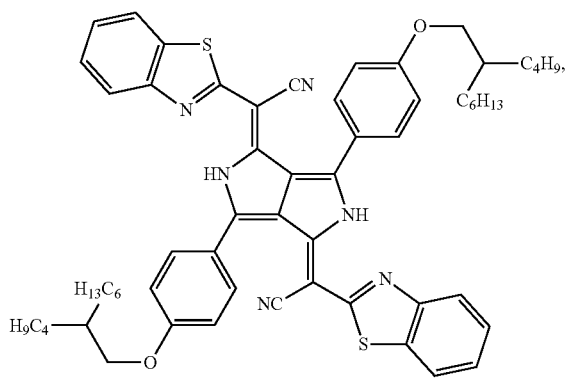
D-146
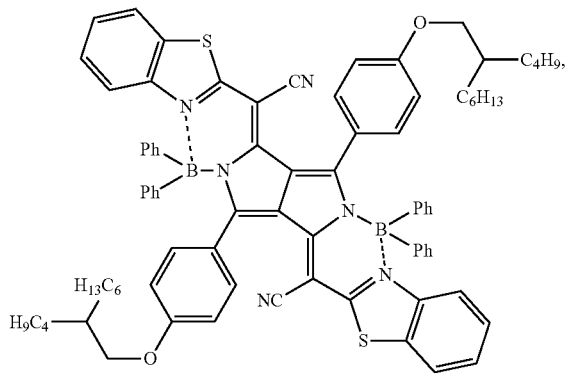
D-147
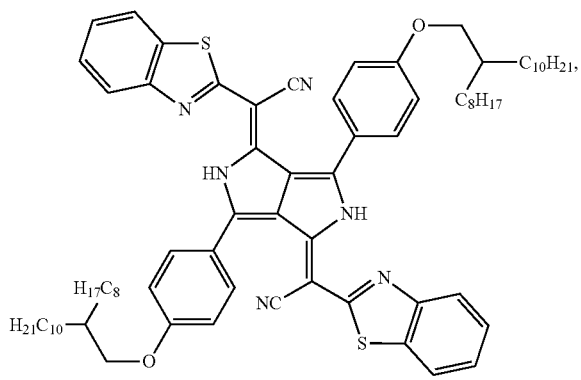

-continued
D-148
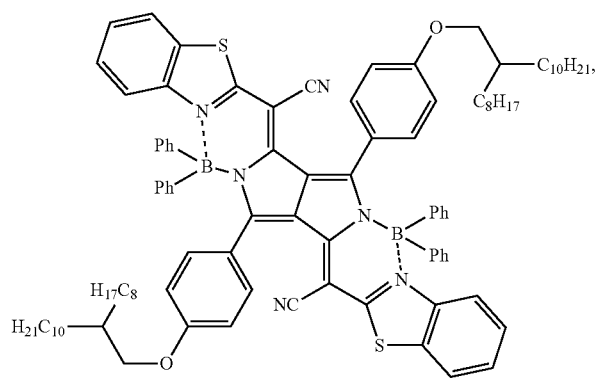
D-149
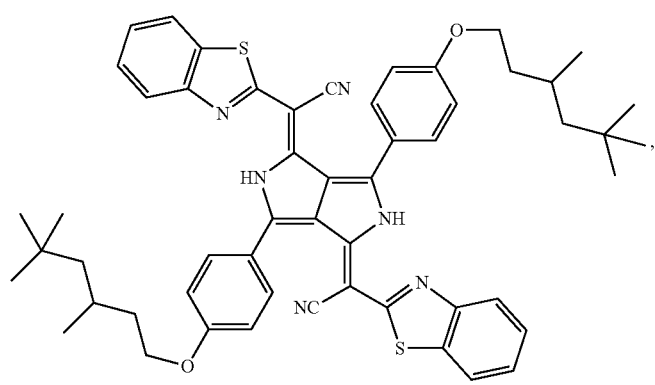
D-150
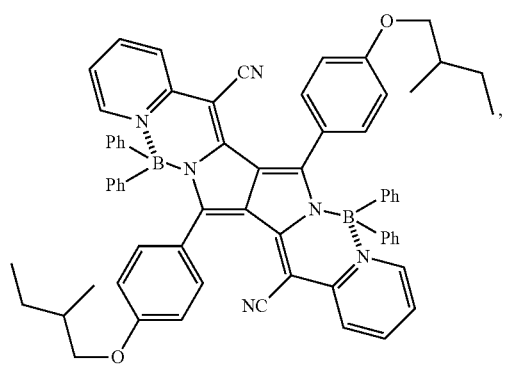
D-151
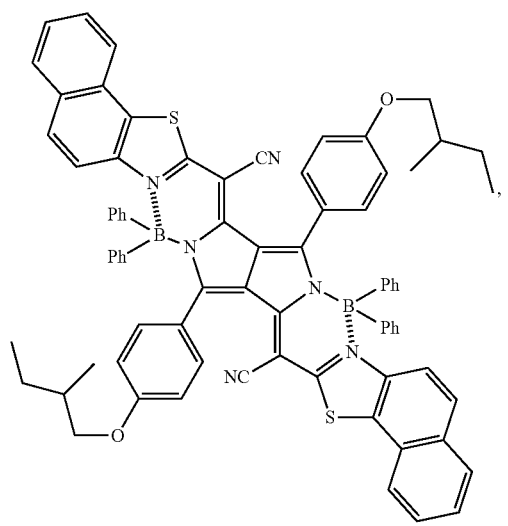

-continued
D-152
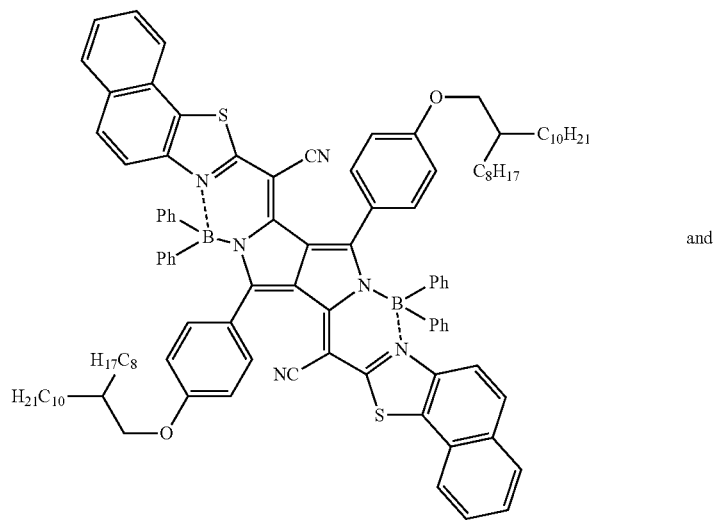
and
D-153
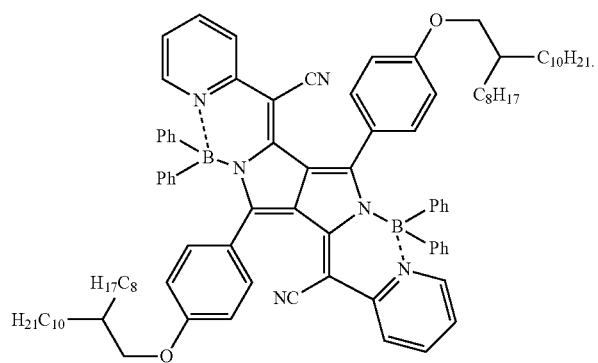
* * * * *